United States Patent
Haraguchi et al.

(10) Patent No.: US 8,050,066 B2
(45) Date of Patent: Nov. 1, 2011

(54) MISFET WITH CAPACITORS

(75) Inventors: Keiichi Haraguchi, Tokyo (JP); Toshikazu Matsui, Tokyo (JP); Satoshi Kamei, Tokyo (JP); Hisanori Ito, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 258 days.

(21) Appl. No.: 12/101,959

(22) Filed: Apr. 11, 2008

(65) Prior Publication Data

US 2008/0283889 A1 Nov. 20, 2008

(30) Foreign Application Priority Data

May 17, 2007 (JP) .................................. 2007-131677

(51) Int. Cl.
*H02M 7/48* (2007.01)
*H01L 27/108* (2006.01)

(52) U.S. Cl. ............ 363/71; 363/73; 363/132; 257/297; 257/298

(58) Field of Classification Search .................... 363/71, 363/73, 132; 257/297, 298, 299
See application file for complete search history.

(56) References Cited

U.S. PATENT DOCUMENTS

| | | | | |
|---|---|---|---|---|
| 6,198,652 B1 * | 3/2001 | Kawakubo et al. | ........... | 365/145 |
| 6,259,616 B1 * | 7/2001 | Ekwall et al. | ................. | 363/132 |
| 6,519,169 B1 * | 2/2003 | Asplund et al. | ............... | 363/132 |
| 7,577,008 B2 * | 8/2009 | Hiller | ............................ | 363/132 |

FOREIGN PATENT DOCUMENTS

JP 8-306870 A 11/1996

\* cited by examiner

*Primary Examiner* — Howard Weiss
*Assistant Examiner* — Steven Rao
(74) *Attorney, Agent, or Firm* — Miles & Stockbridge P.C.

(57) ABSTRACT

The present invention aims to enhance the reliability of a semiconductor device having first through fourth capacitive elements. The first through fourth capacitive elements are disposed over a semiconductor substrate. A series circuit of the first and second capacitive elements and a series circuit of the third and fourth capacitive elements are coupled in parallel between first and second potentials. Lower electrodes of the first and third capacitive elements are respectively formed by a common conductor pattern and coupled to the first potential. Lower electrodes of the second and fourth capacitive elements are respectively formed by a conductor pattern of the same layer as the above conductor pattern and coupled to the second potential. Upper electrodes of the first and second capacitive elements are respectively formed by a common conductor pattern and brought to a floating potential. Upper electrodes of the third and fourth capacitive elements are respectively formed by a conductor pattern of the same layer as the above conductor pattern and brought to a floating potential, but not coupled to the upper electrodes of the first and second capacitive elements by a conductor.

26 Claims, 26 Drawing Sheets

MISFET WITH CAPACITORS

CROSS-REFERENCE TO RELATED APPLICATIONS

The disclosure of Japanese Patent Application No. 2007-131677 filed on May 17, 2007 including the specification, drawings and abstract is incorporated herein by reference in its entirety.

BACKGROUND OF THE INVENTION

The present invention relates to a semiconductor device, and particularly to a technique effective when applied to a semiconductor device having capacitive elements.

Various semiconductor devices have been manufactured by forming MISFETs and capacitors over a semiconductor substrate and coupling between respective elements by wirings.

Japanese Unexamined Patent Publication No. Hei 8 (1996)-306870 (patent document 1) has described a technique wherein capacitances necessary for a step-up circuit are configured by coupling in series one or more MOS capacitive elements or junction capacitance elements using a layer formed upon forming MOS transistors or bipolar elements, and the number of series connections is set to the number at which the voltage applied to each of the MOS capacitance elements and junction capacitance elements is brought to its breakdown voltage or less.

SUMMARY OF THE INVENTION

According to discussions made by the present inventors, the following have been found out.

There has recently been an increasingly demand for the enhancement of reliability required for a semiconductor device. A semiconductor device for in-vehicle use in particular requires high reliability as compared with other uses. When the reliability required for a semiconductor device itself used as a semiconductor chip is high, various elements formed in the chip need higher reliability. Of the elements formed in the chip, capacitive elements large in area and long in effective stress time need high reliability in particular.

As a capacitive element high in reliability, there is known a so-called MOS (Metal Oxide Semiconductor) type capacitive element in which a gate insulating film formed by thermally oxidizing a semiconductor substrate is used for a capacitive insulating film. Since the capacitive insulating film can be formed by thermal oxidation in the MOS type capacitive element, the capacitive insulating film satisfactory in film quality can be formed, and interelectrode insulation leaks and an insulation breakdown are hard to occur, thus making it possible to enhance the reliability of each individual capacitive element.

However, when a weak point exists between opposite electrodes even one spot, each capacitive element causes a leak or short-circuit therefrom, and there is a possibility that the entire circuit using the capacitive elements will not be able to perform a desired operation. Therefore, even when the MOS type capacitive element high in reliability is used, there is a demand for the enhancement of reliability of the entire circuit using the capacitive elements.

Since the exclusively-possessed area of the semiconductor substrate is large and transistors or the like cannot be formed in its area or region, the MOS type capacitive element becomes disadvantageous to the attainment of a reduction in chip area. On the other hand, since a PIP (Polysilicon Insulator Polysilicon) type capacitive element and an MIM (Metal Insulator Metal) type capacitive element can be formed over an interlayer insulating film lying over a semiconductor substrate, other elements such as transistors can also be formed below the capacitive element. This becomes advantageous to a reduction in chip area. Since, however, an interelectrode capacitive insulating film is formed by a CVD method or the like without being formed by a thermal oxide film, the PIP type capacitive element and the MIM type capacitive element is liable to be lower in reliability that the MOS type capacitive element. Therefore, even when the PIP type capacitive element and the MIM type capacitive element are used, there is a demand for the enhancement of reliability of the entire circuit using capacitive elements.

It is also desirable to suppress an increase in the manufacturing cost of a semiconductor device upon enhancing the reliability of the entire circuit using the capacitive elements.

An object of the present invention is to provide a technique capable of enhancing the reliability of a semiconductor device having a circuit using capacitive elements.

Another object of the present invention is to provide a technique capable of making compatible between an improvement in the reliability of a semiconductor device having a circuit using capacitive elements and a reduction in its manufacturing cost.

The above and other objects and novel features of the present invention will become apparent from the description of the present specification and the accompanying drawings.

Summaries of representative ones of the inventions disclosed in the present application will be explained in brief as follows:

The present invention provides a semiconductor device having first, second, third and fourth capacitive elements disposed over a semiconductor substrate. One electrodes of the first, second, third and fourth capacitive elements are respectively formed by a conductor layer of the same layer, and the other electrodes thereof are respectively formed by a conductor layer of the same layer. The one electrodes of the first and third capacitive elements are electrically coupled to each other through a conductor and coupled to a first potential. The one electrodes of the second and fourth capacitive elements are electrically coupled to each other through a conductor and coupled to a second potential different from the first potential. Further, the other electrodes of the first and second capacitive elements are electrically coupled to each other through a conductor and brought to a floating potential. The other electrodes of the third and fourth capacitive elements are electrically coupled to each other through a conductor and brought to a floating potential, and are not coupled to the other electrodes of the first and second capacitive elements by a conductor.

The present invention provides a semiconductor device comprising a circuit formed over a semiconductor substrate, in which series circuits each comprising a pair of first and second capacitive elements are coupled in parallel in plural form between a first potential and a second potential different from the first potential. One electrodes of the first and second capacitive elements of the series circuits are respectively formed by a conductor layer of the same layer, and the other electrodes thereof are respectively formed by a conductor layer of other same layer. The one electrodes of the first capacitive elements of the series circuits are respectively electrically coupled to one another through conductors and coupled to the first potential. The one electrodes of the second capacitive elements of the series circuits are respectively electrically coupled to one another through conductors and coupled to the second potential. Further, the other electrodes of the first capacitive elements and the other electrodes of the second capacitive elements in the respective series circuits are electrically coupled to one another through conductors and brought to a floating potential, respectively, but not coupled to the other electrodes of the first and second capacitive elements of other series circuits by conductors.

Advantageous effects obtained by a representative one of the inventions disclosed in the present application will be described in brief as follows:

The reliability of a semiconductor device can be enhanced.

The manufacturing cost of the semiconductor device can be reduced.

DETAILED DESCRIPTION OF THE PREFERRED EMBODIMENTS

Figure 1:
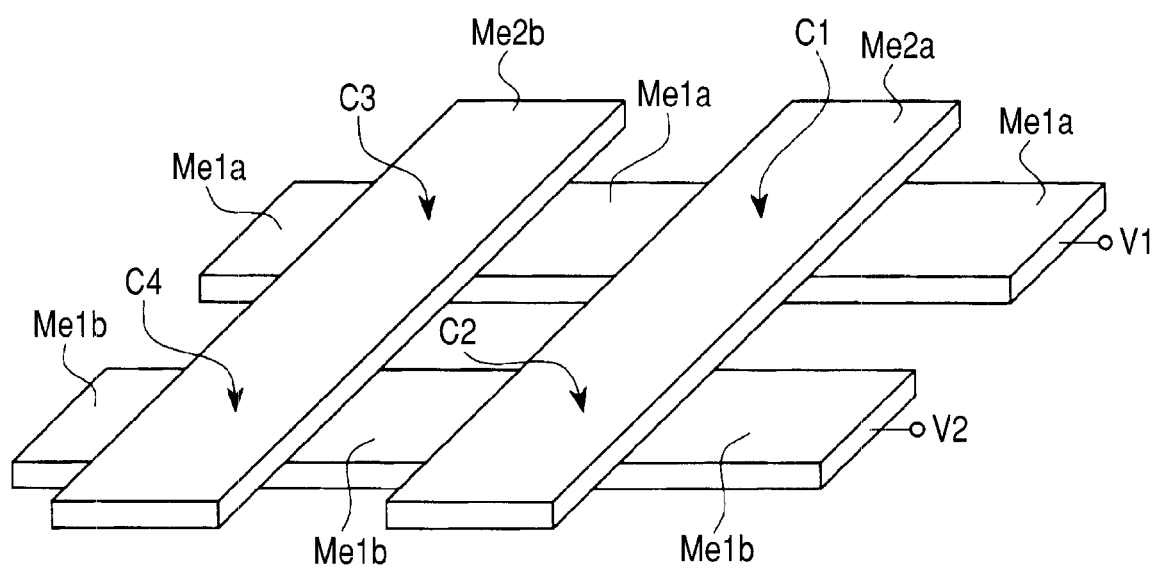
FIG. 1 is a fragmentary perspective view showing a conceptual structure of a semiconductor device according to a first embodiment of the present invention.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is also needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Preferred embodiments of the present invention will hereinafter be described in detail based on the accompanying drawings. Constituent elements or members each having the same function in all the drawings for describing the embodiments are respectively given the same reference numerals, and their repetitive explanations are omitted. The description of the same or similar parts will not be repeated in principle except when necessary in particular.

In the drawings used in the embodiments, some hatching might be omitted to make it easy to view the drawings even in the case of sectional views. Even in the case of plan views, some hatching might be provided to make it easy to view the drawings.

First Preferred Embodiment

A semiconductor device according to the present embodiment will be described with reference to the accompanying drawings. The semiconductor device of the present embodiment is of a semiconductor device having a capacitive element.

Figure 2:
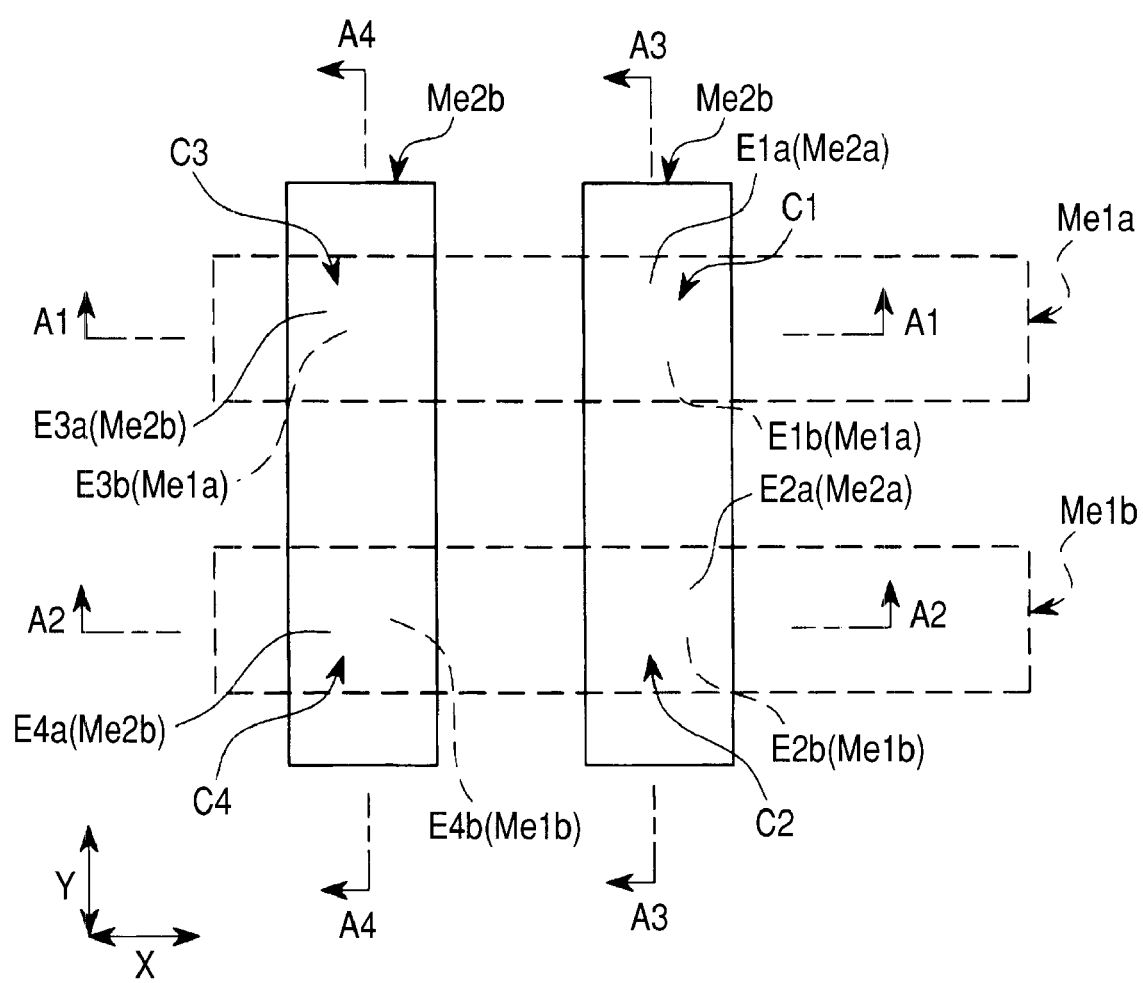
FIG. 2 is a fragmentary plan view of the semiconductor device according to the first embodiment of the present invention.
Figure 3:
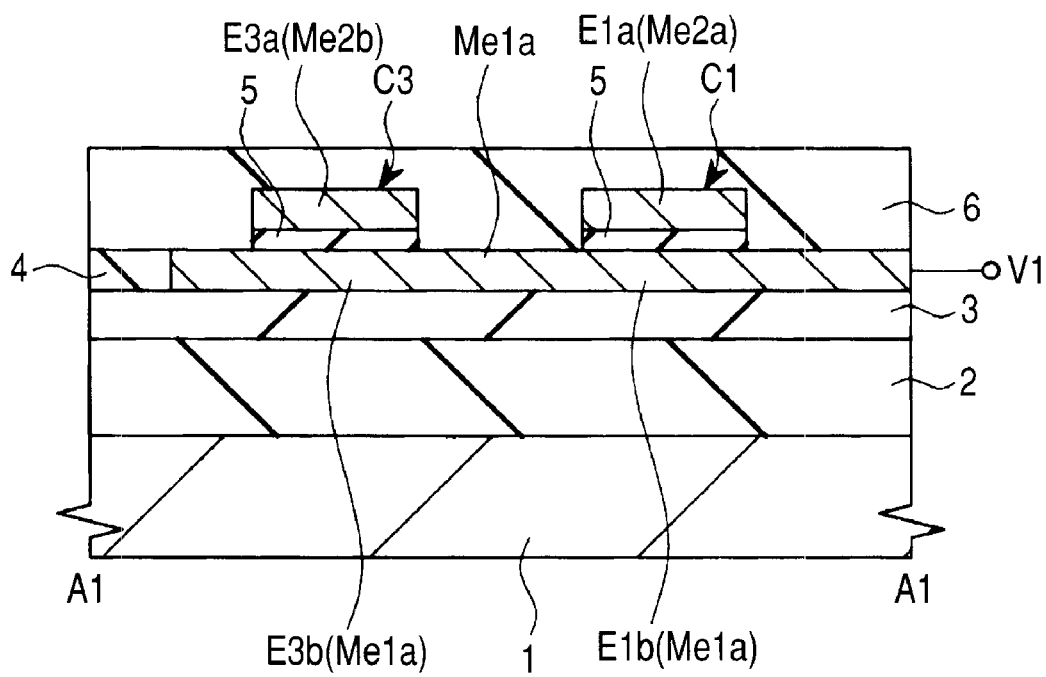
FIG. 3 is a fragmentary sectional view of the semiconductor device according to the first embodiment of the present invention.
Figure 4:
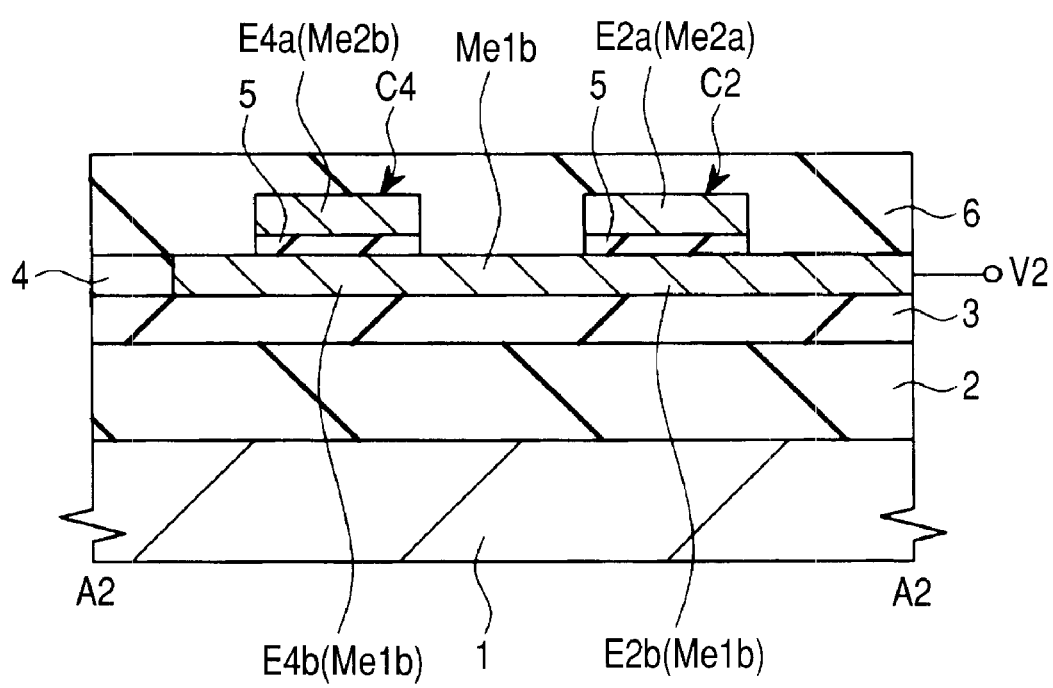
FIG. 4 is a fragmentary sectional view of the semiconductor device according to the first embodiment of the present invention.
Figure 5:
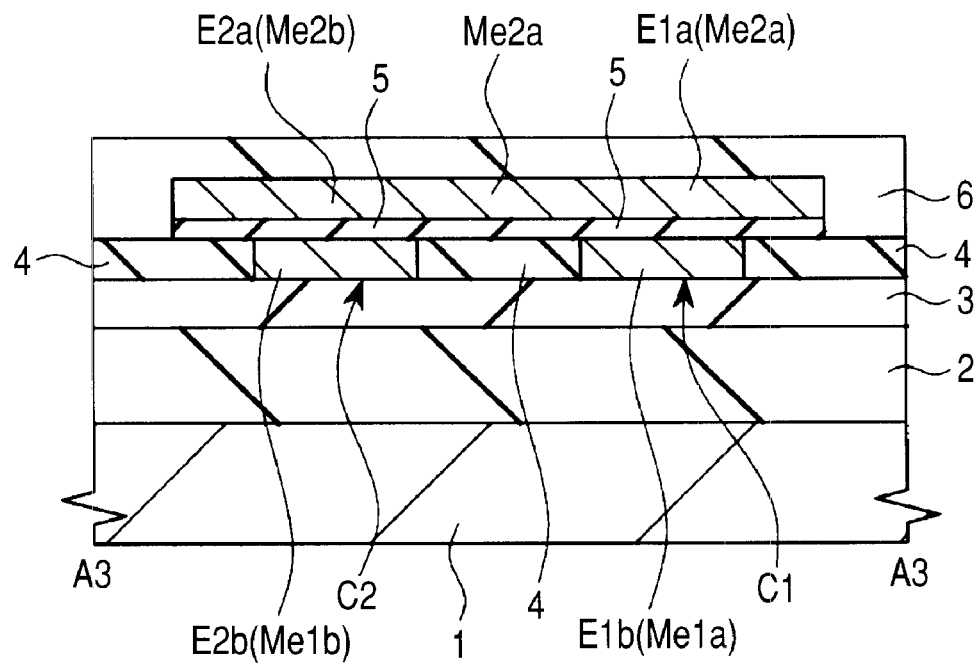
FIG. 5 is a fragmentary sectional view of the semiconductor device according to the first embodiment of the present invention.
Figure 6:
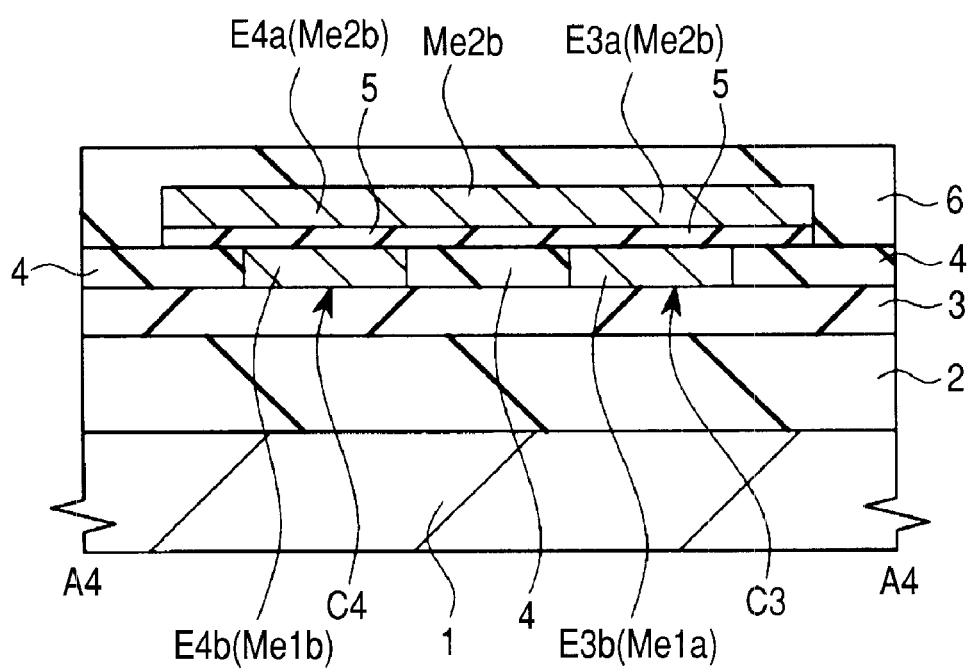
FIG. 6 is a fragmentary sectional view of the semiconductor device according to the first embodiment of the present invention.
Figure 7:
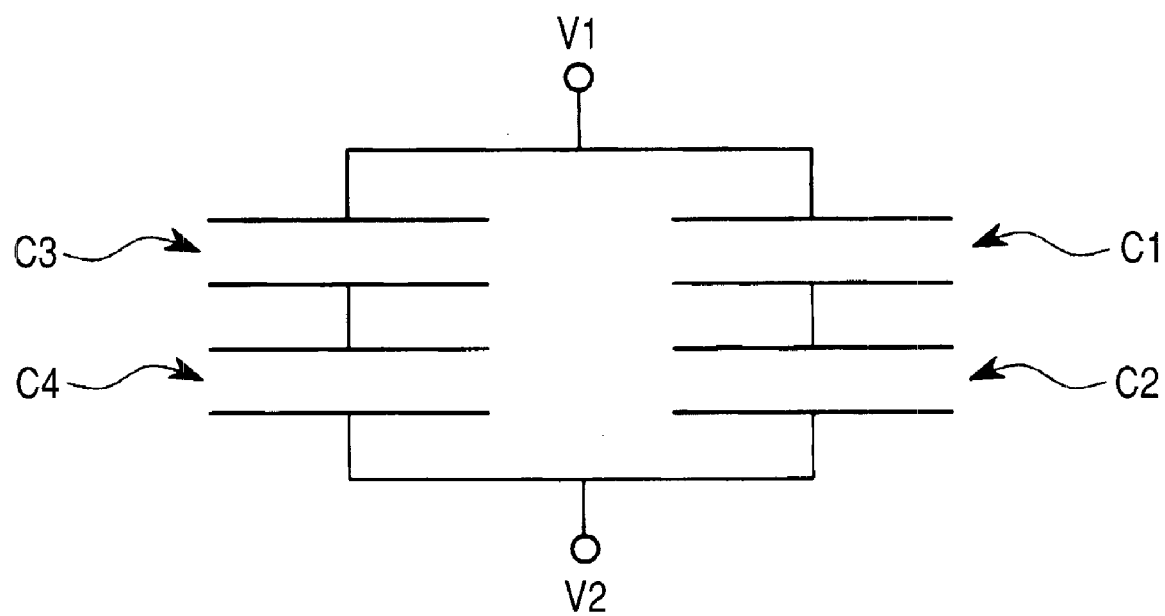
FIG. 7 is a fragmentary circuit diagram of the semiconductor device according to the first embodiment of the present invention.

FIG. 1 is a fragmentary perspective view showing a conceptual structure of the semiconductor device according to the present embodiment, FIG. 2 is a fragmentary plan view of the semiconductor device according to the present embodiment, FIGS. 3 through 6 are respectively fragmentary sectional views thereof, and FIG. 7 is a fragmentary circuit diagram thereof. A sectional view taken along line A1-A1 of FIG. 2 corresponds to FIG. 3, a second view taken along line A2-A2 of FIG. 2 corresponds to FIG. 4, a sectional view taken along line A3-A3 of FIG. 2 corresponds to FIG. 5, and a sectional view taken along line A4-A4 of FIG. 2 corresponds to FIG. 6. A circuit formed by capacitive elements C1 through C4 shown in FIGS. 1 through 6 corresponds to FIG. 7. Incidentally, only conductor patterns Me1a, Me1b, Me2a and Me2b are shown in FIGS. 1 and 2, and configurations other than the above are not illustrated. In FIG. 2, the plane layouts of the conductor patterns Me2a and Me2b are respectively indicated by solid lines, and the plane layouts of the conductor patterns Me1a and Me1b are respectively indicated by dotted lines.

Various elements are formed over a principal or main surface of a semiconductor substrate 1 that forms the semiconductor device according to the present embodiment shown in FIGS. 1 through 6. An interlayer insulating film and a wiring layer are formed thereon. In FIGS. 3 through 6, areas in which the elements, interlayer insulating film and wiring layer or the like are formed, are collectively shown as a device or element area 2. An insulating film 3 is formed over its corresponding device area 2 as the interlayer insulating film.

The conductor patterns (conductor layer patterns) Me1a and Me1b are formed over the insulating film 3. In the present embodiment, the conductor patterns Me1a and Me1b comprise metal patterns (metal layer patterns) respectively. The conductor pattern (first conductor pattern) Me1a and the conductor pattern (second conductor pattern) Me1b respectively comprise a conductor layer of the same layer (first conductor layer: metal layer in the present embodiment) and are formed in the same process step. The conductor pattern Me1a and the conductor pattern Me1b are not coupled to each other by a conductor (i.e., no dc current flows).

In FIGS. 3 through 6, an insulating film (interlayer insulating film) 4 is formed over the insulating film 3, and the conductor patterns Me1a and Me1b are embedded into their corresponding trenches (openings) provided in the insulating film 4. In this case, the conductor patterns Me1a and Me1b can be formed by, for example, a Damascene method. As another embodiment or form, the conductor patterns Me1a and Me1b can also be formed by omitting the formation of the insulating film 4 and patterning the conductor layer (metal layer in the present embodiment) formed over the insulating film 3. In this case, the conductor patters Me1a and Me1b comprise the patterned conductor layers (metal layers in the present embodiment) respectively.

Conductor patterns Me2a and Me2b are respectively formed in a layer located above the conductor patterns Me1a and Me1b. In the present embodiment, the conductor patterns Me2a and Me2b also comprise metal patterns (metal layer patterns) respectively. The conductor pattern (second conductor pattern) Me2a and the conductor pattern (fourth conductor pattern) Me2b respectively comprise a conductor layer (second conductor layer: metal layer in the present embodiment) of the same layer and are formed in the same process step. The conductor pattern Me2a and the conductor pattern Me2b are not coupled to each other by a conductor (i.e., no dc current flows).

Incidentally, when a relationship of connections between a plurality of members (corresponding to electrodes, conductor patterns or semiconductor regions or the like) comprising conductors is described in the present application, the representation of "not coupled by conductors" means that conductive paths coupled to one another by conductors are not formed between the members. Therefore, when the conductive paths coupled to one another by the conductors are not formed between the members, the members can be represented as being "not coupled to one another by the conductors" even though the members are coupled to one another via capacitive elements. Since such a conductive path that the conductor pattern Me2a and the conductor pattern Me2b are coupled by only the conductor is not formed, although the conductor pattern Me2a and the conductor pattern Me2b are coupled (capacitively coupled to each other) to each other via a series circuit of the capacitive elements C1 and C3 and a series circuit of the capacitive elements C2 and C4 as is apparent even from the circuit diagram of FIG. 7 by way of example, the conductor pattern Me2a and the conductor pattern Me2b can be represented as being "not coupled to each other by the conductor". On the other hand, when a relationship of connections between a plurality of members (corresponding to electrodes, conductor patterns or semiconductor regions or the like) comprising conductors is described in the present application, the representation of "electrically coupled to one another through conductors" means that conductive paths coupled to one another by conductors are formed between the members. The conductive paths coupled by the conductors can be formed by utilizing conductor patterns lying in the same layer as the members, conductor patterns lying in different layers, interlayer connecting plugs, etc. singly or in combination, for example.

As shown in FIGS. 1 and 2, the conductor pattern Me2a extends so as to intersect with both of the conductor pattern Me1a and the conductor pattern Me1b. The conductor pattern Me2b also extends so as to intersect with both of the conductor pattern Me1a and the conductor pattern Me1b. For example, the conductor patterns Me1a and Me1b extend in an X direction of FIG. 2, whereas the conductor patterns Me2a and Me2b extend in a Y direction of FIG. 2. Here, the X and Y directions respectively indicate the directions intersecting with each other (more preferably orthogonal to each other).

An insulating film 5 used as a capacitive insulating film is interposed between the conductor patterns Me2a and Me2b and the conductor patterns Me1a and Me1b in areas where the conductor patterns Me2a and Me2b and the conductor patterns Me1a and Me1b intersect with one another respectively. The capacitive elements C1, C2, C3 and C4 are respectively formed in the areas where the conductor patterns Me2a and Me2b and the conductor patterns Me1a and Me1b intersect. Thus, the semiconductor device according to the present embodiment is of a semiconductor device having the capacitive element C1 (first capacitive element), the capacitive element C2 (second capacitive element), the capacitive element C3 (third capacitive element) and the capacitive element C4 (fourth capacitive element) disposed over the semiconductor substrate 1. Each of the capacitive elements C1, C2, C3 and C4 is formed by a lower electrode (first electrode, one electrode: any of lower electrodes E1b, E2b, E3b and E4b in the present embodiment) and an upper electrode (second electrode, the other electrode: any of upper electrodes E1a, E2a, E3a and E4a in the present embodiment) opposite to each other via an insulating film (insulating film 5 in the present embodiment).

Namely, in the area where the conductor pattern Me2a and the conductor pattern Me1a intersect each other, the conductor pattern Me1a lying in the area assumes the lower electrode (first electrode, one electrode) E1b of the capacitive element C1, the conductor pattern Me2a lying in the area assumes the upper electrode (second electrode, the other electrode) E1a of the capacitive element C1, and the insulating film 5 provided between the upper electrode E1a and the lower electrode E1b assumes the capacitive insulating film of the capacitive element C1, whereby the capacitive element C1 is formed. In the area where the conductor pattern Me2a and the conductor pattern Me1b intersect, the conductor pattern Me1b lying in the area assumes the lower electrode (first electrode, one electrode) E2b of the capacitive element C2, the conductor pattern Me2a lying in the area assumes the upper electrode (second electrode, the other electrode) E2a of the capacitive element C2, and the insulating film 5 provided between the upper electrode E2a and the lower electrode E2b assumes the capacitive insulating film of the capacitive element C2, whereby the capacitive element C2 is formed. In the area where the conductor pattern Me2b and the conductor pattern Me1a intersect, the conductor pattern Me1a lying in the area assumes the lower electrode (first electrode, one electrode) E3b of the capacitive element C3, the conductor pattern Me2b lying in the area assumes the upper electrode (second electrode, the other electrode) E3a of the capacitive element C3, and the insulating film 5 provided between the upper electrode E3a and the lower electrode E3b assumes the capacitive insulating film of the capacitive element C3, whereby the capacitive element C3 is formed. In the area where the conductor pattern Me2b and the conductor pattern Me1b intersect, the conductor pattern Me1b lying in the area assumes the lower electrode (first electrode, one electrode) E4b of the capacitive element C4, the conductor pattern Me2b lying in the area assumes the upper electrode (second electrode, the other electrode) E4a of the capacitive element C4, and the insulating film 5 provided between the upper electrode E4a and the lower electrode E4b assumes the capacitive insulating film of the capacitive element C4, whereby the capacitive element C4 is formed. Since the conductor patterns Me1a, Me1b, Me2a and Me2b comprise the metal patterns respectively as described above, the capacitive elements C1 through C4 are of MIM (Metal Insulator Metal) type capacitive elements in the present embodiment.

The peripheries of the conductor patterns Me2a and Me2b are covered with an insulating film (interlayer insulating film) 6. In FIGS. 3 through 6, the insulating film 6 is formed over the insulating film 3 on which the conductor patterns Me1a and Me1b are embedded, so as to cover a laminated pattern of insulating film 5 and conductor pattern Me2a and a laminated pattern of insulating film 5 and conductor pattern Me2b.

It is necessary to provide the insulating film 5 at least between the conductor patterns Me2a and Me2b and the conductor patterns Me1a and Me1b in the areas where the conductor patterns Me1a and Me1b and the conductor patterns Me2a and Me2b intersect, respectively. In FIGS. 3 through 6, the tops of the insulating films 5 related to the same patterns as the conductor patterns Me2a and Me2b are disposed below the conductor patterns Me2a and Me2b. The laminated pattern of insulating film 5 and conductor pattern Me2a and the laminated pattern of insulating film 5 and conductor pattern Me2b respectively extend over the insulating film 3 with the conductor patterns Me1a and Me1b embedded thereon, so as to intersect with both the conductor pattern Me1a and the conductor pattern Me1b. As other forms, the insulating film 5 can also be formed in a pattern broader than each of the conductor patterns Me2a and Me2b. Further, the insulating film 5 can also be formed over the insulating film 3 with the conductor patterns Me1a and Me1b embedded thereon over its entirety.

The conductor pattern Me1a is coupled to a potential (first potential) V1, the conductor pattern Me1b is coupled to a potential (second potential) V2, and the conductor patterns Me2a and Me2b are respectively set to a floating potential. The potentials V1 and V2 are of potentials different from each other. For instance, one of the potentials V1 and V2 assumes a source potential (fixed potential, reference potential) and the other thereof assumes an earth potential (ground potential). The conductor pattern Me1a can be coupled to the potential V1 by coupling the conductor pattern Me1a to a wiring or boding pad or the like supplied with the first potential V1 via an unillustrated wiring or plug or the like. Similarly, the conductor pattern Me1b can be coupled to the potential V2 by coupling the conductor pattern Me1b to a wiring or boding pad or the like supplied with the potential V2 via an unillustrated wiring or plug.

Such a circuit as shown in FIG. 7 is formed by these capacitive elements C1 through C4.

While the lower electrode E1b and E2b of the capacitive elements C1 and C2 are respectively formed by the conductor patterns Me1a and Me1b, the upper electrodes E1a and E2a of the capacitive elements C1 and C2 are both formed by the conductor pattern Me2a and electrically coupled to each other through the conductor (conductor pattern Me2a in the present embodiment). This conductor pattern Me2a is brought to the floating potential. Therefore, the capacitive elements C1 and C2 are coupled in series. While the lower electrode E3b and E4b of the capacitive elements C3 and C4 are respectively formed by the conductor patterns Me1a and Me1b, the upper electrodes E3a and E4a of the capacitive elements C3 and C4 are both formed by the conductor pattern Me2b and electrically coupled to each other through the conductor (conductor pattern Me2b in the present embodiment). This conductor pattern Me2b is brought to the floating potential. Therefore, the capacitive elements C3 and C4 are coupled in series. While the lower electrode E1b and E3b of the capacitive elements C1 and C3 are both formed by the conductor patterns Me1a and electrically coupled to each other through the conductor (conductor pattern Me1a in the present embodiment). The lower electrodes E2b and E4b of the capacitive elements C2 and C4 are both formed by the conductor pattern Me1b and electrically coupled to each other through the conductor (conductor pattern Me1b in the present embodiment). The conductor pattern Me1a that makes or forms the lower electrodes E1b and E3b of the capacitive elements C1 and C3 is coupled to the potential V1. The conductor pattern Me1b that forms the lower electrodes E2b and E4b of the capacitive elements C2 and C4 is coupled to the potential V2. The upper electrodes E1a and E2a of the capacitive elements C1 and C2 are not coupled to the upper electrodes E3a and E4a of the capacitive elements C3 and C4 by the conductor (no dc current flows). The lower electrodes E1b and E3b of the capacitive elements C1 and C3 are not coupled to the lower electrodes E2b and E4b of the capacitive elements C2 and C4 by the conductors (no dc current flows). Therefore, the capacitive elements C1 and C2 are coupled in series between the potential V1 and the potential V2. The capacitive elements C3 and C4 are coupled in series between the potential V1 and the potential V2. Further, a series circuit of the capacitive elements C1 and C2 and a series circuit of the capacitive elements C3 and C4 are respectively brought to a state of being coupled in parallel between the potential V1 and the potential V2.

If the capacitance values of the capacitive elements C1 through C4 are respectively the same value (which is defined as a capacitance value $C_0$ in the present embodiment), then the total capacitance value of the circuit formed by the four capacitive elements C1 through C4 such as shown in FIG. 7 becomes the capacitance value $C_0$. This is because if the capacitance values of the capacitive elements C1 through C4 are $C_0$, then the capacitance value of the series circuit of the capacitive elements C1 and C2 assumes $C_0/2$, the capacitance value of the series circuit of the capacitive elements C3 and C4 assumes $C_0/2$, and the capacitance value of the circuit of FIG. 7 in which the two series circuits are coupled in parallel reaches the sum of the capacitance values $C_0/2$ of the series-circuits, thus resulting in $C_0$.

Figure 8:
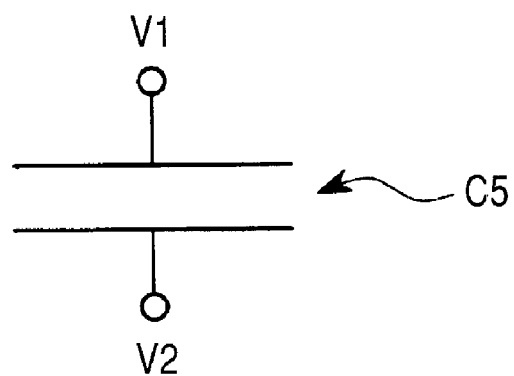
FIG. 8 is a circuit diagram showing a circuit formed by providing a capacitive element between potentials V1 and V2.

Therefore, the total capacitance value of the circuit shown in FIG. 7 becomes identical to the capacitance value of a circuit formed by one capacitive element C5 such as shown in FIG. 8. Here, FIG. 8 is a circuit diagram showing a circuit formed by providing one capacitive element C5 between the potentials V1 and V2. The capacitive element C5 has the same capacitance value as the capacitance value $C_0$ of each of the capacitive elements C1 through C4.

Namely, although the capacitance value $C_0$ can be realized by the single capacitive element C5 in such a circuit configuration as shown in FIG. 8, the four capacitive elements C1 through C4 are needed to realize the total capacitance value $C_0$ in such a circuit configuration as shown in FIG. 7.

However, the provision of such a circuit configuration as shown in FIG. 7 makes it possible to enhance the reliability of the circuit in which the capacitive elements are interposed between the potentials V1 and V2 due to the following reasons.

When an electrical breakdown occurs between the electrodes at the capacitive element C5 in such a circuit configuration as shown in FIG. 8 thereby to cause a leak or short circuit between the electrodes, a leak or short circuit occurs between the potentials V1 and V2, thereby disabling a circuit operation required of the circuit. Incidentally, while the following description is made as the short circuit being developed between the electrodes, the electrode-to-electrode leak will also be included in the short circuit.

On the other hand, even though one of the capacitive elements C1 through C4, e.g., the capacitive element C1 causes an electrical breakdown between the electrodes to short-circuit between the electrodes in such a circuit configuration as shown in FIG. 7 as in the present embodiment, the series circuit of the capacitive elements C3 and C4 and the single circuit of the capacitive element C2 are interposed in parallel between the potentials V1 and V2 since the short-circuited capacitive element C1 is coupled in series with the capacitive element C2, thus developing no short circuit between the potential V1 and the potential V2. The short circuit developed between the potential V1 and the potential V2 depends upon whether both of the capacitive elements C1 and C2 are short-circuited or both of the capacitive elements C3 and C4 are short-circuited. The probability that both of the capacitive elements C1 and C2 will be short-circuited, and the probability that both of the capacitive elements C3 and C4 will be short-circuited are extremely smaller than the probability that the individual capacitive elements C1 through C5 will be short-circuited. Therefore, although the circuit configuration of FIG. 7 and the circuit configuration of FIG. 8 are identical in the total capacitance value, the probability $P_0$ that the short circuit will be developed between the potential V1 and the potential V2 due to the short-circuit of each individual capacitive element becomes extremely smaller in the circuit configuration of FIG. 8 than the circuit configuration of FIG. 7. This will be explained more specifically.

Assuming that the failure rates of the capacitive elements C1 through C5 are the same P, the potential V1 and the potential V2 are short-circuited therebetween in the case of the circuit configuration of FIG. 8 if the capacitive element C5 fails. Therefore, the probability $P_0$ that the potentials V1 and V2 will be short-circuited therebetween becomes identical to P ($P_0$=P). On the other hand, since the probability that both of the capacitive elements C1 and C2 will fail is $P^2$ and the probability that both of the capacitive elements C3 and C4 will fail is also $P^2$ in the case of the circuit configuration of FIG. 7, the probability $P_0$ that the short circuit will be developed between the potential V1 and the potential V2 results in $2P^2$ corresponding to the sum ($P^2+P^2$) of the two ($P_0=2P^2$).

Since the failure rate P is sufficiently smaller than 1, $2P^2$ is extremely smaller than P ($2P^2 \ll P$). If the failure rate P of each of the capacitive elements C1 through C5 is $10^{-6}$, for example, the probability $P_0$ that the short circuit will be developed between the potential V1 and the potential V2 is $10^{-6}$ in the case of the circuit configuration of FIG. 8, whereas in the case of the circuit configuration of FIG. 7, the probability $P_0$ that the short circuit will be developed between the potential V1 and the potential V2 becomes $2P^2$, i.e., $2 \times 10^{-12}$. Thus, in the circuit configuration of FIG. 7 as compared with circuit configuration of FIG. 8, the probability $P_0$ that the short circuit will be developed between the potential V1 and the potential V2 due to the short circuit of each individual capacitive element can be made extremely small, and the reliability of the circuit with each capacitive element being interposed between the potentials V1 and V2 can greatly be enhanced. Thus, although the circuit configuration of FIG. 7 and the circuit configuration of FIG. 8 are identical in the total capacitance value, the reliability of the circuit in which each capacitive element is interposed between the potentials V1 and V2 can greatly be enhanced.

When a weak point exists in the capacitive element C5 large in area even one spot where the circuit shown in FIG. 8 is formed by the capacitive element C5 large in area, it is short-circuited so that the potentials V1 and V2 are short-circuited therebetween. On the other hand, a circuit equivalent to FIG. 8 can also be formed by dividing the capacitive element C5 into capacitive elements small in area and coupling these in parallel. When, however, even one of the capacitive elements coupled in parallel is short-circuited in this case, the potentials V1 and V2 are short-circuited therebetween even though no problem occurs in other capacitive elements. Therefore, even when the circuit of FIG. 8 is formed by one capacitive element C5 large in area or a plurality of capacitive elements small in area are coupled in parallel between the potentials V1 and V2 such that the total capacitance value is brought to C0 thereby to form a circuit equivalent to FIG. 8, the probability $P_0$ that the potentials V1 and V2 will be short-circuited therebetween becomes identical. On the other hand, if a plurality of the series circuits of the two capacitive elements are coupled in parallel between the potentials V1 and V2 as in the present embodiment (FIG. 7), it is then possible to prevent the potentials V1 and V2 from being short-circuited therebetween unless both capacitive elements in each series circuit of the two capacitive elements are short-circuited. Therefore, the reliability of the circuit in which the capacitive elements are interposed between the potentials V1 and V2 can be enhanced greatly.

It is also considered that unlike the present embodiment, the conductor pattern Me2a and conductor pattern Me2b brought to the floating potential are coupled to each other by conductors. Since, however, the conductor pattern Me1a and the conductor patterns Me2a and Me2b are short-circuit when one of the capacitive elements C1 and C3 is short-circuited in this case, the other of the capacitive elements C1 and C3 also becomes the same state as when short-circuited. Since the conductor pattern Me1b and the conductor patterns Me2a and Me2b are short-circuited when one of the capacitive elements C2 and C4 is short-circuited, the other of the capacitive elements C2 and C4 also becomes the same state as when shorted. Therefore, the short-circuiting of the potentials V1 and V2 therebetween results in the case where at least one of the capacitive elements C1 and C3 fails and at least one of the capacitive elements C2 and C4 fails. Thus, the probability $P_0$ that the short-circuit will be developed between the potentials V1 and V2 results in $4P^2$ equal to the product of a probability 2P that at least one of the capacitive elements C1 and C3 will fail, and a probability 2P that at least one of the capacitive elements C2 and C4 will fail ($P_0=4P^2$).

On the other hand, since the conductor pattern Me2a and conductor pattern Me2b brought to the floating potential are not coupled to each other by the conductors in the present embodiment, no dc current flows with respect to each other (between the conductor patterns Me2a and Me2b). Therefore, when one of the capacitive elements C1 and C3, e.g., the capacitive element C1 is short-circuited, the conductor patterns Me1a and Me2a are short-circuited, whereas the conductor patterns Me1a and Me2b are not short-circuited, so that the capacitive element C3 is not brought into a short-circuited state. Similarly, when one of the capacitive elements C2 and C4, e.g., the capacitive element C4 is short-circuited, the conductor patterns Me1b and Me2b are short-circuited, whereas the conductor patterns Me1b and Me2a are not short-circuited, so that the capacitive element C2 is not brought into a short-circuited state. Thus, when the conductor patterns Me2a and Me2b are not coupled to each other by the conductors as in the present embodiment, the probability $P_0$ that the short circuit will occur between the potentials V1 and V2 results in $2P^2$ equal to the sum of a probability $P^2$ that both the capacitive elements C1 and C2 will fail, and a probability $P^2$ that both the capacitive elements C3 and C4 will fail ($P_0=2P^2$).

Therefore, as compared with the case where the conductor pattern Me2a and the conductor pattern Me2b are coupled to each other by the conductors ($P_0=4P^2$), the probability $P_0$ that the short circuit will be developed between the potentials V1 and V2 due to the short circuit of each individual capacitive element can be made small in the present embodiment by avoiding that the conductor patterns Me2a and conductor pattern Me2b brought to the floating potential are coupled to each other (preventing the dc current from flowing). Thus, the reliability of the circuit with the capacitive elements being interposed between the potentials V1 and V2 can be further enhanced.

In the present embodiment as described above, such a circuit configuration as shown in FIG. 7 is realized to make it possible to greatly enhance the reliability of the circuit with the capacitive elements interposed between the potentials V1 and V2 and enhance the reliability of the semiconductor device.

If the semiconductor device according to the present embodiment can be enhanced greatly in reliability, then a large effect is brought about if the invention is applied to a semiconductor device such as for vehicles (uses for cars) which requires high reliability in particular. This is similar even in the case of the following second through fourth preferred embodiments.

Thus, while the reliability of the circuit with the capacitive elements interposed between the potentials V1 and V2 can greatly be enhanced by virtue of such a circuit configuration as shown in FIG. 7, the layouts or the like of the conductor patterns that form the capacitive elements C1 through C4 are devised upon forming the circuit configuration of FIG. 7 over the semiconductor substrate in the present embodiment.

It is considered that since the capacitive elements C1 and C2 are coupled in series, the capacitive element C1 and the capacitive element C2 are stacked vertically unlike the present embodiment. In this case, however, the number of conductor layers (metal layers in the present embodiment) necessary to form the capacitive elements C1 through C4 increases with the vertical stacking of the capacitive elements. Increasing the number of the conductor layers (metal layers in the present embodiment) formed over the semiconductor substrate will incur an increase in the manufacturing cost of the semiconductor device.

On the other hand, in the present embodiment, the capacitive elements C1 and C2 coupled in series are laid out in the same layer and in areas (adjoining areas) different from each other on a plane basis without stacking them vertically. Further, the capacitive elements C3 and C4 coupled in series are also laid out in the same layer and in areas (adjoining areas) different from each other on a plane basis without being stacked vertically. Namely, the lower electrodes E1b, E2b, E3b and E4b of the capacitive elements C1, C2, C3 and C4 are formed by the conductor layers (conductor layers that form the conductor patterns Me1a and Me1b in the present embodiment) of the same layer formed in the same process step, and the upper electrodes E1a, E2a, E3a and E42 of the capacitive elements C1, C2, C3 and C4 are formed by the conductor layers (conductor layers that form the conductor patterns Me2a and Me2b in the present embodiment) of the same layer formed in the same process step. Thus, the number of the necessary conductor layers (metal layers in the present embodiment) may need to be few. For instance, the two layers corresponding to the layer (conductor layer) for the conductor patterns Me1a and Me1b and the layer (conductor layer) for the conductor patterns Me2a and Me2b are merely needed. Thus, the number of the conductor layers (metal layers in the present embodiment) used in the capacitive elements C1 through C4 can be reduced. Therefore, such a circuit as shown in FIG. 7 can be realized by the MIM type capacitive elements C1 through C4 while an increase in the number of the conductor layers (metal layers) formed over the semiconductor substrate is being suppressed, and the manufacturing cost of the semiconductor device can be suppressed. Thus, an improvement in reliability of the semiconductor device and a reduction in the manufacturing cost thereof can be made compatible.

Figure 9:
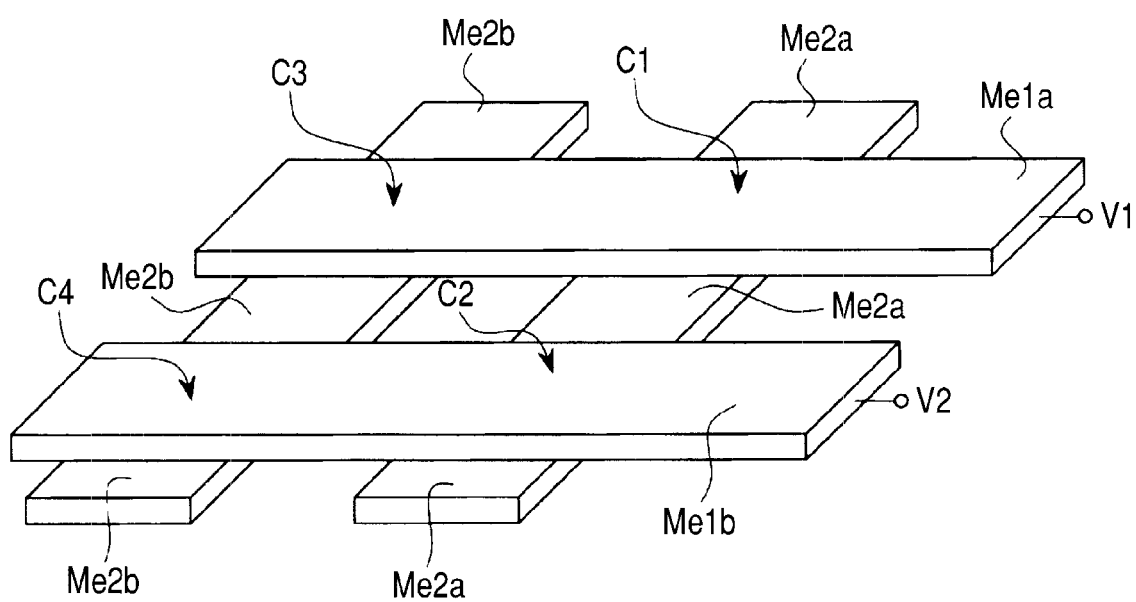
FIG. 9 is a perspective view illustrating a modification of the semiconductor device according to the first embodiment of the present invention.

FIG. 9 is a fragmentary perspective view showing a modification of the semiconductor device according to the present embodiment and corresponds to FIG. 1.

A physical or positional relationship between the conductor patterns Me1a and Me1b and the conductor patterns Me2a and Me2b shown in FIG. 1 is turned upside down. As shown in FIG. 9, the conductor patterns Me2a and Me2b can also be provided in a layer located below the conductor patterns Me1a and Me1b. Since, in this case, the conductor patterns Me1a and Me1b coupled to their corresponding potentials V1 and V2 are formed in a layer above the conductor patterns Me2a and Me2b each brought to the floating potential, the conductor patterns Me2a and Me2b do not interfere with routing for coupling the conductor patterns Me1a and Me1b to the potentials V1 and V2 respectively. Therefore, it becomes easy to couple the conductor pattern Me1a to its corresponding bonding pad or wiring for the potential V1. It becomes also easy to couple the conductor pattern Me1b to its corresponding bonding pad or wiring for the potential V2.

Thus, the electrodes (lower electrodes E1b, E2b, E3b and E4b in the present embodiment) located on the sides coupled to the potentials V1 and V2, of the capacitive elements C1 through C4 comprise the first conductor layer formed over the semiconductor substrate 1. The electrodes (upper electrodes E1a, E2a, E3a and E4a in the present embodiment) located on the sides brought to the floating potential, of the capacitive elements C1 through C4 comprise the second conductor layer formed over the semiconductor substrate 1 and different from the first conductor layer. In FIGS. 1 through 6, however, the second conductor layer is formed in a layer above the first conductor layer. On the other hand, the second conductor layer is formed in a layer below the first conductor layer in FIG. 9.

Incidentally, the first conductor layer that forms the electrodes lying on the sides coupled to the potentials V1 and V2, of the capacitive elements C1 through C4 corresponds to the conductor layer (metal layer) that forms the conductor patterns Me1a and Me1b in the present embodiment. In a second embodiment shown below, the first conductor layer corresponds to a conductor layer (silicon layer) that forms conductor patterns PS1a and PS1b. In a third embodiment shown below, the first conductor layer corresponds to a conductor layer (impurity diffusion layer) that forms n-type semiconductor regions 23a and 23b. Further, the first conductor layer corresponds to a conductor layer (conductor film 49) that forms an upper electrode Ep in a fourth embodiment shown below. The second conductor layer that forms the electrodes lying on the sides brought to the floating potential, of the capacitive elements C1 through C4 corresponds to the conductor layer (metal layer) that forms the conductor patterns Me2a and Me2b in the present embodiment. In the second embodiment shown below, the second conductor layer corresponds to a conductor layer (silicon layer) that forms conductor patterns PS2a and PS2b. In the third embodiment shown below, the second conductor layer corresponds to a conductor layer (silicon layer) that forms conductor patterns PS3a and PS3b. Further, the second conductor layer corresponds to a conductor layer that forms a lower electrode 47 in the fourth embodiment shown below.

Figure 10:
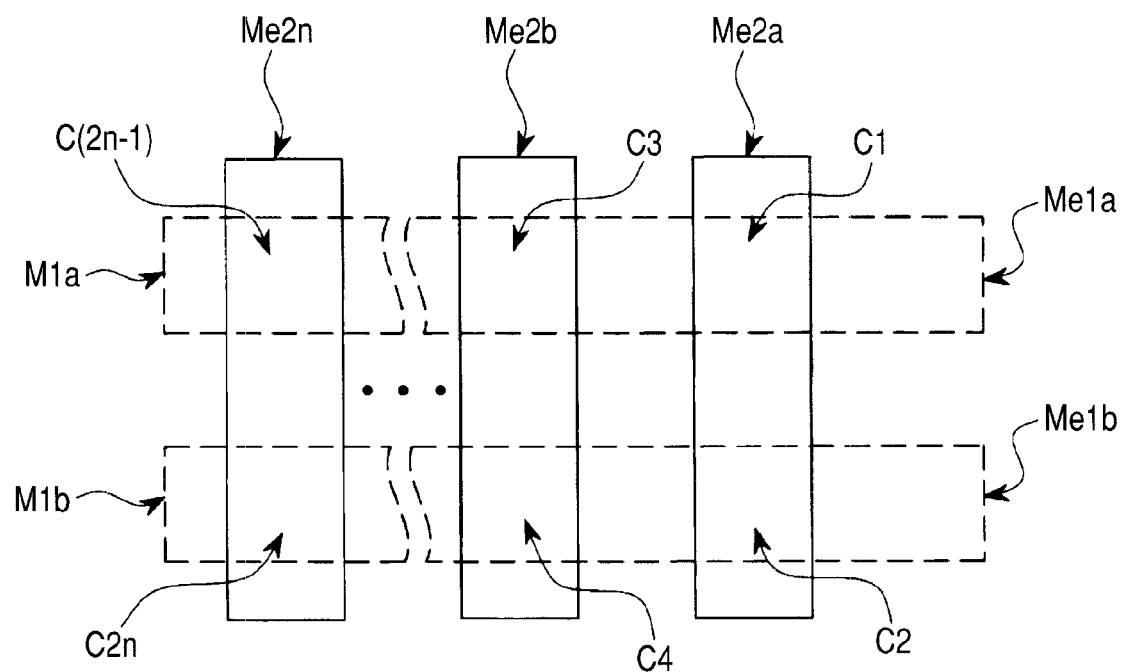
FIG. 10 is a plan view showing another modification of the semiconductor device according to the first embodiment of the present invention.
Figure 11:
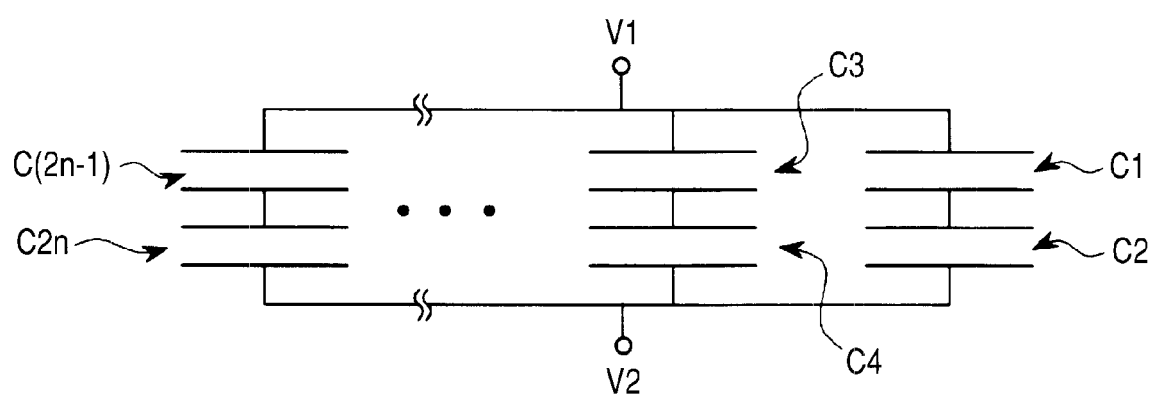
FIG. 11 is a circuit diagram of the semiconductor device shown in FIG. 10.

Although FIGS. 1 through 7 have explained the case wherein the respective series circuits each comprised of the two capacitive elements are coupled two in parallel between the potentials V1 and V2, the number of the series circuits to be coupled may be two or more (i.e., plural), but is not limited to two. FIG. 10 is a fragmentary plan view showing a case where respective series circuits each comprising two capacitive elements are coupled n (where n: integer greater than or equal to 3) in parallel between potentials V1 and V2, and FIG. 11 is a circuit diagram thereof. They correspond to FIGS. 2 and 7 respectively.

When the number of the series circuits comprised of the two capacitive elements, which are coupled in parallel between the potentials V1 and V2, is n, the number of conductor patterns corresponding to conductor patterns Me2a and Me2b is assumed to be n (corresponding to the number of n). In FIGS. 10 and 11, the n conductor patterns Me2a, Me2b, . . . , Me2n extend in the direction in which they intersect with two conductor patterns Me1a and Me1b. Although the conductor patterns Me2a through Me2n comprise a conductor layer (conductor pattern) of the same layer formed in the same process step, they are not coupled to one another by conductors. An insulating film 5 used as a capacitive insulating film is interposed between the conductor patterns Me2a through Me2n and the conductor patterns Me1a and Me1b. 2n capacitive elements C1, C2, C3, C4, . . . , C(2n−1), C2n are formed in 2n (twice the number of n is represented as 2n) areas where the conductor patterns Me2a through Me2n and the conductor patterns Me1a and Me1b intersect.

Namely, in the areas where the conductor patterns Me2a through Me2n and the conductor pattern Me1a intersect one another, the conductor patterns Me2a through Me2n assume upper electrodes, the conductor pattern Me1a assumes a lower electrode, the insulating film 5 lying between the conductor patterns Me2a through Me2n and the conductor pattern Me1a assumes the capacitive insulating film, whereby the capacitive elements C1, C3, . . . , C(2n−1) are formed. In the areas where the conductor patterns Me2a through Me2n and the conductor pattern Me1b intersect one another, the conductor patterns Me2a through Me2n assume upper electrodes, the conductor pattern Me1b assumes a lower electrode, the insulating film 5 lying between the conductor patterns Me2a through Me2n and the conductor pattern Me1b assumes the capacitive insulating film, whereby the capacitive elements C2, C4, . . . , C2n are formed. The capacitive elements C1 through C2n are of MIM type capacitive elements. The conductor pattern Me1a is coupled to a first potential V1 and the conductor pattern Me1b is coupled to a second potential V2. The conductor patterns Me2a through Me2n are respectively brought to a floating potential.

If such a configuration is taken, then the probability $P_0$ that a short circuit will occur between the potentials V1 and V2 results in $nP^2$ ($P_0=nP^2$) assuming that the failure rates of the respective capacitive elements C1 through C2n is set to the same P. Therefore, the probability $P_0$ that a short circuit will be developed between the potential V1 and the potential V2 due to a short circuit of each individual capacitive element can be made extremely small, and the reliability of the circuit with each capacitive element being interposed between the potentials V1 and V2 can greatly be enhanced. The total capacitance value can be increased by increasing the number n of the series circuits each comprising the two capacitive elements, which are coupled in parallel between the potentials V1 and V2.

Figure 12:
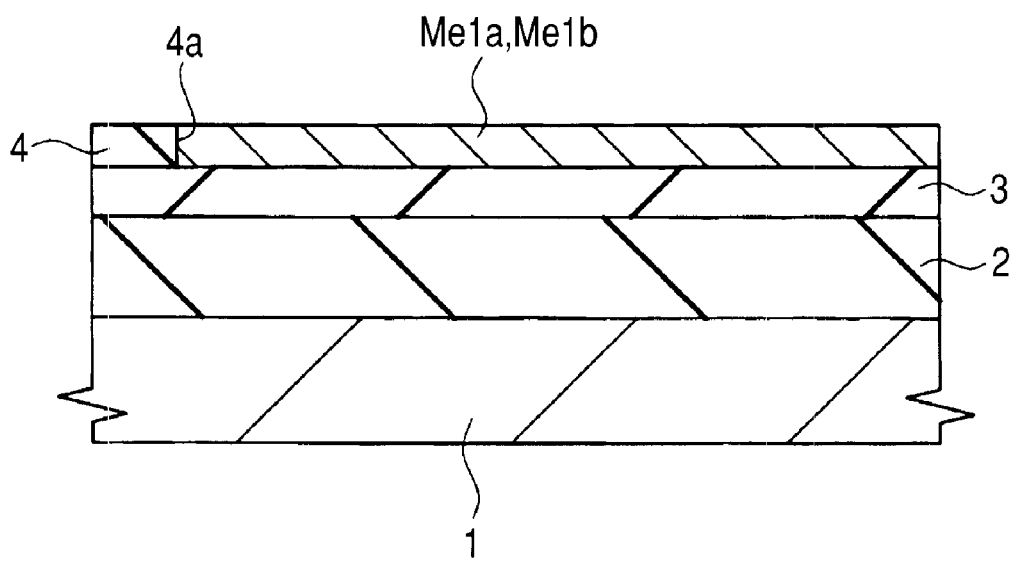
FIG. 12 is a fragmentary sectional view in a manufacturing process of the semiconductor device according to the first embodiment of the present invention.
Figure 13:
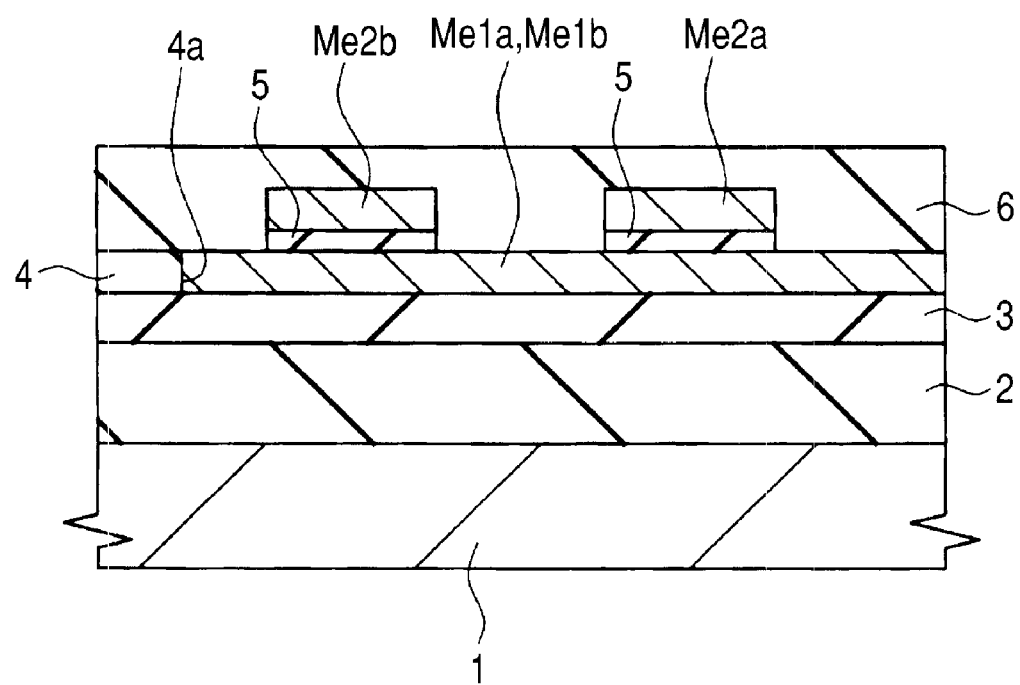
FIG. 13 is a fragmentary sectional view in the manufacturing process of the semiconductor device, following FIG. 12.

One example of a method for manufacturing such a semiconductor device as shown in FIGS. 1 through 7 will next be explained. FIGS. 12 and 13 are respectively fragmentary sectional views in a manufacturing process, of the semiconductor device according to the present embodiment and show an area corresponding to FIG. 3 or 4.

As shown in FIG. 12, various elements are formed over a principal or main surface of a semiconductor substrate 1 using a known method. Further, an interlayer insulating film and a wiring layer are formed thereon. In a manner similar to FIGS. 3 through 6, areas in which the elements, interlayer insulating film and wiring layer are formed, are collectively shown as a device or element area 2.

An insulating film (interlayer insulating film) 3 is formed over the device area 2. An insulating film (interlayer insulating film) 4 is formed over the insulating film 3. Conductor patterns Me1a and Me1b are formed using the Damascene method or the like. For example, after the deposition of the insulating film 4, openings (trenches) 4a for the formation of the conductor patterns Me1a and Me1b are formed in the insulating film 4. Then, a metal film (metal film for the conductor patterns Me1a and Me1b) comprising a laminated film of, for example, conductive barrier film (such as a titanium film, a titanium nitride film or a laminated film of these) and tungsten film thicker than the conductive barrier film is formed over the insulating film 4 so as to fill or bury the inside of the openings 4a. After that, the unnecessary metal film lying over the insulating film 4 is removed by a CMP method or an etchback method or the like and the metal film is left within each opening 4a. Thus, the conductor patterns Me1a and Me1b comprised of the metal film embedded into the openings 4a of the insulating film 4 can be formed.

Next, an insulating film 5 comprised of titanium nitride or the like is formed over the entire surface of the insulating film 4 including the conductor patterns Me1a and Me1b as shown in FIG. 13. Then, a metal film (metal film for conductor patterns Me2a and Me2b) comprised of a laminated film or the like of, for example, conductive barrier film (such as a titanium film, a titanium nitride film or a laminated film of these) and aluminum film thicker than the conductive barrier film is formed over the insulating film 5. Thereafter, the laminated film of insulating film 5 and metal film is patterned using a photolithography method and a dry etching method. Thus, laminated film patterns comprised of the insulating film 5 and the conductor patterns Me1a and Me1b can be formed over the insulating film 4 with the conductor patterns Me1a and Me1b embedded therein. Thereafter, an insulating film 6 is formed over the insulating film 4 so as to cover the conductor patterns Me2a and Me2b.

The specific configuration of the semiconductor device according to the present embodiment has been explained above. In the semiconductor devices according to the first embodiment and the second through fourth embodiments, the upper electrodes E1a, E2a, E3a and E4a of the capacitive elements C1, C2, C3 and C4 are respectively formed by the conductor layer (corresponding to each of the conductor patterns Me2a and Me2b in the first embodiment, the conductor patterns PS2a and PS2b in the second embodiment, the conductor patterns PS3a and PS3b in the third embodiment and the conductor film 49 in the fourth embodiment) of the same layer formed in the same process step. The lower electrodes E1b, E2b, E3b and E4b of the capacitive elements C1, C2, C3 and C4 are respectively formed by the conductor layer (corresponding to each of the conductor patterns Me1a and Me1b in the present embodiment, the conductor patterns PS1a and PS1b in the second embodiment, the n-type semiconductor regions 23a and 23b in the third embodiment and the lower electrode 47 in the fourth embodiment) of the same layer formed in the same process step. However, the conductor layer that forms the lower electrodes E1b, E2b, E3b and E4b, and the conductor layer that forms the upper electrodes E1a, E2a, E3a and E4a are of layers different from each other. The conductor layer that forms the upper electrodes E1a, E2a, E3a and E4a is formed in a layer above or below the conductor layer that forms the lower electrodes E1b, E2b, E3b and E4b. The capacitive insulating films between the upper electrodes and lower electrodes of the capacitive elements C1, C2, C3 and C4 are formed by the insulating film (corresponding to each of the insulating film 5 in the present embodiment and insulating films 5a, 5b and 48 in the second through fourth embodiments shown below) of the same layer formed in the same process step. The lower electrodes E1b and E3b of the capacitive elements C1 and C3 are electrically coupled to each other through the corresponding conductor and coupled to the potential V1. The lower electrodes E2b and E4b of the capacitive elements C2 and C4 are electrically coupled to each other through the corresponding conductor and electrically coupled to the potential V2. The upper electrodes E1a and E2a of the capacitive elements C1 and C2 are electrically coupled to each other through the corresponding conductor and brought to the floating potential. The upper electrodes E3a and E4a of the capacitive elements C3 and C4 are electrically coupled to each other through the corresponding conductor and brought to the floating potential. However, the upper electrodes E1a and E2a of the capacitive elements C1 and C2 are not coupled to the upper electrodes E3a and E4a of the capacitive elements C3 and C4. Thus, such a circuit configuration as shown in FIG. 7 is realized to make it possible to greatly enhance the reliability of the circuit with the capacitive elements interposed between the potentials V1 and V2 as described above and reduce the number of the conductor layers used to form the capacitive elements C1 through C4, whereby the manufacturing cost of the semiconductor device can be suppressed. Accordingly, an improvement in the reliability of the semiconductor device and a reduction in the manufacturing cost thereof can be made compatible.

In the first embodiment and the fourth embodiment shown below, such a configuration is applied to the MIM type capacitive elements. In the second embodiment shown below, such a configuration is applied to PIP type capacitive elements. In the third embodiment shown below, such a configuration is applied to MOS type capacitive elements.

In the present embodiment, the conductor patterns Me2a and Me2b are extended so as to intersect with their corresponding conductor patterns Me1a and Me1b. The conductor patterns Me2a and Me2b are respectively brought to the floating potential. The conductor pattern Me1a is set to the potential V1 and the conductor pattern Me1b is set to the potential V2. By doing so, the MIM type capacitive elements C1 through C4 are formed in their corresponding areas where the conductor patterns Me1a and Me1b and the conductor patterns Me2a and Me2b intersect respectively, whereby the above configuration and effects are realized efficiently. Similarly, in the following second embodiment, the conductor patterns PS2a and PS2b are extended so as to intersect with their corresponding conductor patterns PS1a and PS1b. The conductor patterns PS2a and PS2b are respectively brought to the floating potential. The conductor pattern PS1a is set to the potential V1 and the conductor pattern PS1b is set to the potential V2. By doing so, the PIP type capacitive elements C1 through C4 are formed in their corresponding areas where the conductor patterns PS1a and PS1b and the conductor patterns PS2a and PS2b intersect respectively, whereby the above configuration and effects are realized efficiently. In the following third embodiment, the conductor patterns PS3a and PS3b are extended so as to intersect with their corresponding n-type semiconductor regions 23a and 23b. The conductor patterns PS3a and PS3b are respectively brought to the floating potential. The n-type semiconductor region 23a is set to the potential V1 and the n-type semiconductor region 23b is set to the potential V2. By doing so, the MOS type capacitive elements C1 through C4 are formed in their corresponding areas where the n-type semiconductor regions 23a and 23b and the conductor patterns PS3a and PS3b intersect respectively, whereby the above configuration and effects are realized efficiently.

In the first embodiment, the capacitive elements C1 through C4 are formed by the MIM type capacitive elements. Therefore, the conductor patterns Me1a, Me1b, Me2a and Me2b for forming the capacitive elements C1 through C4 can be formed over the interlayer insulating film formed over the semiconductor substrate 1. Therefore, a region or area (substrate area) lying below each of regions for forming the capacitive elements C1 through C4 can be used effectively. Elements such as transistors, wirings for coupling between the elements, and the like can also be formed below the regions for forming the capacitive elements C1 through C4. Thus, the influence of the area of each capacitor forming region due to the provision of the circuit configuration shown in FIG. 7 is less reduced, and an improvement in the reliability of the semiconductor device and a size reduction in the semiconductor device (reduction in its area) can be made compatible.

Second Preferred Embodiment

A semiconductor device according to the present embodiment is also of a semiconductor device having capacitive elements.

Figure 14:
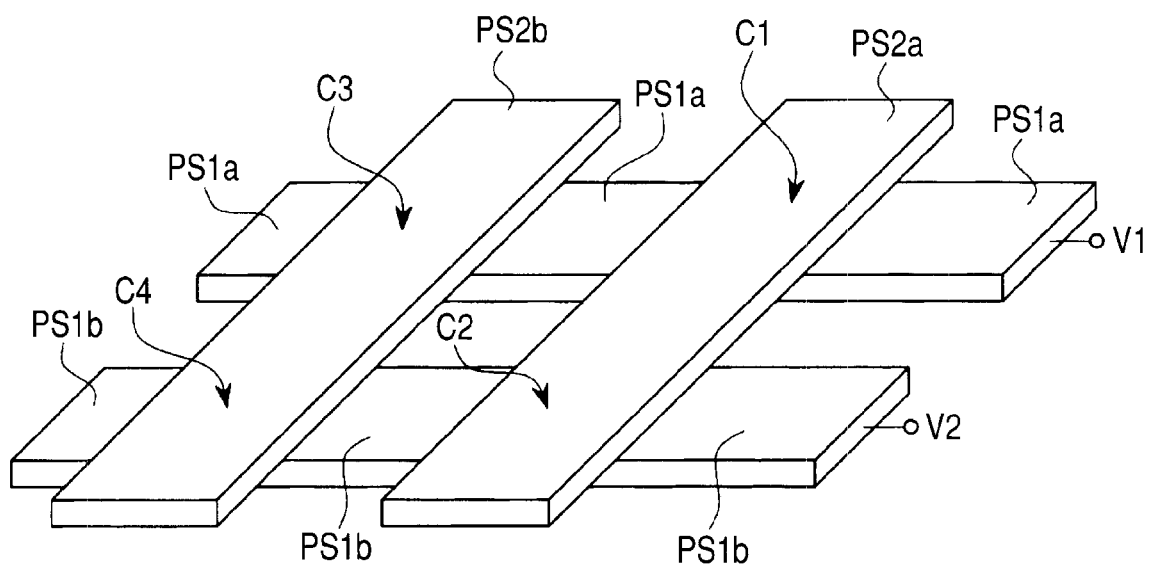
FIG. 14 is a fragmentary perspective view showing a conceptual structure of a semiconductor device according to a second embodiment of the present invention.
Figure 15:
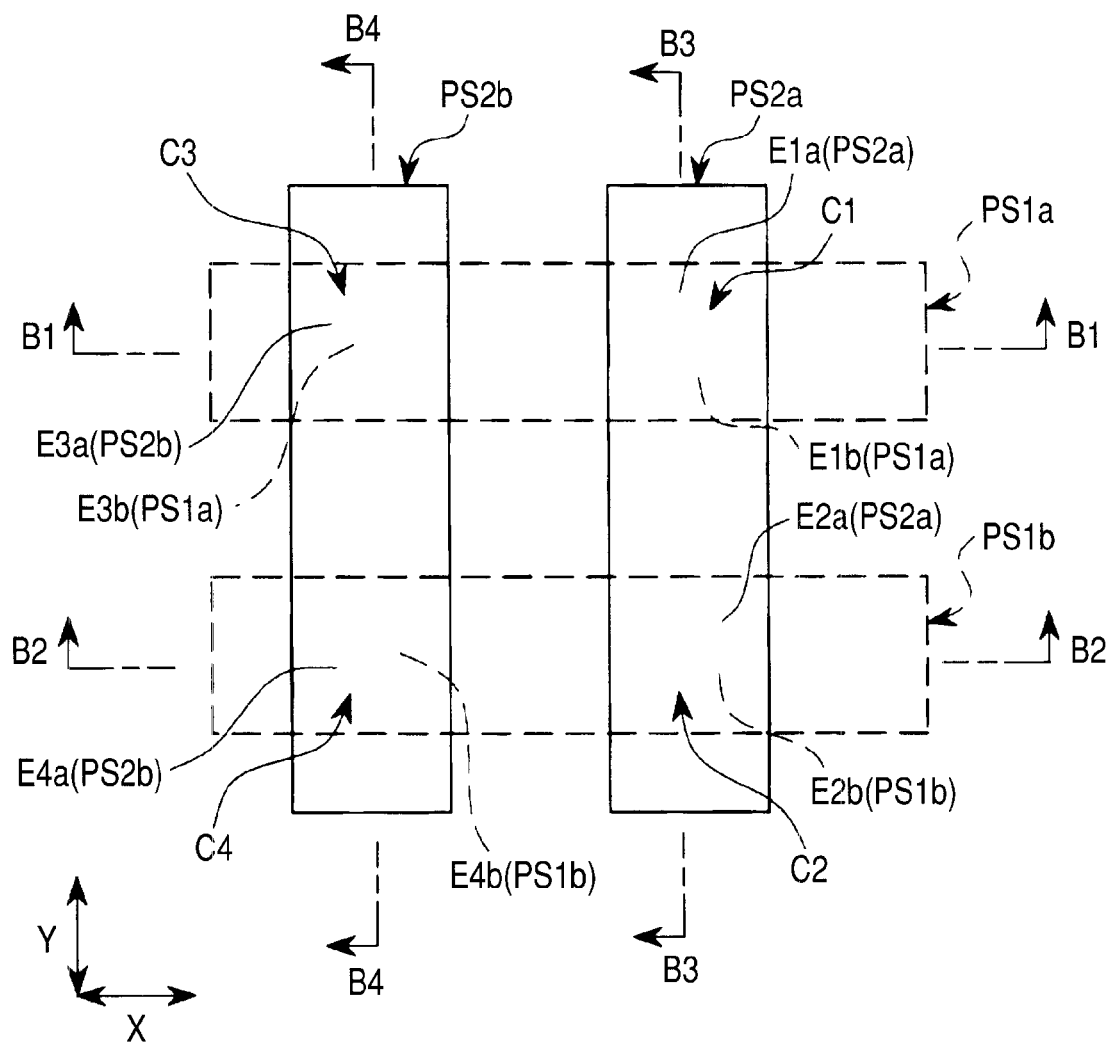
FIG. 15 is a fragmentary plan view of the semiconductor device according to the second embodiment of the present invention.
Figure 16:
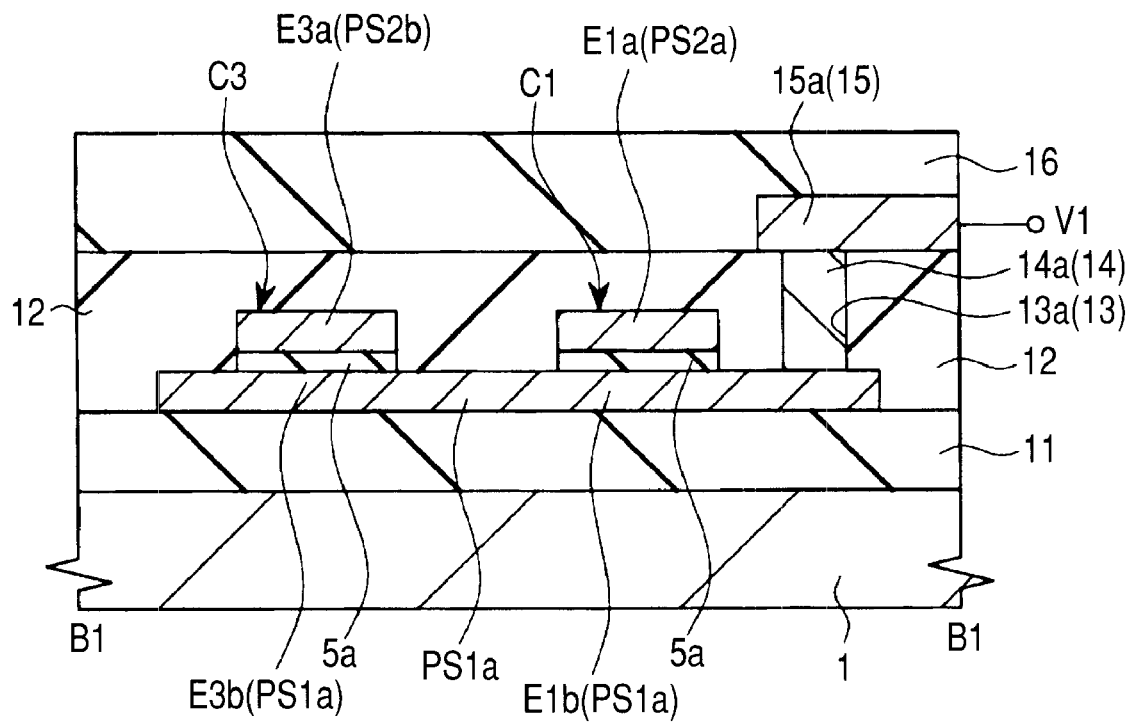
FIG. 16 is a fragmentary sectional view of the semiconductor device according to the second embodiment of the present invention.
Figure 17:
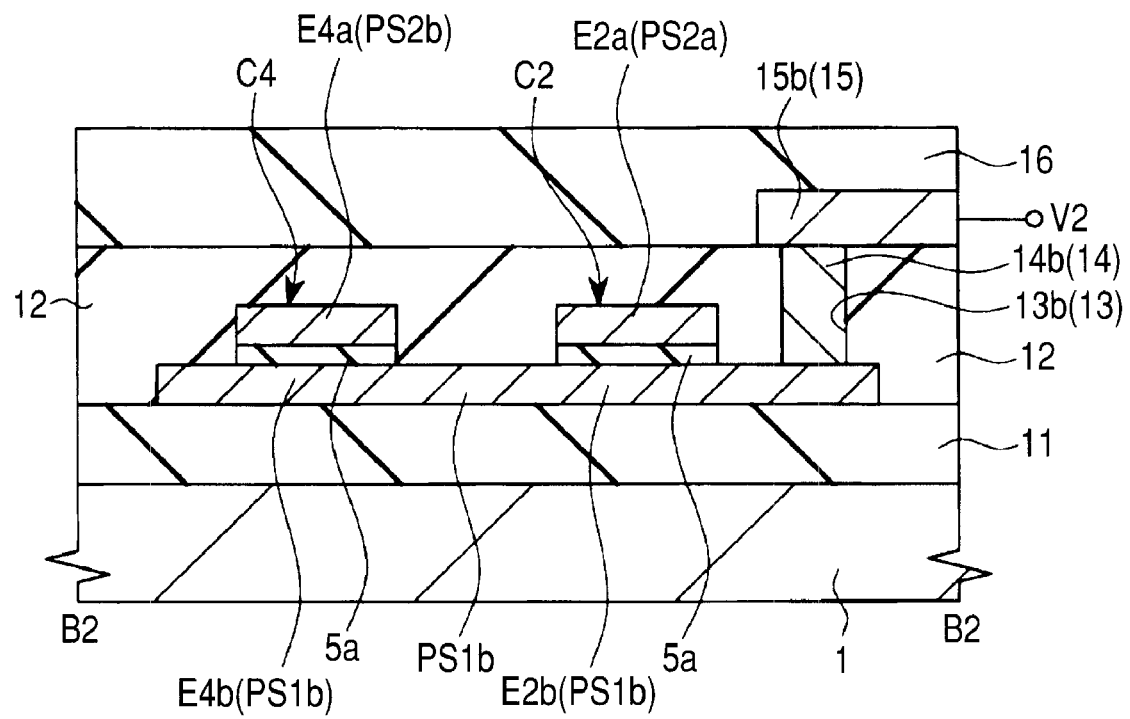
FIG. 17 is a fragmentary sectional view of the semiconductor device according to the second embodiment of the present invention.
Figure 18:
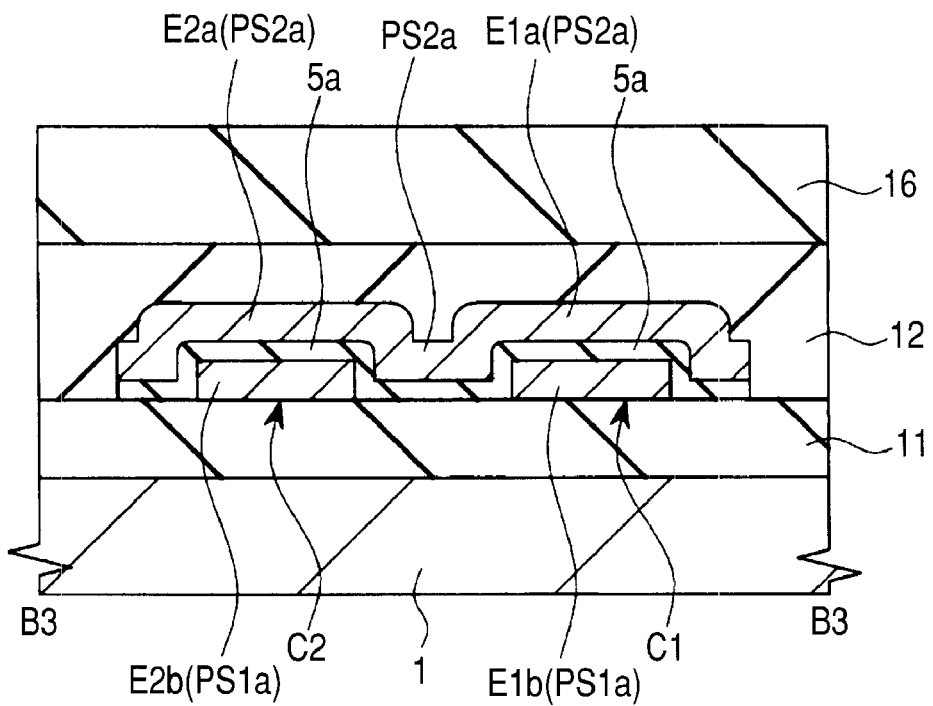
FIG. 18 is a fragmentary sectional view of the semiconductor device according to the second embodiment of the present invention.
Figure 19:
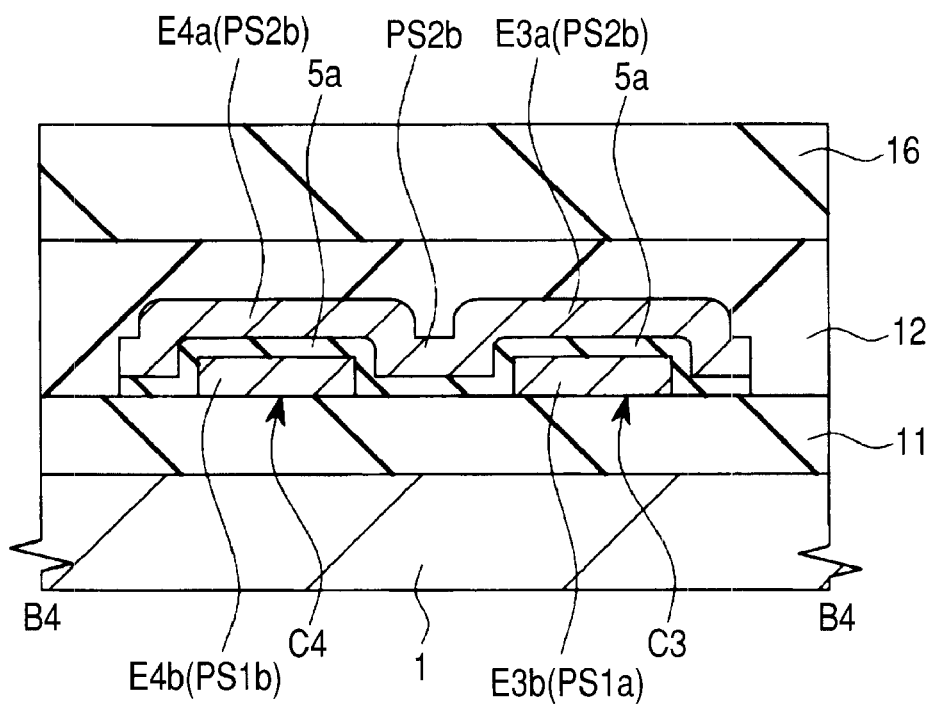
FIG. 19 is a fragmentary sectional view of the semiconductor device according to the second embodiment of the present invention.

FIG. 14 is a fragmentary perspective view showing a conceptual structure of the semiconductor device according to the present embodiment, FIG. 15 is a fragmentary plan view thereof, and FIGS. 16 through 19 are respectively fragmentary sectional views thereof. They respectively correspond to FIGS. 1 through 6 of the first embodiment. A sectional view taken along line B1-B1 of FIG. 15 corresponds to FIG. 16, a sectional view taken along B2-B2 of FIG. 15 corresponds to FIG. 17, a sectional view taken along B3-B3 of FIG. 15 corresponds to FIG. 18, and a sectional view taken along B4-B4 of FIG. 15 corresponds to FIG. 19, respectively. In FIGS. 14 and 15, only the conductor patterns PS1a, PS1b, PS2a and PS2b are shown and configurations other than the above are not illustrated. In FIG. 15, the plane layouts of the conductor patterns PS2a and PS2b are respectively indicated by solid lines, and the plane layouts of the conductor patterns PS1a and PS1b are respectively indicated by dotted lines. Since a circuit diagram is identical to FIG. 7 of the first embodiment, its illustration is omitted herein.

The semiconductor device according to the present embodiment is also of a semiconductor device having capacitive elements C1 through C4 disposed over a semiconductor substrate 1 in a manner similar to the semiconductor device according to the first embodiment. In the first embodiment, however, the capacitive elements C1 through C4 are configured as the MIN type capacitive elements, whereas in the present embodiment, the capacitive elements C1 through C4 are configured by so-called PIP type capacitive elements.

A device isolation region or area 11 is formed over a principal or main surface of the semiconductor substrate 1 that forms the semiconductor device of the present embodiment shown in FIGS. 14 through 19. The device isolation area 11 is comprised of an insulator (e.g., silicon oxide) or the like embedded in each device isolation trench.

The conductor patterns PS1a and PS1b are formed over the device isolation area 11. The conductor pattern PS1a and the conductor pattern PS1b comprise a conductor layer (first conductor layer: silicon layer in the present embodiment) of the same layer and are formed in the same process step. The conductor pattern (first conductor pattern) PS1a and the conductor pattern (second conductor pattern) PS1b are not coupled to each other by a conductor (that is, no dc current flows). The conductor patterns PS1a and PS1b are respectively preferably comprised of a silicon layer (silicon film, patterned silicon films) like a polycrystalline silicon film (doped polysilicon film) and implanted with an impurity so as to be set to low resistivity.

The conductor patterns PS2a and PS2b are formed in a layer above the conductor patterns PS1a and PS1b. The conductor pattern PS2a and the conductor pattern PS2b comprise the conductor layer (second conductor layer: silicon layer in the present embodiment) of the same layer and are formed in the same process step. The conductor pattern (third conductor pattern) PS2a and the conductor pattern (fourth conductor pattern) PS2b are coupled to each other by a conductor (that is, no dc current flows). The conductor patterns PS2a and PS2b are respectively preferably comprised of a silicon layer (silicon film, patterned silicon films) like a polycrystalline silicon film (doped polysilicon film) and implanted with an impurity so as to be set to low resistivity.

The conductor pattern PS2a extends so as to intersect with both of the conductor pattern PS1a and the conductor pattern PS1b. The conductor pattern PS2b also extends so as to intersect with both of the conductor pattern PS1a and the conductor pattern PS1b. For example, the conductor patterns PS1a and PS1b extend in an X direction of FIG. 11, whereas the conductor patterns PS2a and PS2b extend in a Y direction of FIG. 11. Here, the X and Y directions respectively indicate the directions intersecting with each other (more preferably orthogonal to each other).

Each of the conductor patterns PS2a and PS2b is patterned as a laminated film with an insulating film 5a. The laminated-film patterns respectively intersect with the conductor patterns PS2a and PS2b and extend over the semiconductor substrate 1 so as to cross over the conductor patterns PS2a and PS2b. Therefore, the insulating film 5a is formed below the conductor patterns PS2a and PS2b. In areas where the conductor patterns PS2a and PS2b and the conductor patterns PS1a and PS1b intersect respectively, the insulating film 5a used as a capacitive insulating film is interposed between the conductor patterns PS2a and PS2b and the conductor patterns PS1a and PS1b respectively. Thus, the capacitive elements C1, C2, C3 and C4 are formed in their corresponding areas where the conductor patterns PS2a and PS2b and the conductor patterns PS1a and PS1b intersect respectively.

Namely, in the area where the conductor pattern PS2a and the conductor pattern PS1a intersect, the conductor pattern PS2a lying in the area assumes an upper electrode E1a of the capacitive element C1, the conductor pattern PS1a lying in the area assumes a lower electrode E1b of the capacitive element C1, and the insulating film 5a between the upper electrode E1a and the lower electrode E1b assumes the capacitive insulating film of the capacitive element C1, whereby the capacitive element C1 is formed. In the area where the conductor pattern PS2a and the conductor pattern PS1b intersect, the conductor pattern PS2a lying in the area assumes an upper electrode E2a of the capacitive element C2, the conductor pattern PS1b lying in the area assumes a lower electrode E2b of the capacitive element C2, and the insulating film 5a between the upper electrode E2a and the lower electrode E2b assumes the capacitive insulating film of the capacitive element C2, whereby the capacitive element C2 is formed. In the area where the conductor pattern PS2b and the conductor pattern PS1a intersect, the conductor pattern PS2b lying in the area assumes an upper electrode E3a of the capacitive element C3, the conductor pattern PS1a lying in the area assumes a lower electrode E3b of the capacitive element C3, and the insulating film 5a between the upper electrode E3a and the lower electrode E3b assumes the capacitive insulating film of the capacitive element C3, whereby the capacitive element C3 is formed. In the area where the conductor pattern PS2b and the conductor pattern PS1b intersect, the conductor pattern PS2b lying in the area assumes an upper electrode E4a of the capacitive element C4, the conductor pattern PS1b lying in the area assumes a lower electrode E4b of the capacitive element C4, and the insulating film 5a between the upper electrode E4a and the lower electrode E4b assumes the capacitive insulating film of the capacitive element C4, whereby the capacitive element C4 is formed. Thus, the capacitive elements C1 through C4 are of the so-called PIP (Polysilicon Insulator Polysilicon) type capacitive elements respectively.

Here, the PIP type capacitive elements are of capacitive elements (polysilicon capacitive elements) comprising polysilicon layers (polysilicon layer of conductor patterns PS1a and PS1b and polysilicon layer of conductor patterns PS2a and PS2b in the present embodiment) of two layers, and an insulating film (insulating film 5a in the present embodiment) sandwiched between these.

An insulating film (interlayer insulating film) 12 is formed over the semiconductor substrate 1 so as to cover the conductor patterns PS1a and PS1b, insulating film 5a and conductor patterns PS2a and PS2b. Contact holes (openings, through holes) 13 are formed in the insulating film 12, and plugs 14 each comprised of a conductor are embedded in their corresponding contact holes 13. The contact hole 13a of the contact holes 13 is formed above the conductor pattern PS1a, and part of the conductor pattern PS1a is exposed at its bottom. The contact hole 13b of the contact holes 13 is formed above the contactor pattern PS1b, and part of the conductor pattern PS1b is exposed at its bottom. The plug 14a of the plugs 14 is embedded in the contact hole 13a and the plug 14b of the plugs 14 is embedded in the contact hole 13b. The plug 14a is electrically coupled to the conductor pattern PS1a in contact therewith at its bottom, and the plug 14b is electrically coupled to the conductor pattern PS1b in contact therewith at its bottom.

Wirings 15 are formed over the insulating film 12 with the plugs 14 embedded therein, and an insulating film 16 is formed over the insulating film 12 so as to cover the wirings 15. The conductor pattern PS1a is electrically coupled to its corresponding wiring 15a of the wirings 15 via the plug 14a. The conductor pattern PS1b is electrically coupled to its corresponding wiring 15b of the wirings 15 via the plug 14b.

The conductor pattern PS1a is coupled to its corresponding potential V1 via the plug 14a and the wiring 15a or the like. The conductor pattern PS1b is coupled to its corresponding potential V2 via the plug 14b and the wiring 15a. The conductor patterns PS2a and PS2b are respectively brought to a floating potential. The potentials V1 and V2 are of potentials different from each other.

The conductor pattern PS1a, conductor pattern PS1b, conductor pattern PS2a and conductor pattern PS2b employed in the present embodiment correspond to the conductor pattern Me1a, conductor pattern Me1b, conductor pattern Me2a and conductor pattern Me2b respectively. The insulating film 5a corresponds to the insulating film 5 employed in the first embodiment. In the present embodiment, such a circuit configuration as formed by the capacitive elements C1 through C4 formed by the conductor patterns PS1a, PS1b, PS2a and PS2b and the insulating film 5a is similar to the circuit configuration according to the first embodiment configured by the capacitive elements C1 through C4 formed by the conductor patterns Me1a, Me1b, Me2a and Me2b and the insulating film 5. The present circuit configuration is represented as shown in FIG. 7.

That is, while the lower electrodes E1b and E2b of the capacitive elements C1 and C2 are formed by their corresponding conductor patterns PSa and PSb even in the present embodiment, the upper electrodes E1a and E2a of the capacitive elements C1 and C2 are both formed by the conductor pattern PS2a and electrically coupled to each other through the corresponding conductor (conductor pattern PS2a in the present embodiment). The conductor pattern PS2a is brought to the floating potential. Therefore, the capacitive elements C1 and C2 are coupled in series. The lower electrodes E3b and E4b of the capacitive elements C3 and C4 are respectively formed by the conductor patterns PS1a and PS1b, whereas the upper electrodes E3a and E4a of the capacitive elements C3 and C4 are both formed by the conductor pattern PS2b and electrically coupled to each other through the corresponding conductor (conductor pattern PS2b in the present embodiment). The conductor pattern PS2b is brought to the floating potential. Therefore, the capacitive elements C3 and C4 are coupled in series. The lower electrodes E1b and E3b of the capacitive elements C1 and C3 are both formed by the conductor pattern PS1a and electrically coupled to each other through the corresponding conductor (conductor pattern PS1a in the present embodiment). The lower electrodes E2b and E4b of the capacitive elements C2 and C4 are both formed by the conductor pattern PS1b and electrically coupled to each other through the corresponding conductor (conductor pattern PS1a in the present embodiment). The conductor pattern PS1a that forms the lower electrodes E1b and E3b of the capacitive elements C1 and C3 is coupled to the potential V1, and the conductor pattern PS1b that forms the lower electrodes E2b and E4b of the capacitive elements C2 and C4 is coupled to the potential V2. The upper electrodes E1a and E2a of the capacitive elements C1 and C2 are not coupled to the upper electrodes E3a and E4a of the capacitive elements C3 and C4 by the conductors (no dc current flows). The lower electrodes E1b and E3b of the capacitive elements C1 and C3 are not coupled to the lower electrodes E2b and E4b of the capacitive elements C2 and C4 by the conductors (no dc current flows). Therefore, there is shown the state of FIG. 7 wherein the capacitive element C1 and the capacitive element C2 are coupled in series between the potentials V1 and V2, the capacitive element C3 and the capacitive element C4 are coupled in series between the potentials V1 and V2, and a series circuit of the capacitive elements C1 and C2 and a series circuit of the capacitive elements C3 and C4 are coupled in parallel between the potentials V1 and V2.

In a manner similar to the first embodiment even in the present embodiment, such a circuit configuration as shown in FIG. 7 is realized to make it possible to greatly enhance the reliability of the circuit with the capacitive elements interposed between the potentials V1 and V2 as described in the first embodiment. It is thus possible to enhance the reliability of the semiconductor device.

Even in the present embodiment, the number of conductor layers required to form the capacitive elements C1 through C4 can be reduced in a manner similar to the first embodiment. Namely, the lower electrodes E1$b$, E2$b$, E3$b$ and E4$b$ of the capacitive elements C1, C2, C3 and C4 are respectively formed by a conductor layer (silicon layer that forms the conductor layers PS1$a$ and PS1$b$ in the present embodiment) of the same layer formed in the same process step. The upper electrodes E1$a$, E2$a$, E3$a$ and E4$a$ of the capacitive elements C1, C2, C3 and C4 are respectively formed by a conductor layer (silicon layer that forms the conductor patterns PS2$a$ and PS2$b$ in the present embodiment) of the same layer formed in the same process step. Thus, the number of the necessary conductor layers (silicon layers in the present embodiment) needs to be few. For instance, the two layers corresponding to the layer (conductor layer) for the conductor patterns PS1$a$ and PS1$b$ and the layer (conductor layer) for the conductor patterns PS2$a$ and PS2$b$ are merely needed. Thus, the number of the conductor layers (silicon layers in the present embodiment) used in the capacitive elements C1 through C4 can be reduced. Therefore, such a circuit as shown in FIG. 7 can be realized by the PIP type capacitive elements C1 through C4 while an increase in the number of the conductor layers (silicon layers) formed over the semiconductor substrate 1 is being suppressed, and the manufacturing cost of the semiconductor device can be suppressed. Thus, an improvement in reliability of the semiconductor device and a reduction in the manufacturing cost thereof can be made compatible.

In the present embodiment, the number of the conductor layers necessary to form the capacitive elements C1 through C4 can be reduced as compared with the case where the capacitive elements are stacked vertically, and the number of the conductor layers formed over the semiconductor substrate 1 can be reduced (to the two layers in the present embodiment). It is thus possible to thin the thickness of the insulating film 12. Therefore, the aspect ratio of each contact hole 13 can be reduced and the contact hole 13 can be formed more accurately. Thus, the reliability of electrical coupling between other elements (not shown) like MISFETs and the plugs 14 can also be enhanced as well as the reliability of electrical coupling between the plugs 14$a$ and 14$b$ and the conductor patterns PS1$a$ and PS1$b$. Further, the reliability of the semiconductor device can be more enhanced.

Although the present embodiment has also described the case where the series circuits each comprised of the two capacitive elements are coupled two in parallel between the potentials V1 and V2, the number of series circuits coupled in parallel may be two or more (i.e., plural), but is not limited to two. Even in the present embodiment in a manner similar to the case described with reference to FIGS. 10 and 11 in the first embodiment, the series circuits each comprised of the two capacitive elements can be coupled n (where n: integer greater than or equal to 3) in parallel between the potentials V1 and V2.

A physical or positional relationship between the conductor patterns PS1$a$ and PS1$b$ and the conductor patterns PS2$a$ and PS2$b$ shown in FIGS. 14 through 19 can also be turned upside down even in the present embodiment in a manner similar to the case described with reference to FIG. 9 in the first embodiment. Turning the relationship upside down in the present embodiment however corresponds to the fact that while the physical relationship between the conductor patterns PS1$a$ and PS1$b$ and the conductor patterns PS2$a$ and PS2$b$ shown in FIGS. 14 through 19 is being maintained, the conductor patterns PS1$a$ and PS1$b$ on the lower layer side are set to the floating potential, the conductor pattern PS2$a$ on the upper layer side is coupled to the potential V1, and the conductor pattern PS2$b$ on the upper layer side is coupled to the potential V2. This case results in a circuit configuration in which the capacitive elements C2 and C3 are interchanged in the circuit diagram of FIG. 7.

In the present embodiment, however, the coupling of the conductor patterns PS1$a$ and PS1$b$ on the lower layer side to the potentials V1 and V2 and the setting of the conductor patterns PS2$a$ and PS2$b$ on the upper layer side to the floating potential as shown in FIGS. 14 through 19 are more preferable to the setting of the conductor patterns PS1$a$ and PS1$b$ on the lower layer side to the floating potential and the coupling of the conductor patterns PS2$a$ and PS2$b$ on the upper layer side to the potentials V1 and V2. This reason is as follows:

Of the conductor patterns PS1$a$ and PS1$b$ and the conductor patterns PS2$a$ and PS2$b$, those coupled to the potentials V1 and V2 need to form the contact holes 13$a$ and 13$b$ thereabove, whereas those set to the floating potential need not to form the contact holes 13 thereabove. Upon dry etching for opening or defining the contact holes 13$a$ and 13$b$, the contact hole 13 is opened over a source-drain region (not shown) of each MISFET. In order to form the contact hole 13 over the source-drain region, there is a need to etch the whole thickness of the insulating film 12 and thereby expose the source-drain region at the bottom of the contact hole 13. Therefore, when etching time is set to make it possible to open the contact hole 13 lying over the source-drain region definitely, the conductor patterns are overetched at the bottoms of the contact holes 13$a$ and 13$b$. Where the contact holes 13$a$ and 13$b$ are formed over the conductor patterns PS1$a$ and PS1$b$ on the lower layer side as shown in FIGS. 14 through 19 as compared with the case where the contact holes 13$a$ and 13$b$ are formed over the conductor patterns PS2$a$ and PS2$b$ on the upper layer side, the amounts of overetching of the conductor patterns at the bottoms of the contact holes 13$a$ and 13$b$ are reduced upon opening each contact hole 13.

It is therefore more preferable to couple the conductor patterns PS1$a$ and PS1$b$ on the lower layer side to the potentials V1 and V2 and bring the conductor patterns PS2$a$ and PS2$b$ on the upper layer side to the floating potential as shown in FIGS. 14 through 19. Thus, when dry etching for opening each contact hole 13 is executed, the amounts of overetching of the conductor patterns at the bottoms of the contact holes 13$a$ and 13$b$ can be reduced.

In the present embodiment, the conductor patterns PS1$a$ and PS2$a$ have been formed over the device isolation area 11 formed in the semiconductor substrate 1, that is, the PIP type capacitive elements C1 through C4 have been formed over the device isolation area 11. Even in the present embodiment, however, the conductor patterns PS1$a$ and PS2$a$ can also be formed over the interlayer insulating film (the insulating film 3, for example) formed over the semiconductor substrate 1 as in the first embodiment. Even in the present embodiment in this case, the PIP type capacitive elements C1 through C4 are formed over the insulating film 3 as in the case where the MIM type capacitive elements C1 through C4 are formed over the insulating film 3 in the first embodiment. Other elements can be formed in the area (the device area 2) located below the PIP type capacitive elements C1 through C4.

Figure 20:
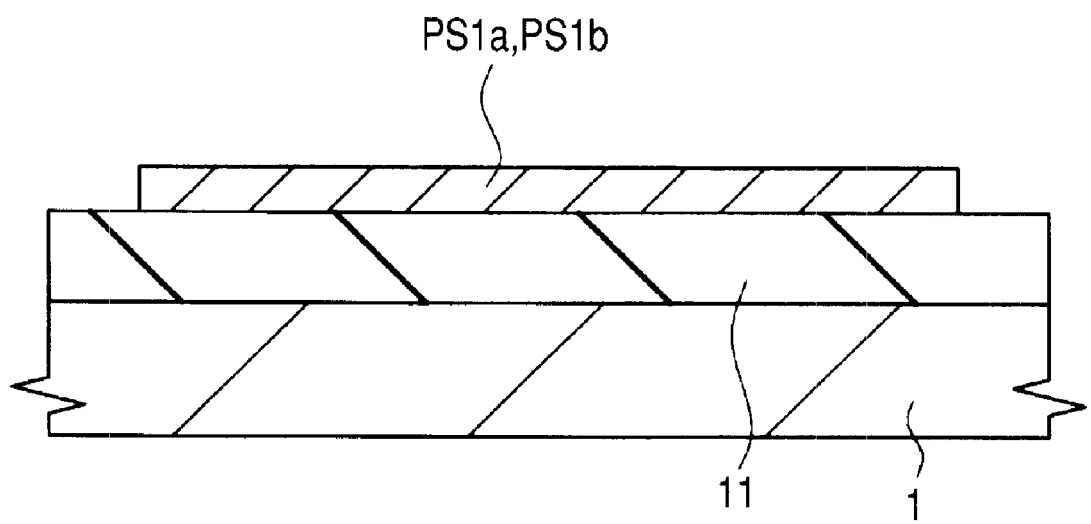
FIG. 20 is a fragmentary sectional view in a manufacturing process of the semiconductor device according to the second embodiment of the present invention.
Figure 21:
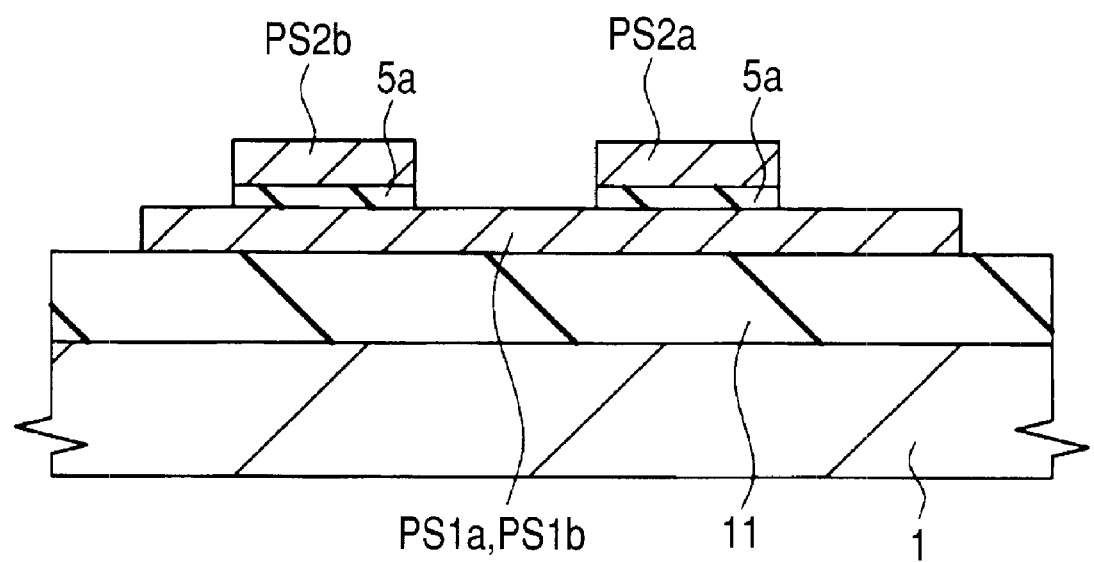
FIG. 21 is a fragmentary sectional view in the manufacturing process of the semiconductor device, following FIG. 20.
Figure 22:
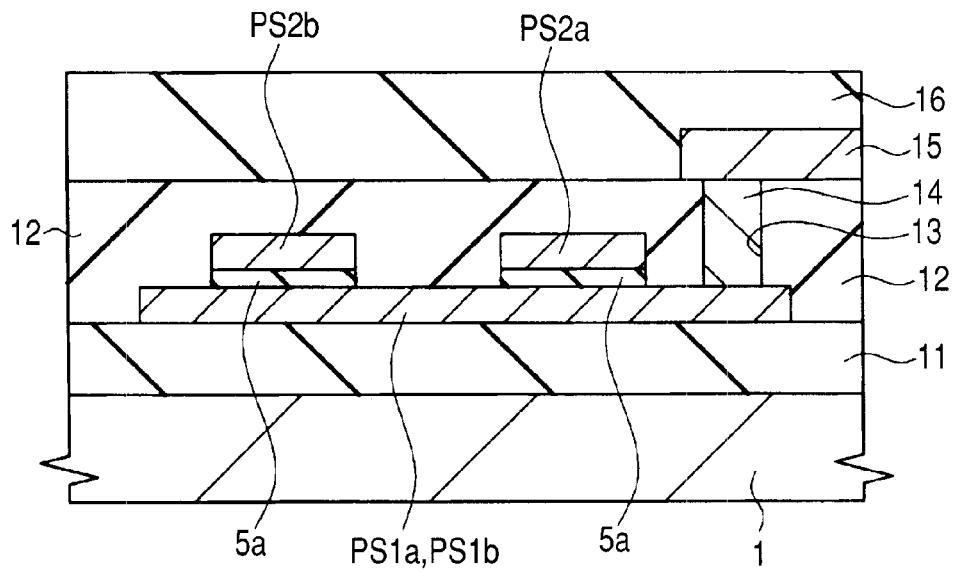
FIG. 22 is a fragmentary sectional view in the manufacturing process of the semiconductor device, following FIG. 21.

One example of a method for manufacturing the semiconductor device according to the present embodiment will next be described. FIGS. 20 through 22 are respectively fragmentary sectional views in a manufacturing process of the semiconductor device according to the present embodiment and show an area corresponding to FIG. 16 or 17.

As shown in FIG. 20, a device isolation region or area 11 is formed over a semiconductor substrate 1 by, for example, an STI (Shallow Trench Isolation) method or an LOCOS (Local Oxidization of Silicon) method or the like.

Next, a conductor film like, for example, a polycrystalline silicon film (doped polysilicon film) of low resistivity with an impurity implanted therein is formed over the entire principal or main surface of the semiconductor substrate 1. The conductor film is patterned using a photolithography method and a dry etching method to form conductor patterns PS1a and PS1b. The conductor patterns PS1a and PS1b are formed over the device isolation area 11.

Next, an insulating film 5a and conductor patterns PS2a and PS2b are formed as shown in FIG. 21. For example, a laminated film of insulating film for the insulating film 5a comprised of silicon oxide or silicon nitride or the like and polycrystalline silicon film (doped polysilicon film) for the conductor patterns PS2a and PS2b is formed over the main surface of the semiconductor substrate 1 so as to cover the conductor patterns PS1a and PS1b. This laminated film is patterned using the photolithography method and the dry etching method to form laminated film patterns comprised of the insulating film 5a and the conductor patterns PS2a and PS2b.

As another form, an insulating film (oxide film) for the insulting film 5a is formed over the surfaces of the conductor patterns PS1a and PS1b each comprised of a polycrystalline silicon film by a thermal oxidation method or the like. Thereafter, a polycrystalline silicon film (doped polysilicon film) for the conductor patterns PS2a and PS2b is formed and patterned, whereby the insulating film 5a and the conductor patterns PS2a and PS2b can also be formed. Since the insulating film 5a is formed over the conductor patterns PS1a and PS1b in this case, the insulating film 5a is being interposed between the conductor patterns PS1a and PS1b and the conductor patterns PS2a and PS2b. However, the insulating film 5a is not formed underneath the conductor patterns PS2a and PS2b in areas in which the conductor patterns PS1a and PS1b do not exist below the conductor patterns PS2a and PS2b.

A metal silicide layer (not shown) can also be formed above the conductor patterns PS1a and PS1b by a salicide process or the like. If the metal silicide layer is formed, then the contact resistance or the like between each of the conductor patterns PS1a and PS1b and each of plugs 14a and 14b to be formed later can be reduced.

Next, as shown in FIG. 22, an insulating film (interlayer insulating film) 12 is formed over the semiconductor substrate 1 so as to cover the conductor patterns PS1a and PS1b, the insulating film 5a and the conductor patterns PS2a and PS2b. Contact holes 13 are formed in the insulating film 12 and plugs 14 are embedded into the contact holes 13.

Next, a wiring 15 is formed over the insulating film 12 with each plug 14 embedded therein. The wiring 15 can be formed by, for example, forming a conductor film such as a tungsten film or the like over the insulating film 12 with the plugs 14 embedded therein and patterning the conductor film by using the photolithography method and the dry etching method.

Next, an insulating film 16 is formed over the insulting film 12 so as to cover each wiring 15. Thereafter, an upper wiring layer and an insulating film are further formed. However, their illustrations and explanations are omitted herein.

Third Preferred Embodiment

A semiconductor device according to the present embodiment is also of a semiconductor device having capacitive elements.

Figure 23:
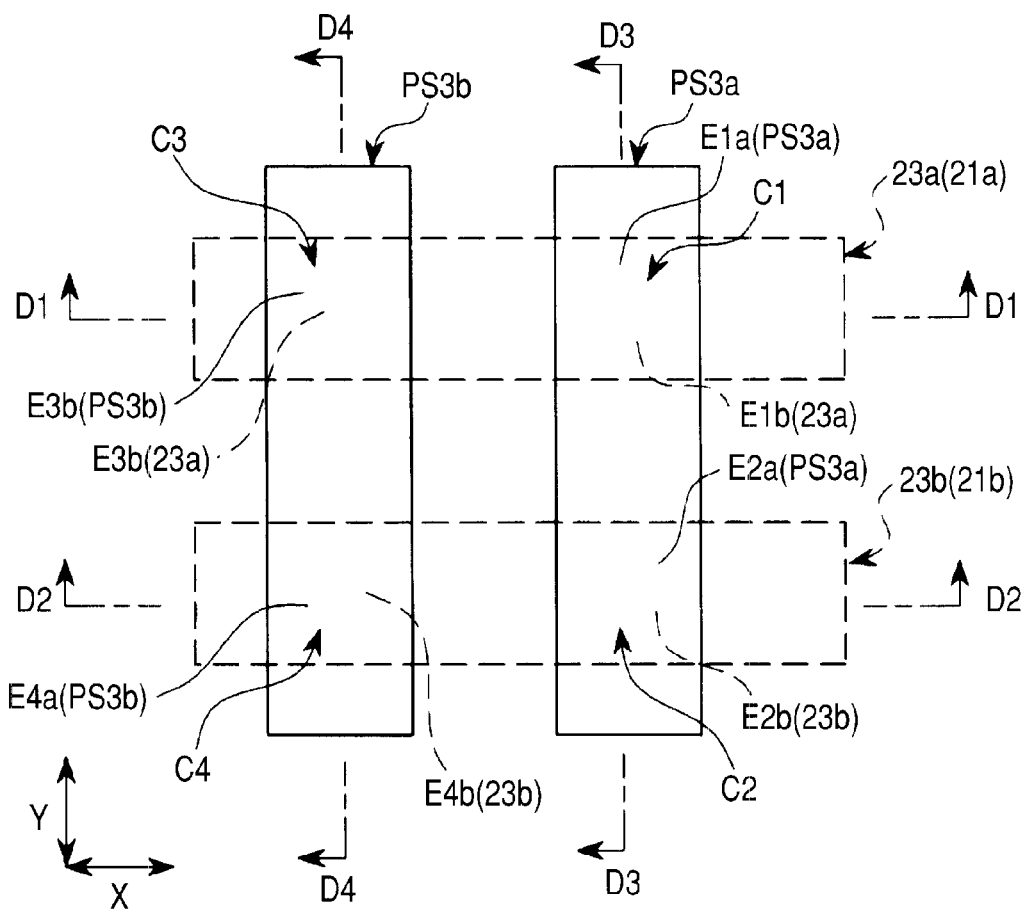
FIG. 23 is a fragmentary plan view of a semiconductor device according to a third embodiment of the present invention.
Figure 24:
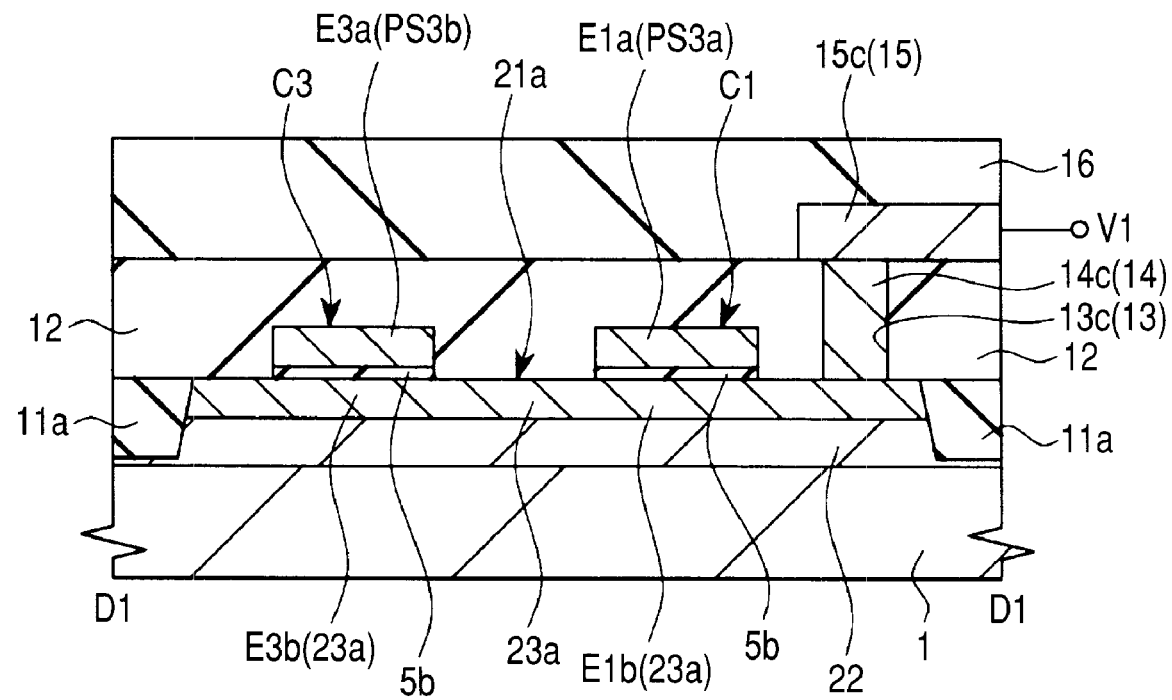
FIG. 24 is a fragmentary sectional view of the semiconductor device according to the third embodiment of the present invention.
Figure 25:
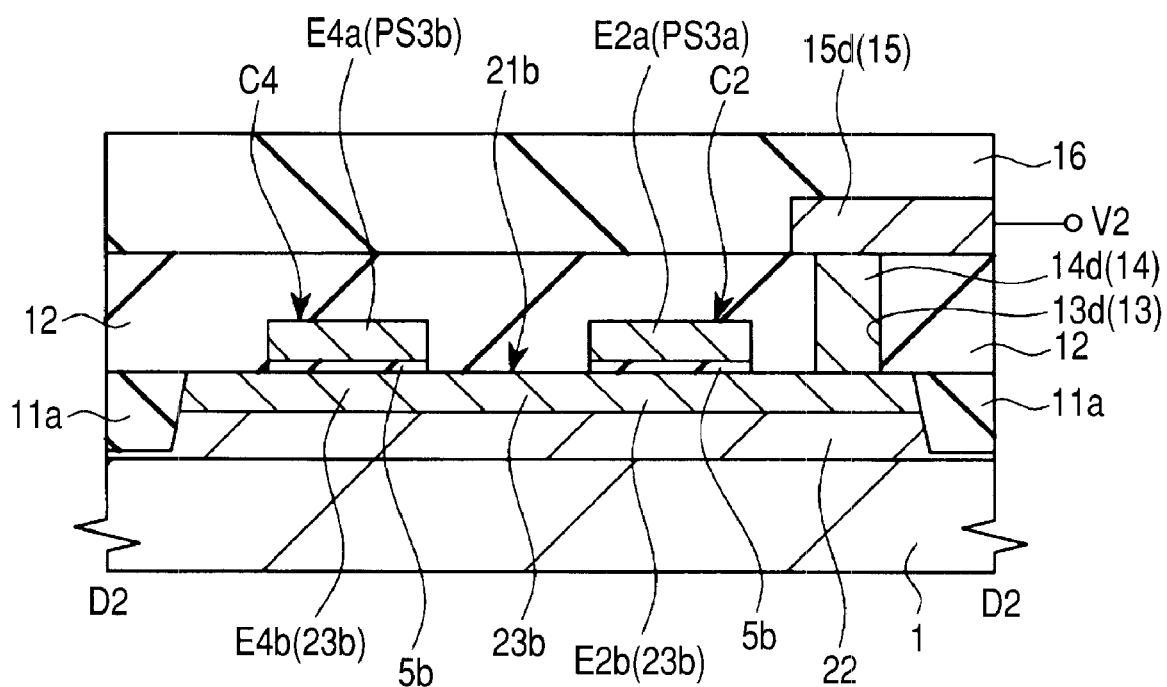
FIG. 25 is a fragmentary sectional view of the semiconductor device according to the third embodiment of the present invention.
Figure 26:
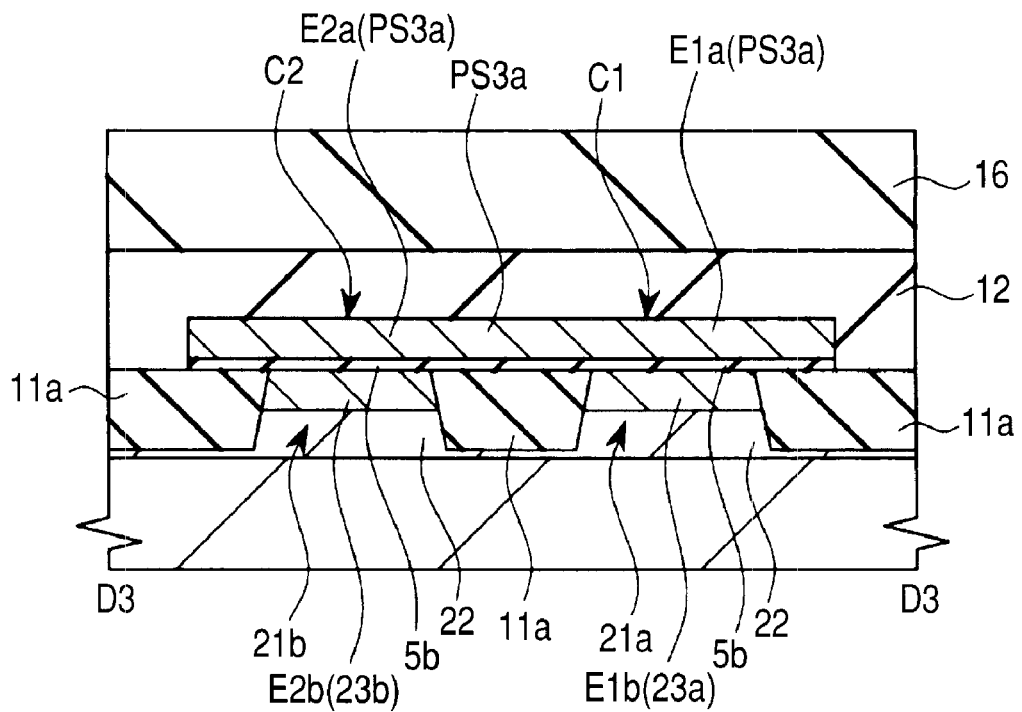
FIG. 26 is a fragmentary sectional view of the semiconductor device according to the third embodiment of the present invention.
Figure 27:
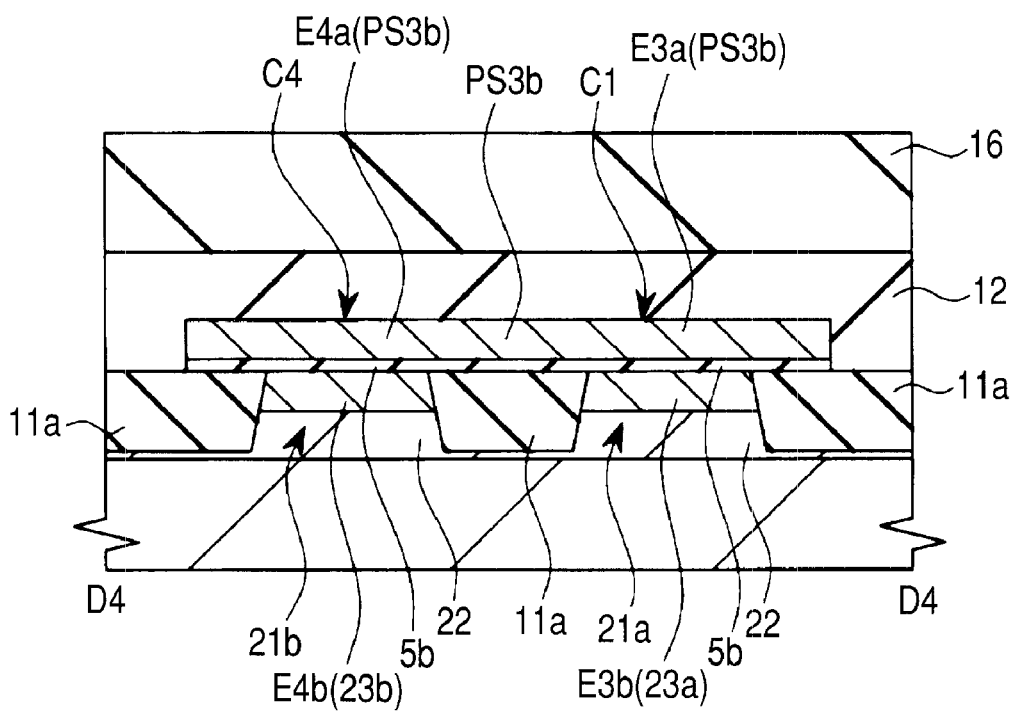
FIG. 27 is a fragmentary sectional view of the semiconductor device according to the third embodiment of the present invention.

FIG. 23 is a fragmentary plane view of the semiconductor device according to the present embodiment. FIGS. 24 through 27 are respectively fragmentary sectional views thereof and correspond to FIGS. 2 through 6 of the first embodiment and FIGS. 15 through 19 of the second embodiment. A sectional view taken along line D1-D1 of FIG. 23 corresponds to FIG. 24, a sectional view taken along D2-D2 of FIG. 23 corresponds to FIG. 25, a sectional view taken along D3-D3 of FIG. 23 corresponds to FIG. 26, and a sectional view taken along D4-D4 of FIG. 23 corresponds to FIG. 27, respectively. Only the plane layouts of conductor patterns PS3a and PS3b and n-type semiconductor regions 23a and 23b are shown in FIG. 23, and configurations other than the above are not illustrated. In FIG. 23, the plane layouts of the conductor patterns PS3a and PS3b are respectively indicated by solid lines, and the plane layouts of the n-type semiconductor regions 23a and 23b are respectively indicated by dotted lines. Since a circuit diagram is identical to FIG. 7 of the first embodiment, its illustration is omitted herein.

The semiconductor device according to the present embodiment is also of a semiconductor device having capacitive elements C1 through C4 disposed over a semiconductor substrate 1 in a manner similar to the semiconductor devices according to the first and embodiments. In the first embodiment, however, the capacitive elements C1 through C4 are configured as the MIN type capacitive elements, and the capacitive elements C1 through C4 are configured as the PIP type capacitive elements in the second embodiment. On the other hand, in the present embodiment, the capacitive elements C1 through C4 are configured by so-called MOS type capacitive elements.

A device isolation region or area 11a is formed over a principal or main surface of the semiconductor substrate 1 that forms the semiconductor device of the present embodiment shown in FIGS. 23 through 27. The device isolation area 11a is comprised of an insulator (e.g., silicon oxide) or the like embedded in each device isolation trench in a manner similar to the device isolation area 11. Active regions 21a and 21b are defined by the device isolation area 11a. Namely, the active regions 21a and 21b are respectively of regions surrounded by the device isolation area 11a on a plane basis. No dc current flows with respect to each other by the device isolation area 11a.

A p-type well 22 is formed in each of the active regions 21a and 21b, and n-type semiconductor regions 23a and 23b each corresponding to an impurity diffusion layer are formed at surface layer portions of the p-type wells 22. Namely, the n-type semiconductor region (impurity diffusion layer) 23a is formed at a surface layer portion of the active region 21a (p-type well 22 thereof), and the n-type semiconductor region (impurity diffusion layer) 23b is formed at a surface layer portion of the active region 21b (p-type well 22 thereof). Since the impurity diffusion layer can also be assumed to be a conductor layer, the n-type semiconductor region 23a and the n-type semiconductor region 23b are comprised of a conductor layer (first conductor layer: impurity diffusion layer in the present embodiment) of the same layer and formed in the same process step. Since the device isolation area 11a is interposed between the n-type semiconductor region 23a and the n-type semiconductor region 23b, the n-type semiconductor region 23a and the n-type semiconductor region 23b are respectively placed in a state of being not coupled to each other by a conductor (i.e., no dc current flows). Since the peripheries of the n-type semiconductor region (first conductor pattern) 23a and the n-type semiconductor region (second conductor pattern) 23b are surrounded by the device isolation area 11a, they can be assumed to be conductor patterns.

An insulating film 5b comprised of, for example, a thin silicon oxide film or the like is formed over the main surface (i.e., the upper surfaces of the n-type semiconductor regions 23a and 23b) of the semiconductor substrate 1.

The conductor patterns PS3a and PS3b are formed over the main surface of the semiconductor substrate 1. The conductor pattern (third conductor pattern) PS3a and the conductor pattern (fourth conductor pattern) PS3b are comprised of a conductor layer (second conductor layer: silicon layer in the present embodiment) of the same layer and formed in the same process step. The conductor pattern PS3a and the conductor pattern PS3b are not coupled to each other through a conductor (that is, no dc current flows). The conductor patterns PS3a and PS3b are comprised of patterned conductor films (conductor layers). Preferably, they are comprised of a silicon layer (silicon film, patterned silicon films) like a polycrystalline silicon film (doped polysilicon film). When the silicon layer is used, they are implanted with an impurity so as to be set to low resistivity.

The conductor pattern PS3a extends so as to intersect with both the n-type semiconductor region 23a and the n-type semiconductor region 23b. The conductor pattern PS3b also extends so as to intersect with both of the n-type semiconductor region 23a and the n-type semiconductor region 23b. For example, the n-type semiconductor regions 23a and 23b extend in an X direction of FIG. 23, whereas the conductor patterns PS3a and PS3b extend in a Y direction of FIG. 23. Here, the X and Y directions respectively indicate the directions intersecting with each other (more preferably orthogonal to each other).

An insulating film 5b is formed at the upper surfaces of the n-type semiconductor regions 23a and 23b. The conductor patterns PS3a and PS3b extend over the insulating film 5b. Therefore, the insulating film 5b used as a capacitive insulating film is interposed between the conductor patterns PS3a and PS3b and the n-type semiconductor regions 23a and 23b in areas where the conductor patterns PS3a and PS3b and the n-type semiconductor regions 23a and 23b intersect, respectively. Thus, the capacitive elements C1, C2, C3 and C4 are formed in the areas where the conductor patterns PS3a and PS3b and the n-type semiconductor regions 23a and 23b intersect respectively.

Namely, in the area where the conductor pattern PS3a and the n-type semiconductor region 23a intersect, the conductor pattern PS3a lying in the area assumes an upper electrode E1a of the capacitive element C1, the n-type semiconductor region 23a lying in the area assumes a lower electrode E1b of the capacitive element C1, and the insulating film 5b between the upper electrode E1a and the lower electrode E1b assumes the capacitive insulating film of the capacitive element C1, whereby the capacitive element C1 is formed. In the area where the conductor pattern PS3a and the n-type semiconductor region 23b intersect, the conductor pattern PS3a lying in the area assumes an upper electrode E2a of the capacitive element C2, the n-type semiconductor region 23b lying in the area assumes a lower electrode E2b of the capacitive element C2, and the insulating film 5b between the upper electrode E2a and the lower electrode E2b assumes the capacitive insulating film of the capacitive element C2, whereby the capacitive element C2 is formed. In the area where the conductor pattern PS3b and the n-type semiconductor region 23a intersect, the conductor pattern PS3b lying in the area assumes an upper electrode E3a of the capacitive element C3, the n-type semiconductor region 23a lying in the area assumes a lower electrode E3b of the capacitive element C3, and the insulating film 5b between the upper electrode E3a and the lower electrode E3b assumes the capacitive insulating film of the capacitive element C3, whereby the capacitive element C3 is formed. In the area where the conductor pattern PS3b and the n-type semiconductor region 23b intersect, the conductor pattern PS3b lying in the area assumes an upper electrode E4a of the capacitive element C4, the n-type semiconductor region 23b lying in the area assumes a lower electrode E4b of the capacitive element C4, and the insulating film 5b between the upper electrode E4a and the lower electrode E4b assumes the capacitive insulating film of the capacitive element C4, whereby the capacitive element C4 is formed. Thus, the capacitive elements C1 through C4 are of the so-called MOS (Metal Oxide Semiconductor) type capacitive elements respectively.

Each of the MOS type capacitive elements is equivalent to one in which a channel region, a gate insulating film and a gate electrode of each MISFET (Metal Insulator Semiconductor Field Effect Transistor) are respectively configured as the lower electrode, capacitive insulating film and upper electrode of each MOS type capacitive element. High-concentration impurity diffusion layers (n-type semiconductor regions 23a and 23b in the present embodiment) are provided at portions each corresponding to the channel region and configured as the lower electrodes. Incidentally, even when the capacitive elements are referred to as MOS type capacitive elements, the capacitive insulating film (insulating film 5b in the present embodiment) is not limited to an oxide film, and an insulating film other than the oxide film can also be used for the capacitive insulating film (insulating film 5b in the present embodiment). Thus, the MOS type capacitive elements can be assumed to be capacitive elements wherein parts (n-type semiconductor regions 23a and 23b formed by implanting an impurity in the semiconductor substrate 1 in the present embodiment) are configured as lower electrodes, and conductor layers (conductor patterns PS3a and PS3b in the present embodiment) formed over the semiconductor substrate 1 (on the n-type semiconductor regions 23a and 23b) via the insulating film (insulating film 5b in the present embodiment) interposed therebetween are configured as upper electrodes.

An insulating film (interlayer insulating film) 12 is formed over the semiconductor substrate 1 so as to cover the conductor patterns PS3a and PS3b. Contact holes (openings, through holes) 13 are formed in the insulating film 12, and plugs 14 each comprised of a conductor are embedded in their corresponding contact holes 13. The contact hole 13c of the contact holes 13 is formed above the n-type semiconductor region 23a, and part of the n-type semiconductor region 23a is exposed at its bottom. The contact hole 13d of the contact holes 13 is formed above the n-type semiconductor region 23b, and part of the n-type semiconductor region 23b is exposed at its bottom. The plug 14c of the plugs 14 is embedded in the contact hole 13c and the plug 14d of the plugs 14 is embedded in the contact hole 13d. The plug 14c is electrically coupled to the n-type semiconductor region 23a in contact therewith at its bottom, and the plug 14d is electrically coupled to the n-type semiconductor region 23b in contact therewith at its bottom. Wirings 15 are formed over the insulating film 12 with the plugs 14 embedded therein, and an insulating film 16 is formed over the insulating film 12 so as to cover the wirings 15. The n-type semiconductor region 23a is electrically coupled to its corresponding wiring 15c of the wirings 15 via the plug 14c. The n-type semiconductor region 23b is electrically coupled to its corresponding wiring 15d of the wirings 15 via the plug 14d.

The n-type semiconductor region 23a is coupled to its corresponding potential V1 via the plug 14c and the wiring 15c or the like. The n-type semiconductor region 23b is coupled to its corresponding potential V2 via the plug 14d and the wiring 15d or the like. The conductor patterns PS3a and PS3b are respectively brought to a floating potential. The potentials V1 and V2 are of potentials different from each other.

The n-type semiconductor region 23a, n-type semiconductor region 23b, conductor pattern PS3a and conductor pattern PS3b employed in the present embodiment correspond to the conductor pattern Me1a, conductor pattern Me1b, conductor pattern Me2a and conductor pattern Me2b respectively. They respectively correspond to the conductor pattern PS1a, conductor pattern PS1b, conductor pattern PS2a and conductor pattern PS2b employed in the second embodiment. The insulating film 5b of the present embodiment corresponds to the insulating film 5 employed in the first embodiment and corresponds to the insulating film 5a of the second embodiment. In the present embodiment, such a circuit configuration as formed by the capacitive elements C1 through C4 formed by the n-type semiconductor regions 23a and 23b, the conductor patterns PS3a and PS3b and the insulating film 5b is similar to the circuit configuration according to the first embodiment configured by the capacitive elements C1 through C4 formed by the conductor patterns Me1a, Me1b, Me2a and Me2b and the insulating film 5. The present circuit configuration is represented as shown in FIG. 7.

That is, while the lower electrodes E1b and E2b of the capacitive elements C1 and C2 are formed by their corresponding n-type semiconductor regions 23a and 23b even in the present embodiment, the upper electrodes E1a and E2a of the capacitive elements C1 and C2 are both formed by the conductor pattern PS3a and electrically coupled to each other through the corresponding conductor (conductor pattern PS3a in the present embodiment). The conductor pattern PS3a is brought to the floating potential. Therefore, the capacitive elements C1 and C2 are coupled in series. The lower electrodes E3b and E4b of the capacitive elements C3 and C4 are respectively formed by the n-type semiconductor regions 23a and 23b, whereas the upper electrodes E3a and E4a of the capacitive elements C3 and C4 are both formed by the conductor pattern PS3b and electrically coupled to each other through the corresponding conductor (conductor pattern PS3b in the present embodiment). The conductor pattern PS3b is brought to the floating potential. Therefore, the capacitive elements C3 and C4 are coupled in series. The lower electrodes E1b and E3b of the capacitive elements C1 and C3 are both formed by the n-type semiconductor region 23a and electrically coupled to each other through the corresponding conductor (n-type semiconductor region 23a in the present embodiment). The lower electrodes E2b and E4b of the capacitive elements C2 and C4 are both formed by the n-type semiconductor region 23b and electrically coupled to each other through the corresponding conductor (n-type semiconductor region 23b in the present embodiment). The n-type semiconductor region 23a that forms the lower electrodes E1b and E3b of the capacitive elements C1 and C3 is coupled to the potential V1, and the n-type semiconductor region 23b that forms the lower electrodes E2b and E4b of the capacitive elements C2 and C4 is coupled to the potential V2. The upper electrodes E1a and E2a of the capacitive elements C1 and C2 are not coupled to the upper electrodes E3a and E4a of the capacitive elements C3 and C4 by the conductors (no dc current flows). The lower electrodes E1b and E3b of the capacitive elements C1 and C3 are not coupled to the lower electrodes E2b and E4b of the capacitive elements C2 and C4 by the conductors (no dc current flows). Therefore, there is shown the above state of FIG. 7 wherein the capacitive element C1 and the capacitive element C2 are coupled in series between the potentials V1 and V2, the capacitive element C3 and the capacitive element C4 are coupled in series between the potentials V1 and V2, and the series circuit of the capacitive elements C1 and C2 and the series circuit of the capacitive elements C3 and C4 are coupled in parallel between the potentials V1 and V2.

In a manner similar to the first and second embodiments even in the present embodiment, such a circuit configuration as shown in FIG. 7 is realized to make it possible to significantly enhance the reliability of the circuit with the capacitive elements interposed between the potentials V1 and V2 as described in the first embodiment. It is thus possible to enhance the reliability of the semiconductor device.

Even in the present embodiment, the number of conductor layers required to form the capacitive elements C1 through C4 can be reduced in a manner similar to the first and second embodiments. Namely, the lower electrodes E1b, E2b, E3b and E4b of the capacitive elements C1, C2, C3 and C4 are respectively formed by a conductor layer (impurity diffusion layer that forms the n-type semiconductor regions 23a and 23b in the present embodiment) of the same layer formed in the same process step. The upper electrodes E1a, E2a, E3a and E4a of the capacitive elements C1, C2, C3 and C4 are respectively formed by a conductor layer (silicon layer that forms the conductor patterns PS3a and PS3b in the present embodiment) of the same layer formed in the same process step. Thus, the number of the necessary conductor layers needs to be few. For instance, the two layers corresponding to the impurity diffusion layer (conductor layer) for forming the n-type semiconductor regions 23a and 23b and the conductor layer for forming the conductor patterns PS3a and PS3b are merely needed. Thus, the number of the conductor layers used in the capacitive elements C1 through C4 can be reduced. Therefore, such a circuit as shown in FIG. 7 can be realized by the MOS type capacitive elements C1 through C4 while an increase in the number of the conductor layers formed over the semiconductor substrate is being suppressed, and the manufacturing cost of the semiconductor device can be suppressed. Accordingly, an improvement in the reliability of the semiconductor device and a reduction in the manufacturing cost thereof can be made compatible.

In the present embodiment, the number of the conductor layers necessary to form the capacitive elements C1 through C4 can be reduced as compared with the case where the capacitive elements are stacked vertically, and the number of the conductor layers formed over the semiconductor substrate 1 can be reduced (to one conductor layer that forms the conductor patterns PS3a and PS3b in the present embodiment). It is thus possible to thin the thickness of the insulating film 12. Therefore, the aspect ratio of each contact hole 13 can be reduced and the contact hole 13 can be formed more accurately. Thus, the reliability of electrical coupling between other elements (not shown) like MISFETs and the plugs 14 can also be enhanced as well as the reliability of electrical coupling between the plugs 14c and 14d and the n-type semiconductor regions 23a and 23b. Further, the reliability of the semiconductor device can be more enhanced.

Since the MOS type capacitive elements can be formed by thermally oxidizing the capacitive insulating film (insulating film 5b in the present embodiment), the capacitive insulating film (insulating film 5b) good in film quality can be formed. Since they are hard to cause interelectrode insulation leaks and an insulation breakdown, the reliability of each of the capacitive elements C1 through C4 can be enhanced. In the present embodiment, the reliability of the circuit with the capacitive elements interposed between the potentials V1 and V2 can be further enhanced by forming such a circuit configuration as shown in FIG. 7 using the MOS type capacitive elements C1 through C4 high in reliability.

Although the present embodiment has also described the case where the series circuits each comprised of the two capacitive elements are coupled two in parallel between the potentials V1 and V2, the number of series circuits coupled in parallel may be two or more (i.e., plural), but is not limited to two. Even in the present embodiment in a manner similar to the case described with reference to FIGS. 10 and 11 in the first embodiment, the series circuits each comprised of the two capacitive elements can be coupled n (where n: integer greater than or equal to 3) in parallel between the potentials V1 and V2.

In the present embodiment, the conductor layer on the lower layer side, of the first conductor layer that forms one electrodes (lower electrodes E1b, E2b, E3b and E4b in the present embodiment) of the capacitive elements C1, C2, C3 and C4, and the second conductor layer that forms the other electrodes (upper electrodes E1a, E2a, E3a and E4a in the present embodiment) of the capacitive elements C1, C2, C3 and C4 is formed by the impurity diffusion layer (corresponding to each of the n-type semiconductor regions 23a and 23b) formed in the semiconductor substrate 1.

A physical or positional relationship between the n-type semiconductor regions 23a and 23b and the conductor patterns PS3a and PS3b shown in FIGS. 23 through 27 can also be turned upside down even in the present embodiment in a manner similar to the case described with reference to FIG. 9 in the first embodiment. Turning the relationship upside down in the present embodiment however corresponds to the fact that while the physical relationship between the n-type semiconductor regions 23a and 23b and the conductor patterns PS3a and PS3b shown in FIGS. 23 through 27 is being maintained, the n-type semiconductor regions 23a and 23b on the lower layer side are set to the floating potential, the conductor pattern PS3a on the upper layer side is coupled to the potential V1, and the conductor pattern PS3b on the upper layer side is coupled to the potential V2. This case results in a circuit configuration in which the capacitive elements C2 and C3 are interchanged in FIG. 7.

In the present embodiment, however, the coupling of the n-type semiconductor regions 23a and 23b on the lower layer side to the potentials V1 and V2 and the setting of the conductor patterns PS3a and PS3b on the upper layer side to the floating potential as shown in FIGS. 23 through 27 are more preferable to the setting of the n-type semiconductor regions 23a and 23b on the lower layer side to the floating potential and the coupling of the conductor patterns PS3a and PS3b on the upper layer side to the potentials V1 and V2. This reason is as follows:

Of the n-type semiconductor regions 23a and 23b and the conductor patterns PS3a and PS3b, those coupled to the potentials V1 and V2 need to form the contact holes 13c and 13d thereabove, whereas those set to the floating potential need not to form the contact holes 13 thereabove. When etching time is set so as to make it possible to open each contact hole 13 even over the source-drain region definitely as described in the second embodiment, the amounts of overetching at the bottoms of the contact holes 13c and 13d are reduced where the contact holes 13c and 13d are formed over the n-type semiconductor regions 23a and 23b as compared with the case where the contact holes 13c and 13d are formed over the conductor patterns PS3a and PS3b. Therefore, as described above, the coupling of the n-type semiconductor regions 23a and 23b on the lower layer side to the potentials V1 and V2 and the setting of the conductor patterns PS3a and PS3b on the upper layer side to the floating potential are more preferable to the setting of the n-type semiconductor regions 23a and 23b on the lower layer side to the floating potential and the coupling of the conductor patterns PS3a and PS3b on the upper layer side to the potentials V1 and V2. Thus, the amounts of overetching at the bottoms of the contact holes 13c and 13d at the dry etching for opening the contact holes 13 can be reduced.

The p-type well 22 and the n-type semiconductor regions 23a and 23b can also be reversed in conductivity type. That is, an n-type well is formed in place of the p-type well 22, and p-type semiconductor regions can also be formed in place of the n-type semiconductor regions 23a and 23b.

Figure 28:
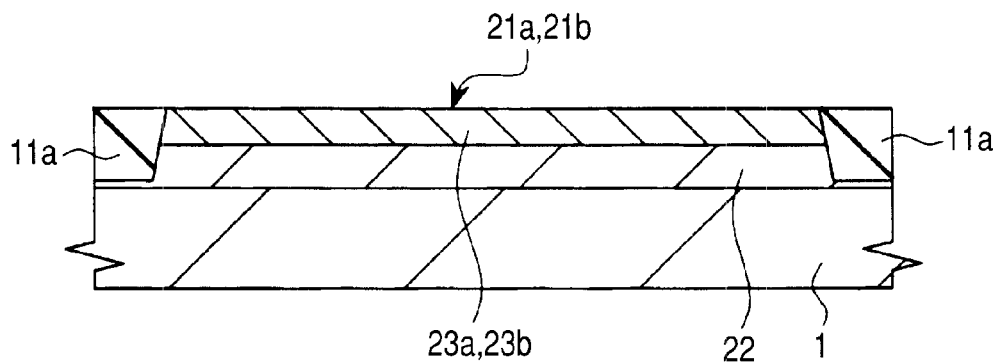
FIG. 28 is a fragmentary sectional view in a manufacturing process of the semiconductor device according to the third embodiment of the present invention.
Figure 29:
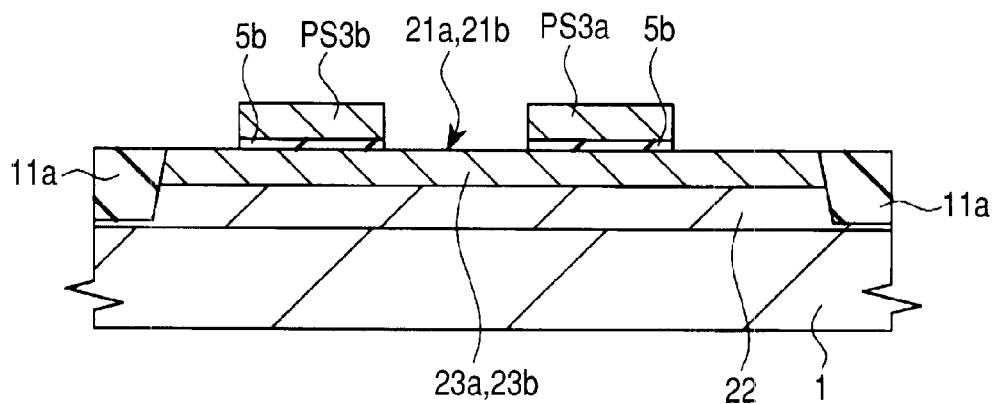
FIG. 29 is a fragmentary sectional view in the manufacturing process of the semiconductor device, following FIG. 20.
Figure 30:
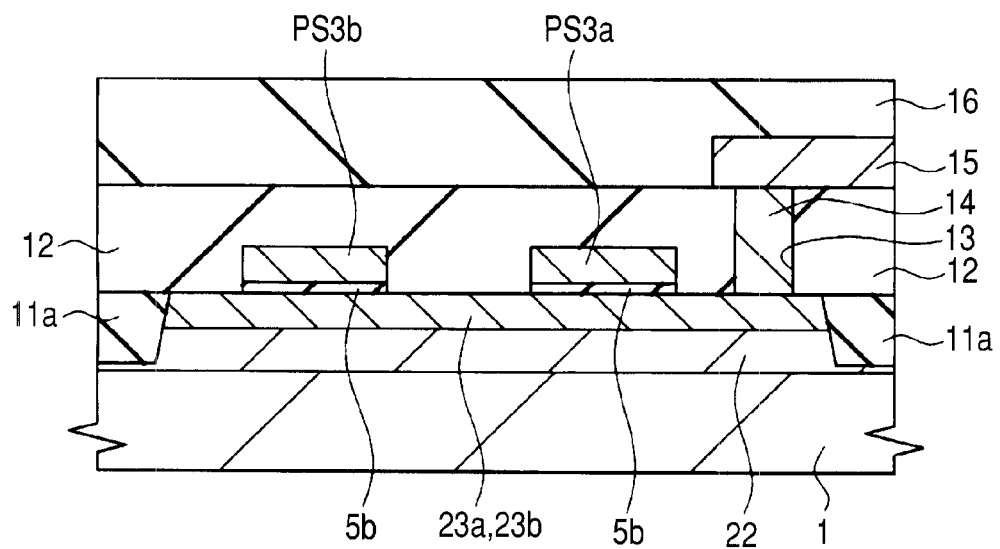
FIG. 30 is a fragmentary sectional view in the manufacturing process of the semiconductor device, following FIG. 21.

One example of a method for manufacturing the semiconductor device according to the present embodiment will next be described. FIGS. 28 through 30 are respectively fragmentary sectional views in a manufacturing process of the semiconductor device according to the present embodiment and show an area corresponding to FIG. 24 or 25.

As shown in FIG. 28, a device isolation region or area 11a is formed over a semiconductor substrate 1 by, for example, the STI method or LOCOS method or the like.

Next, a p-type well 22 is formed by, for example, implanting a p-type impurity into the semiconductor substrate 1.

Next, an n-type impurity such as phosphorus (P) or arsenic (As) is implanted in the semiconductor substrate 1 to form n-type semiconductor regions 23a and 23b.

Next, as shown in FIG. 29, the principal or main surface of the semiconductor substrate 1 is cleaned up as needed and thereafter an insulating film 5b is formed over the main surface (i.e., the upper surfaces of the n-type semiconductor regions 23a and 23b) by the thermal oxidation method or the like. When a gate insulating film for each MISFET is formed over the semiconductor substrate 1, the insulating film 5b can be formed together (simultaneously). In this case, the insulating film 5b comprises an insulating film of the same layer as the gate insulating film of each MISFET (not shown).

Next, a conductor film comprising a polycrystalline silicon film (doped polysilicon film) or the like is formed over the entire surface of the semiconductor substrate 1 and patterned using the photolithography method and the dry etching method, thereby forming conductor patterns P3a and P3b. When the conductor film for each of the conductor patterns P3a and P3b is patterned, a gate electrode comprised of each patterned conductor film can be formed in a predetermined area or region (not shown) for forming each MISFET. Accordingly, each of the conductor patterns P3a and P3b can be formed together (simultaneously) upon forming the gate electrode of each MISFET. In this case, the conductor patterns P3a and P3b comprise the conductor film of the same layer as the gate electrode of the MISFET.

When n-type semiconductor regions for source/drain are formed in regions lying on both sides of the gate electrode lying in the MISFET forming predetermined area by ion implantation, although not shown in the drawings, n-type semiconductor regions can also be formed even in active regions 21a and 21b lying in areas uncovered with the conductor patterns P3a and P3b.

Next, as shown in FIG. 30, an insulating film (interlayer insulating film) 12 is formed over the semiconductor substrate 1 so as to cover the conductor patterns PS3a and PS3b. Contact holes 13 are formed in the insulating film 12 and plugs 14 are embedded into the contact holes 13.

Next, a wiring 15 is formed over the insulating film 12 with each plug 14 embedded therein. The wiring 15 can be formed by, for example, forming a conductor film such as a tungsten film or the like over the insulating film 12 with the plugs 14 embedded therein and patterning the conductor film by using the photolithography method and the dry etching method.

Next, an insulating film 16 is formed over the insulting film 12 so as to cover each wiring 15. Thereafter, an upper wiring layer and an insulating film are further formed. However, their illustrations and explanations are omitted herein.

It is also possible to set the p-type well 22 to an n type and set the n-type semiconductor regions 23a and 23b to a p type.

Fourth Preferred Embodiment

The present embodiment corresponds to a semiconductor device in which such capacitive elements as described in the first embodiment are provided between a source or power wiring 33 and a ground wiring 32.

Figure 31:
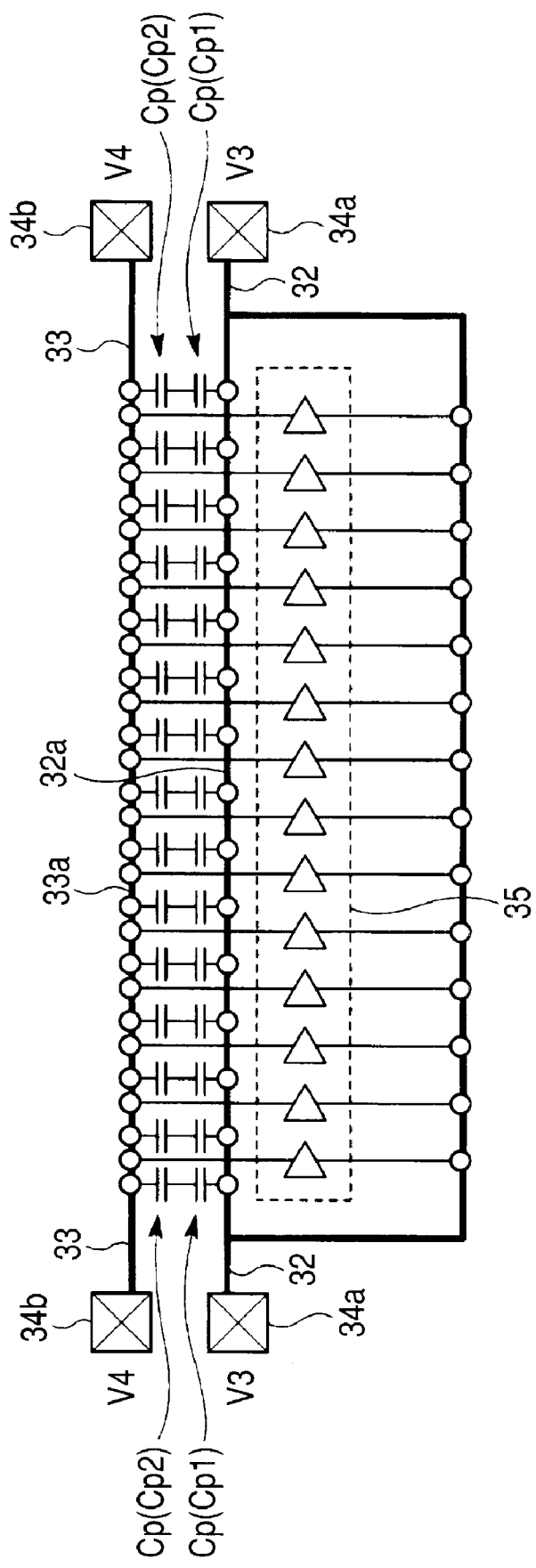
FIG. 31 is a fragmentary circuit diagram of a semiconductor device according to a fourth embodiment of the present invention.
Figure 32:
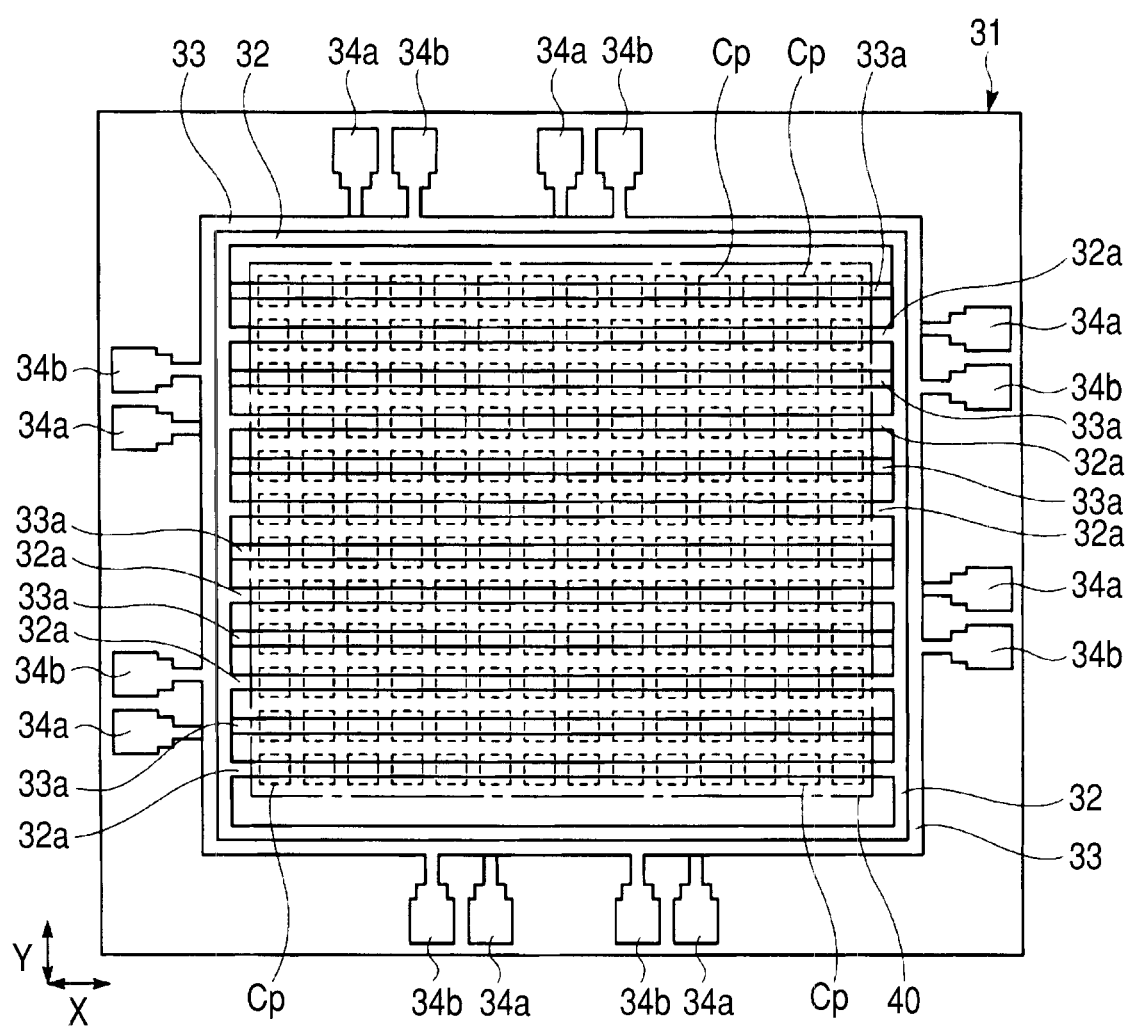
FIG. 32 is an overall plan view of the semiconductor device according to the fourth embodiment of the present invention.
Figure 33:
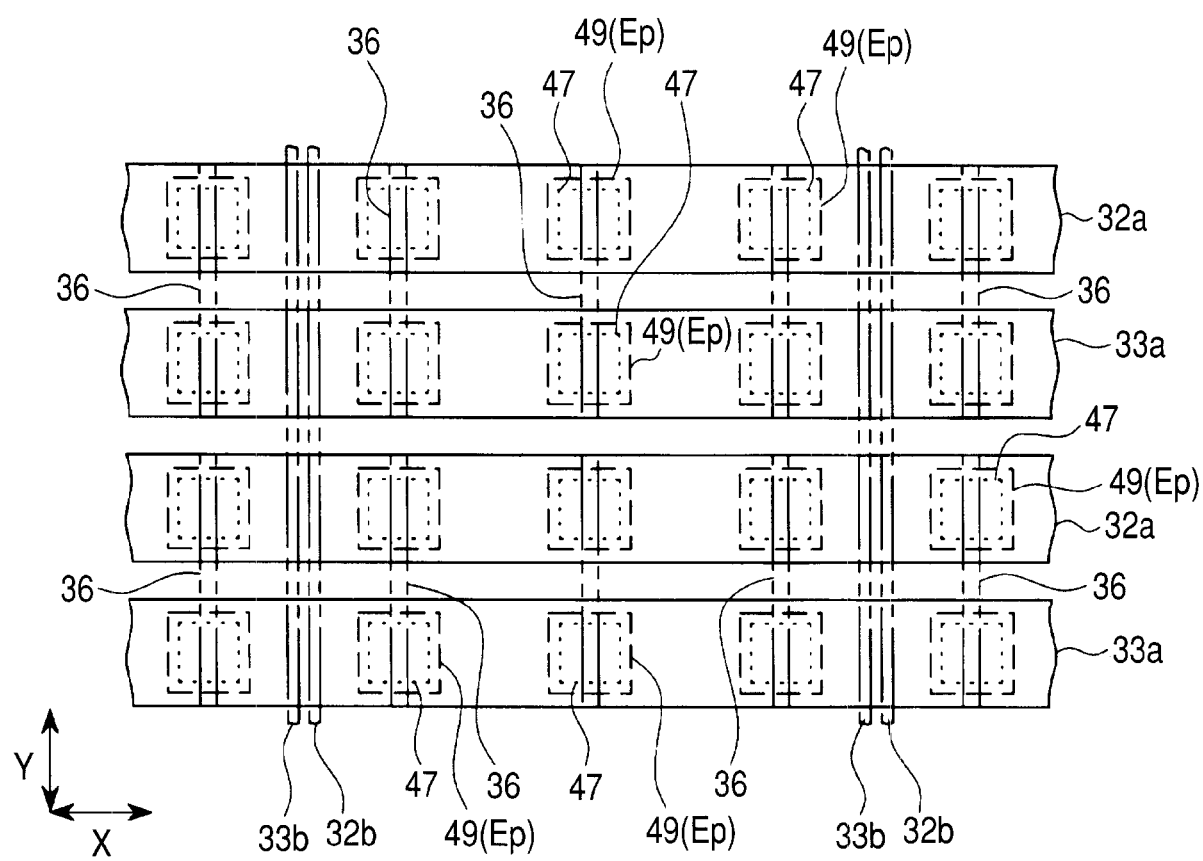
FIG. 33 is a fragmentary plan view of the semiconductor device according to the fourth embodiment of the present invention.
Figure 34:
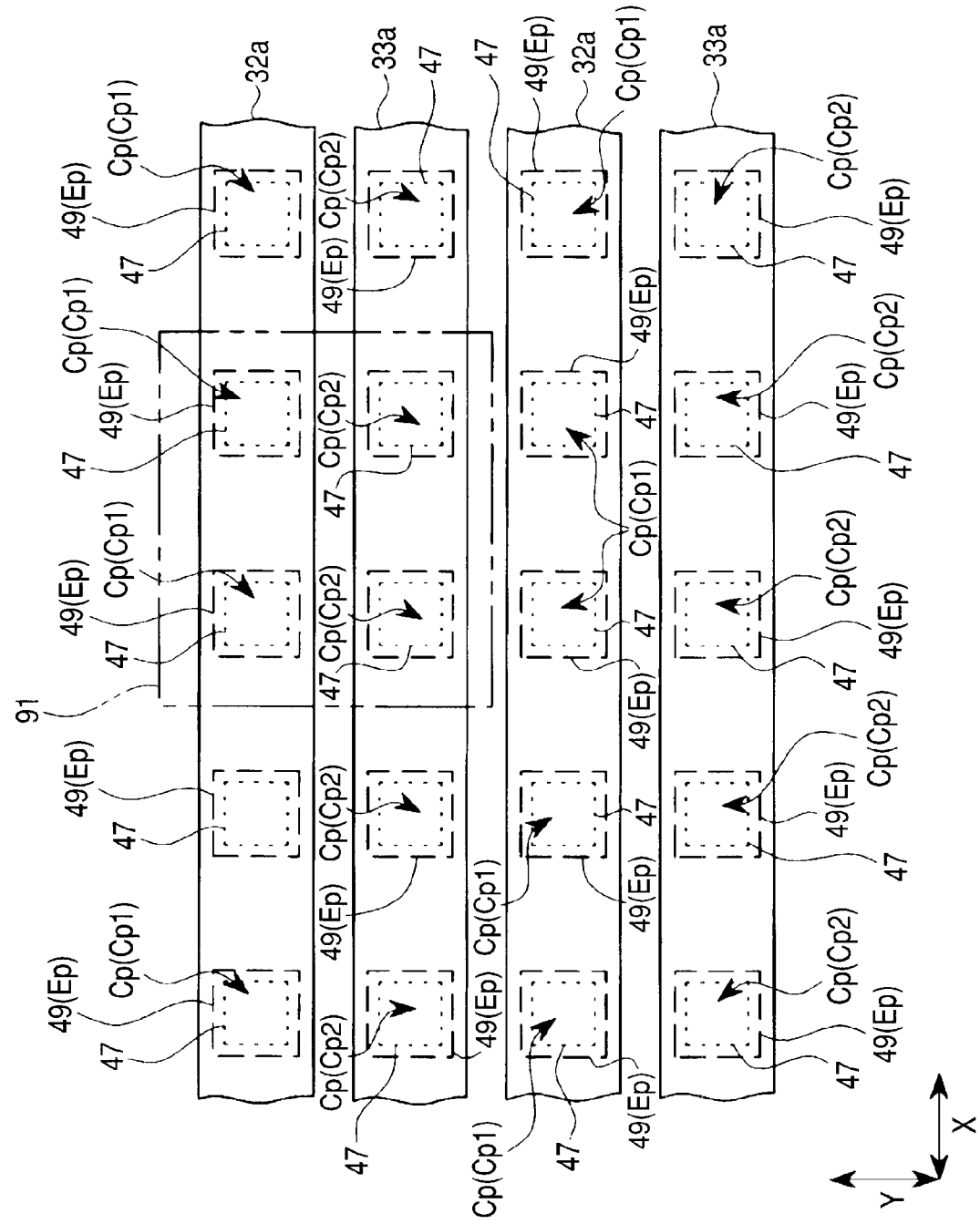
FIG. 34 is a fragmentary plan view of the semiconductor device according to the fourth embodiment of the present invention.
Figure 35:
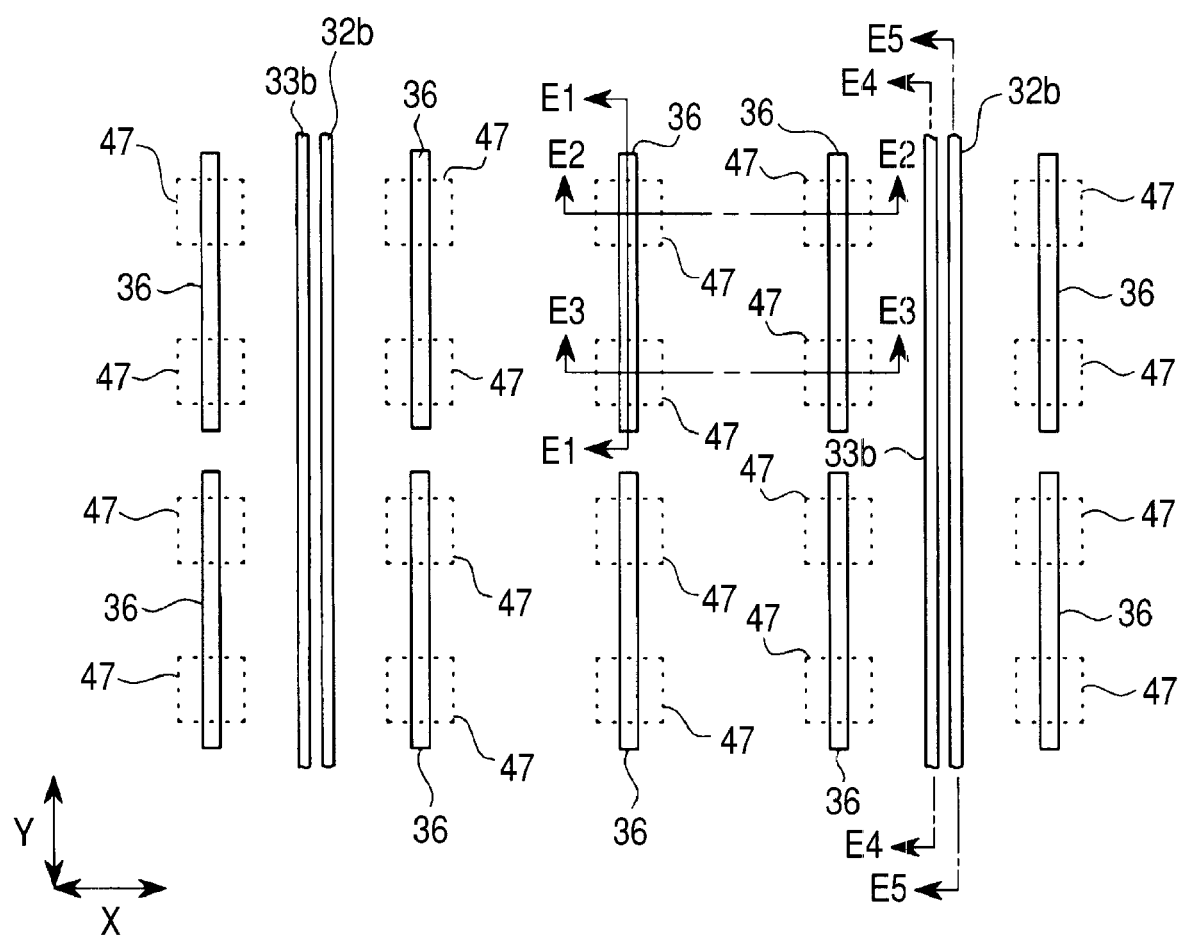
FIG. 35 is a fragmentary plan view of the semiconductor device according to the fourth embodiment of the present invention.
Figure 36:
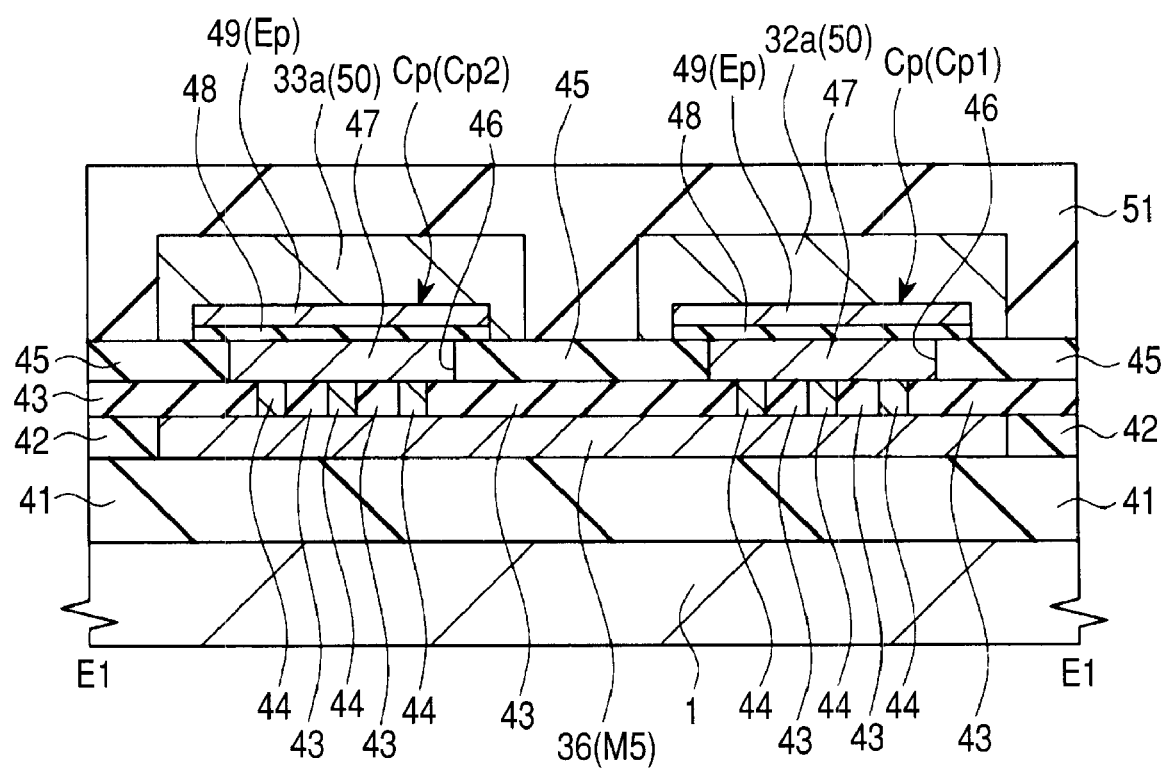
FIG. 36 is a fragmentary sectional view of the semiconductor device according to the fourth embodiment of the present invention.
Figure 37:
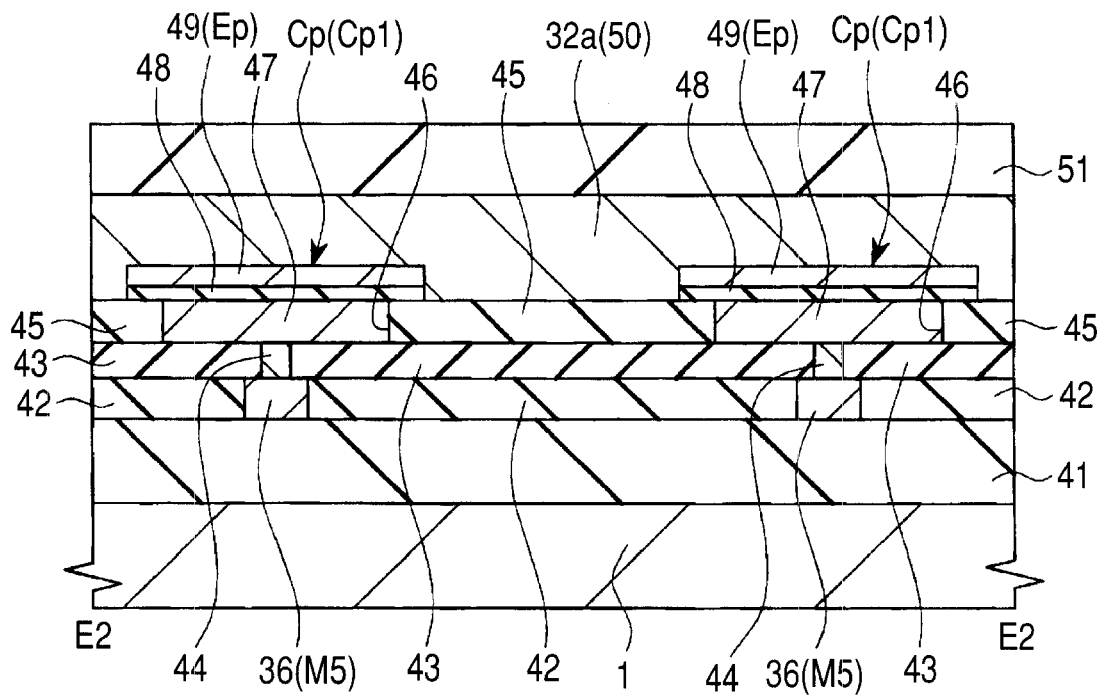
FIG. 37 is a fragmentary sectional view of the semiconductor device according to the fourth embodiment of the present invention.
Figure 38:
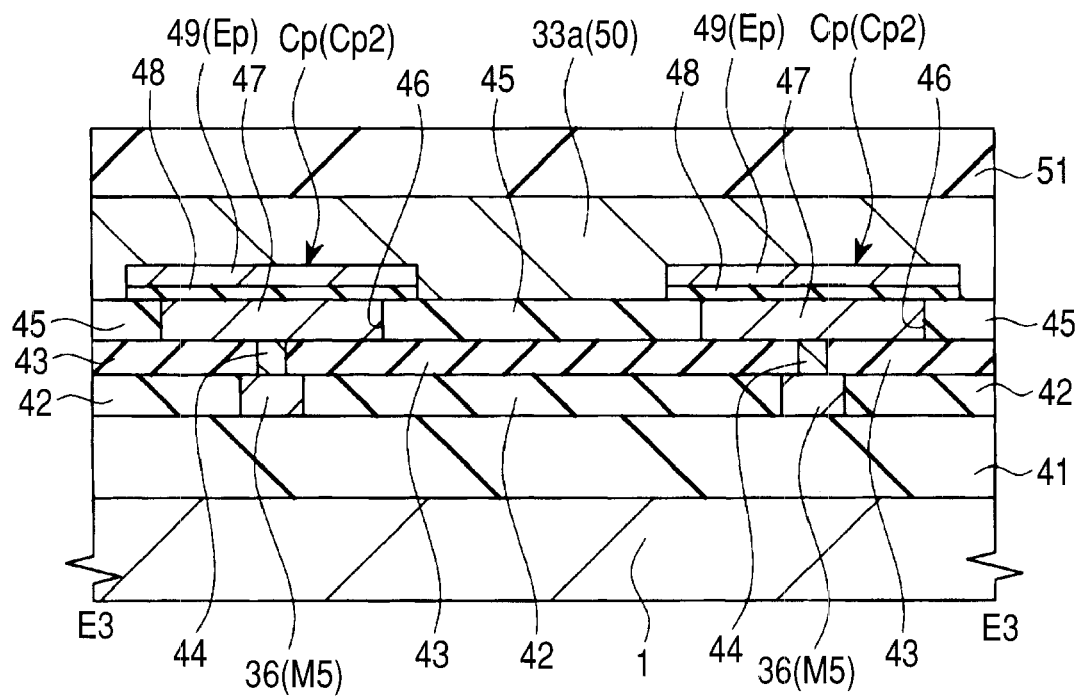
FIG. 38 is a fragmentary sectional view of the semiconductor device according to the fourth embodiment of the present invention.
Figure 39:
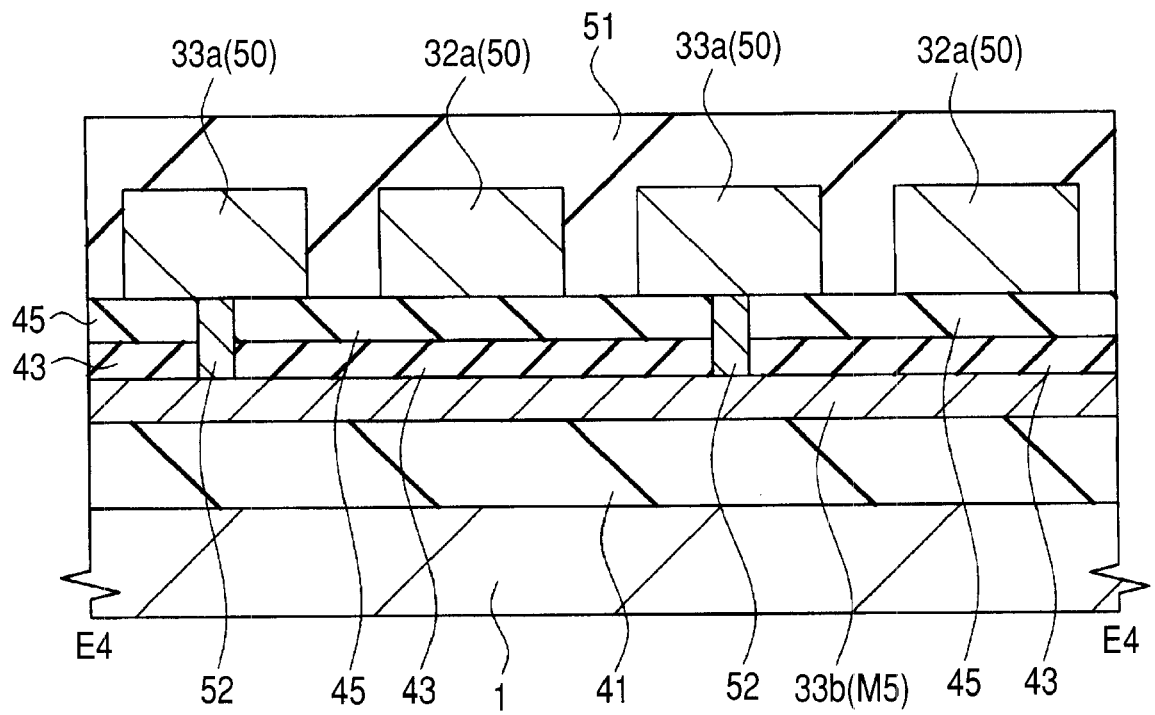
FIG. 39 is a fragmentary sectional view of the semiconductor device according to the fourth embodiment of the present invention.
Figure 40:
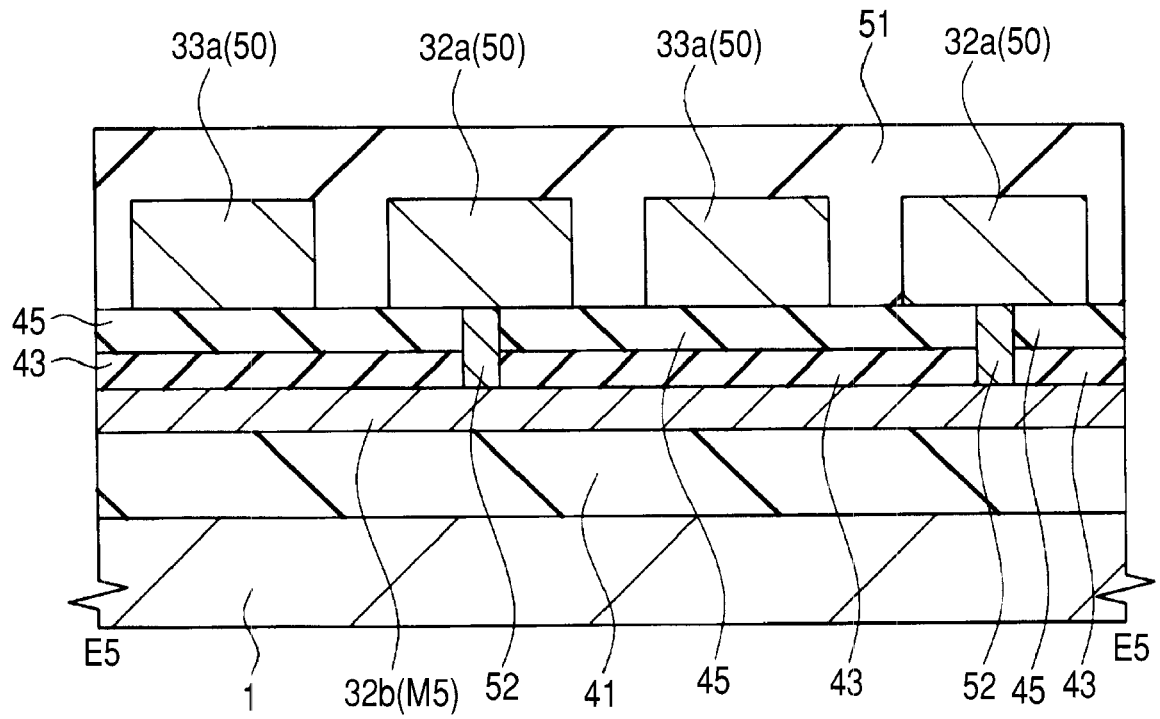
FIG. 40 is a fragmentary sectional view of the semiconductor device according to the fourth embodiment of the present invention.

FIG. 31 is a fragmentary circuit diagram of the semiconductor device 31 according to the present embodiment, FIG. 32 is a conceptual plan view (overall plan view) of the semiconductor device 31, FIGS. 33 through 35 are respectively fragmentary plan views (partly enlarged plan views) of the semiconductor device 31, and FIGS. 36 through 40 are respectively fragmentary sectional views (partly enlarged sectional views) of the semiconductor device 31. FIG. 32 shows a plan layout of ground wirings 32 and 32a, a source or power wirings 33 and 33a, bonding pads 34a and 34b, capacitive elements Cp and a core area 40. Configurations other than the above are not illustrated. However, the core area 40 is typically indicated by a one-dot chain line, and regions or areas in which the individual capacitive elements Cp are formed are typically indicated by dotted lines. FIGS. 33 through 35 respectively show the same area of the semiconductor device 31. However, FIG. 33 shows a plan layout of the ground wirings 32a, connecting wirings 32b for a ground potential, the power wirings 33a, connecting wirings 33b for a source potential, lower electrode connecting wirings 36, lower electrodes 47 and conductor films 49, and configurations other than the above are not illustrated. FIG. 34 shows a plan layout of the ground wirings 32a, power wirings 33a, lower electrodes 47 and conductor films 49, and configurations other than the above are not illustrated. FIG. 35 shows a plan layout of the connecting wirings 32b for the ground potential, connecting wirings 33b for the source potential, lower electrode connecting wirings 36 and lower electrodes 47, and configurations other than the above are not illustrated. A sectional view taken along line E1-E1 of FIG. 35 corresponds to FIG. 36, a sectional view taken along line E2-E2 of FIG. 35 corresponds to FIG. 37, a sectional view taken along line E3-E3 of FIG. 35 corresponds to FIG. 38, a sectional view taken along line E4-E4 of FIG. 35 corresponds to FIG. 19, and a sectional view taken along line E5-E5 of FIG. 36 corresponds to FIG. 40, respectively.

The semiconductor device (semiconductor chip) 31 according to the present embodiment shown in FIGS. 33 through 40 is formed by forming various semiconductor integrated circuits and bonding pads in a semiconductor substrate (semiconductor wafer) comprised of, for example, monocrystalline silicon or the like and separating the semiconductor substrate into chip-shaped semiconductor devices (semiconductor chips) 31 by dicing or the like. Thus, the semiconductor device 31 corresponds to the semiconductor chip.

As shown in FIG. 32, the ground wiring 32 and the power wiring 33 are disposed along an outer peripheral portion of a main surface of the semiconductor device 31. While the ground potential is more preferably supplied to the ground wiring 32, the source potential (fixed potential, reference potential) other than the ground potential can also be supplied thereto. In this case, at least a source potential different from one for the power wiring 33 is supplied to the ground wiring 32. Thus, the ground wiring 32 can also be regarded as the power wiring as well as the power wiring 33. The potential supplied to the ground wiring 32 and the potential supplied to the power wiring 33 will be referred to as a ground potential V3 (first potential) and a source potential V4 (second potential) below. The source potential V4 and the ground potential V3 are of potentials different from each other. There is also a case where the ground potential V3 is represented as the potential V3 and the source potential V4 is represented as the potential V4. Incidentally, the ground potential V3 can also be represented as Vss in place thereof, and the source potential V4 can also be represented as Vdd or Vcc in place thereof.

A plurality of bonding pads (pad electrodes, external terminals and external connecting terminals) are disposed in the main surface of the semiconductor device 31 along its outer peripheral portion. The respective bonding pads are capable of functioning as external terminals (external connecting terminals and input/output terminals) of the semiconductor device 31, for making electrical coupling to an external device. Of the bonding pads, the bonding pads 34a each coupled to the ground wiring 32 via an input/output circuit (I/O circuit), and the bonding pads 34b each coupled to the power wiring 33 via an input/output circuit (I/O circuit) are shown in FIG. 32. Other bonding pads are not illustrated. Incidentally, a diagrammatic representation of each input/output circuit is omitted in FIGS. 31 and 32 to make it easy to view the drawings.

Turning power on with respect to the semiconductor device 31 yields a state of a constant voltage being applied to the ground wiring 32 and the power wiring 33 respectively. For example, when power is turned on with respect to the semiconductor device 31, the ground wiring 32 is placed in a state of being supplied with the ground potential V3, and the power wiring 33 is placed in a state of being supplied with the source potential V4.

The core area 40 is disposed in the central part of the main surface of the semiconductor device 31. Various semiconductor integrated circuits (not shown) are formed in the core area 40. Namely, the core area 40 corresponds to the area formed with the semiconductor integrated circuits, of the main surface of the semiconductor substrate 1 that forms the semiconductor device 31. For example, basic cells in which a predetermined number of n-channel type MISFETs and p-channel type MISFETs are configured in combination, are arranged in large numbers in matrix form, thereby forming the corresponding core area 40. Desired logical functions are realized by wire-coupling MISFETs lying within the basic cells and between the basic cells on the basis of logic design. It is possible to supply the source potential V4 from the power wiring 33 to its corresponding circuit in the core area 40 and supply the ground potential V3 from the ground wiring 32 to the circuit in the core area 40.

Capacitive elements are interposed between the ground wiring 32 and the power wiring 33 as countermeasures against noise. In the present embodiment, a plurality of series circuits each comprising two capacitive elements Cp (i.e., one capacitive element Cp1 and one capacitive element Cp2) are coupled in parallel between the ground potential V3 of the ground wiring 32 and the source potential V4 of the power wiring 33. This is identical to the circuit configurations shown in FIGS. 7 and 11 according to the first embodiment. One of the ground potential V3 corresponding to the potential of the ground wiring 32 and the source potential V4 corresponding to the potential of the power wiring 33 corresponds to the above potential V1, and the other thereof corresponds to the above potential V2. As typically shown in the circuit diagram of FIG. 31, the circuit 35 of the core area 40 is supplied with the ground potential V3 and the source potential V4 from the ground wiring 32 and the power wiring 33.

In order to realize such a circuit configuration as shown in FIG. 31 with the capacitive elements interposed between the ground wiring 32 and the power wiring 33, the present embodiment extends not only the ground wiring 32 and the power wiring 33 along the outer peripheral portion of the main surface of the semiconductor device 31 but also the ground wirings 32a electrically coupled to the ground wiring 32 and the power wirings 33a electrically coupled to the power wiring 33 in plural form respectively in an X direction shown in FIGS. 32 through 35 within the main surface of the semiconductor device 31. The lower electrode connecting wirings 36 each brought to a floating potential are extended in plural form respectively in a Y direction shown in FIGS. 32 through 35. Capacitive elements Cp are respectively formed in areas where the ground wirings 32a and power wirings 33a and the lower electrode connecting wirings 36 intersect. Thus, the MIM type capacitive elements Cp are disposed over the entire main surface of the semiconductor device 31 (the entire upper portion of the core area 40), whereby such a circuit configuration as shown in FIG. 31 is realized. The configurations of the capacitive elements will be explained in more detail.

As shown in the fragmentary sectional views of FIGS. 36 through 40, various elements are formed over the main surface of the semiconductor substrate 1, and an interlayer insulating film and a wiring layer are formed. In FIGS. 36 through 40, areas in which the elements, interlayer insulating film and wiring layer are formed, are collectively shown as a device or element area 41. An example of the structure of the device area 41 will be described later.

An insulating film (interlayer insulating film) 42 is formed over the device area 41. Wiring trenches and wirings M5 each embedded in the wiring trench are formed in the insulating film 42. The wirings M5 can be formed using damascene technology and is formed principally of a metal (metal material: material indicative of metallic electric conductivity) like copper. The wirings M5 are more preferably the embedded wirings formed by the damascene method as in the present embodiment. As another form, however, each wiring M5 may also be configured as a wiring (e.g., an aluminum wiring) formed by patterning of a conductor film (metal film). The lower electrode connecting wirings 36, the connecting wirings 32b and connecting wirings 33b to be described later and the like are formed by the wirings M5.

An insulating film (interlayer insulating film) 43 is formed over the insulating film 42 with the wirings M5 embedded therein. Through holes (opening, holes, via holes) are formed in the insulating film 43. Plugs (conductor portions, connecting conductor portions) 44 each comprised of a conductor are respectively formed and embedded within the through holes. The plugs 44 are respectively electrically coupled to the lower electrode connecting wirings 36 (wirings M5) in contact therewith at their bottoms.

An insulating film (interlayer insulating film) 45 is formed over the insulating film 43 with the plugs 44 embedded therein. Openings 46 for the lower electrodes are formed in the insulating film 45. The lower electrodes 47 for the capacitive elements Cp are formed and embedded into their corresponding openings 46. The lower electrodes 47 are respectively electrically coupled to the plugs 44 in contact therewith at their bottoms. Thus, the lower electrodes 47 are electrically coupled to the lower electrode connecting wirings 36 (wirings M5) via the plugs 44 respectively.

For example, the openings 46 are formed in the insulating film 45 and thereafter a conductor film (metal film) comprised of tungsten or the like is formed so as to fill or bury the openings 46. The conductor film lying over the insulating film 45 is removed by a CMP method or an etchback method, thereby making it possible to form the corresponding lower electrodes 47. While the lower electrodes 47 can be formed using Single-Damascene technology, they can also be formed using Dual-Damascene technology as another form. In this case, the lower electrodes 47 and the plugs 44 are formed integrally.

An insulating film 48 for a capacitive insulating film (dielectric film) of each capacitive element is formed over the insulating film 45 including over the lower electrodes 47. A conductor film 49 for an upper electrode of each capacitive element is formed over the insulating film 48. The insulating film 48 comprises each patterned insulating film and is comprised of, for example, a silicon nitride film or the like. The conductor film 49 comprises each patterned conductor film and is comprised of, for example, titanium, titanium nitride, tungsten or tungsten nitride or the like.

A conductor film 50 is formed so as to cover a laminated film of insulating film 48 and conductor film 49. The conductor film 50 is comprised of each patterned conductor film and comprises, for example, a conductor film (aluminum film or aluminum alloy film) with aluminium as a principal component.

The conductor film 50 can also be formed as a laminated film of main or principal conductor film and barrier conductor film provided at the upper surface of the main conductor film, the lower surface thereof or both the upper and lower surfaces thereof. For example, a main conductor film with aluminum as a principal component can be used as the main conductor film for the conductor film 50. As the barrier film for the conductor film 50, for example, a titanium film, a titanium nitride film or a laminated film of these can be used.

Subsequently, the laminated film used as the insulating film 48 and the conductor film 49 is formed over the entire surface of the insulating film 45 including over each lower electrode 47. Then, the laminated film is patterned and thereafter a conductor film used as the conductor film 50 subsequently is formed over the entire surface of the insulating film 45 including over the laminated film of insulating film 48 and conductor film 49. Afterwards, the conductor film is patterned to make it possible to form the insulating film 48, conductor film 49 and conductor film 50.

Each of the ground wirings 32 and 32a and power wirings 33 and 33a is formed by the conductor film 50. The upper electrode Ep of each capacitive element Cp is formed by the conductor film 49. One obtained by combining the conductor film 49 and the conductor film 50 located over the conductor film 49 can also be assumed to be the upper electrode Ep.

As understood even from FIGS. 33 and 34, the insulating film 48 and the conductor film 49 (upper electrode Ep) are formed so as to include each lower electrode 47 on a plan or two-dimensional basis. It is more preferred if the conductor film 49 is formed since damage to the insulating film 48 at the patterning can be prevented. However, the formation of the conductor film 49 can also be omitted. When the formation of the conductor film 49 is omitted, the conductor film 50 is formed so as to contact the upper surface of the insulating film 48. Of the conductor film 50, the portion opposite to each lower electrode 47 via the insulating film 48 interposed therebetween becomes the upper electrode Ep.

Each of the MIM type capacitive elements Cp (Cp1 and Cp2) is formed by the upper electrode Ep comprised of the conductor film 49 (or conductor films 49 and 50), the lower electrode 47 and the insulating film 48 between the lower electrode 47 and the upper electrode Ep. The upper electrode Ep (conductor film 49) assumes one electrode (first electrode) of each capacitive element Cp, the lower electrode 47 assumes the other electrode (second electrode) of the capacitive element Cp, and the insulating film 48 positioned between the lower electrode 47 and the upper electrode Ep (conductor film 49) assumes the capacitive insulating film (dielectric film) of the capacitive element Cp.

Incidentally, even where the conductor film 49 is formed by a nitride metal film such as a titanium nitride film or a tungsten nitride film as well as where the conductor film 49 is formed by a metal film such as a titanium film or a tungsten film or the like, the conductor film 49 can be assumed to be a metal layer since it exhibits metallic conductivity. The lower electrode 47 is also formed principally of a metal layer of tungsten or the like. Accordingly, the capacitive elements Cp can be assumed to the MIM type capacitive elements.

Thus, the capacitive elements Cp (Cp1, Cp2) are arranged in array form (in matrix form) above the main surface of the semiconductor substrate 1. Each of the capacitive elements Cp (Cp1, Cp2) arranged in array form is formed by the lower electrode 47 (second electrode) and the upper electrode Ep (first electrode) opposite to each other via the insulating film (insulating film 48 in the present embodiment) interposed therebetween.

While a plurality of the capacitive elements Cp (Cp1 and Cp2) are formed over the semiconductor substrate 1 in the present embodiment, a plurality of the upper electrodes Ep for forming the capacitive elements Cp (Cp1 and Cp2) are respectively comprised (formed) of the conductor layer of the same layer and formed in the same process step. A plurality of the lower electrodes 47 for forming the capacitive elements Cp (Cp1 and Cp2) are respectively comprised (formed) of the conductor layer of the same layer and formed in the same process step. The conductor layer (conductor film 49 in the present embodiment) that forms each upper electrode Ep is formed in the corresponding layer above the conductor layer that forms each lower electrode 47.

An insulting film (surface protective film) 51 used as a protective film corresponding to a top layer is formed over the insulating film 45 so as to cover the conductor film 50. The conductor film 50 is formed using a conductor film of the same layer as the conductor film used for the formation of each of the bonding pads 34a and 34b. In FIGS. 33 through 40, openings for bonding pads are formed in the insulating film 51 in unillustrated areas. Parts of the conductor film of the same layer as the conductor film 50 are exposed from the openings to form the bonding pads 34a and 34b. In order to make easy wiring bonding to the bonding pads 34a and 34b, a plated film or the like can also be formed onto the surfaces of the bonding pads 34a and 34b. Bump electrodes can also be formed over the bonding pads 34a and 34b respectively.

Although not illustrated in detail, the ground wirings 32a extending in the X direction are set to a potential (ground potential V3 in the present embodiment) common to the ground wiring 32 by coupling their ends to the ground wiring 32, for example. Although unillustrated in detail, the power wirings 33a extending in the X direction are set to a potential (source potential V4 in the present embodiment) common to the power wiring 33 by being electrically coupled to the power wiring 33 through the plugs embedded in the through holes formed in the insulating films 43 and 45 underneath the power wirings 33 and 33a and wiring portions of the same layer as the wirings M5 coupled to the plugs, for example.

As shown even in FIGS. 31, 33, 39 and 40, the connecting wirings 32b extending in the Y direction and the connecting wirings 33b extending in the Y direction are formed by the wirings M5. The ground wirings 32a are electrically coupled to their corresponding connecting wirings 32b through the plugs 52 embedded in the through holes formed in the insulating films 43 and 45. The power wirings 33a are electrically coupled to their corresponding connecting wirings 33b through the plugs 52 embedded in the through holes formed in the insulating films 43 and 45. Both ends of the connecting wirings 32b are respectively electrically coupled to the ground wiring 32 disposed along the outer peripheral portion of the main surface of the semiconductor device 31 through plugs (not shown) or the like. Both ends of the connecting wirings 33b are respectively electrically coupled to the power wiring 33 disposed along the outer peripheral portion of the main surface of the semiconductor device 31 through plugs (not shown) or the like. Thus, the connecting wirings 32a extending in the X direction are electrically coupled to one another through the plugs 52 and the connecting wirings 32b (i.e., conductors) and respectively placed in a state of being supplied with the same ground potential V3 as the ground wiring 32. The power wirings 33a extending in the X direction are electrically coupled to one another through the plugs 52 and the connecting wirings 33b (i.e., conductors) and respectively placed in a state of being supplied with the same source potential V4 as the power wiring 33.

With the provision of the connecting wirings 33b, the source potential V4 of each power wiring 33a is stabilized. With the provision of the connecting wirings 32b, the ground potential V3 of each ground wiring 32a is stabilized. Coupling the connecting wirings 32b to the conductive plugs and wirings (not shown) formed in the device area 41 makes it possible to supply the ground potential V3 from the connecting wirings 32b to the elements or circuit formed in the device area 41. Coupling the connecting wirings 33b to the conductive plugs and wirings (not shown) formed in the device area 41 makes it possible to supply the source potential V4 from the connecting wirings 33b to the elements or circuit formed in the device area 41. The power wirings 33 and 33a and the connecting wirings 33b are respectively coupled to the ground wirings 32 and 32a and the connecting wirings 32b via the capacitors Cp (Cp1 and Cp2) but not coupled thereto by the conductors.

The plane layouts will be explained in more detail.

As shown even in FIGS. 32 through 34, the ground wirings 32a and power wirings 33a extending in the X direction are alternately arranged in plural form in the Y direction at predetermined intervals (preferably equal intervals). Incidentally, the X and Y directions are directions that intersect with each other and are preferably directions orthogonal to each other. The ground wirings 32a and the power wirings 33a may preferably be identical to one another in wiring width (width or size in the Y direction). The ground wirings 32a and the power wirings 33a are formed by patterning the conductor film 50.

While the laminated patterns of insulating film 48 and conductor film 49 (upper electrodes Ep) are arranged in array (matrix) form as shown in FIGS. 33 through 35, they are disposed below the ground wirings 32a and the power wirings 33a so as to be included in the ground wirings 32a and the power wirings 33a on a plane or two-dimensional basis. Therefore, the laminated patterns of insulating film 48 and conductor film 49 are arranged in the Y direction at the same pitch as the pitch of arrangement of the ground wirings 32a and the power wirings 33a in the Y direction and arranged in the X direction at predetermined pitches (equal intervals).

Each of the lower electrodes 47 is formed so as to be included below the laminated pattern of insulating film 48 and conductor film 49 (upper electrode Ep) on the plane basis. Therefore, in a manner similar to the laminated patters of insulating film 48 and conductor film 49, the lower electrodes 47 are also arranged in the Y direction at the same pitch as the pitch of arrangement of the ground wirings 32a and power wirings 33a and arranged in the X direction at predetermined pitches (equal intervals).

The lower electrode connecting wiring 36 extends below the lower electrodes 47 adjacent to each other in the Y direction at each pair of ground wiring 32a and power wiring 33a adjacent to each other in the Y direction. The lower electrodes 47 adjacent to each other in the Y direction are electrically coupled to each other through the lower electrode connecting wiring 36 extending in the Y direction and the plugs 44 (i.e., conductors) coupled to the lower electrode connecting wiring 36. However, the lower electrode connecting wirings 36 are provided independently every pair of ground wiring 32a and power wiring 33a (i.e., every pair of lower electrodes 47 adjacent to each other in the Y direction). Therefore, each pair of lower electrodes 47 (lower electrodes 47 for each pair of capacitive elements Cp1 and Cp2) are electrically coupled to each other through the lower electrode connecting wiring 36 (i.e., conductor) extending below the lower electrodes 47 and brought into floatation. However, the pair of lower electrodes 47 is not coupled to the lower electrodes 47 other than the same by conductors.

Thus, at one pair of ground wiring 32a and power wiring 33a adjacent to each other in the Y direction, one pair of capacitive elements Cp1 and Cp2 formed by one pair of lower electrodes 47 adjacent to each other in the Y direction and the laminated patterns of insulating films 48 and conductor films 49 (upper electrodes Ep) lying over the pair of lower electrodes 47 is brought into a series-coupled state by electrically coupling the lower electrodes 47 to each other through the corresponding conductor (lower electrode connecting wiring 36 in the present embodiment) and bringing them into a floating potential. In a series circuit of one pair of capacitive elements Cp1 and Cp2, the upper electrode Ep of the capacitive element Cp1 is electrically coupled to its corresponding power wiring 33a, whereas the upper electrode Ep of the capacitive element Cp2 is electrically coupled to its corresponding ground wiring 32a. The respective pairs of capacitive elements Cp1 and Cp2 series-coupled in this way are formed in plural form (in large numbers) between the power wirings 33a and ground wirings 32a adjacent to one another and respectively placed in a state of being parallel-coupled between the power wirings 33a and the ground wirings 32a. The power wirings 33a are coupled to the power wiring 33 and brought to the source potential V4. The ground wirings 32a are coupled to the ground wiring 32 and brought to the ground potential V3. That is, the upper electrodes Ep of the capacitive elements Cp1 are electrically coupled to one another through the corresponding conductors (ground wirings 32 and 32a in the present embodiment) and coupled to the ground potential V3, whereas the upper electrodes Ep of the capacitive elements Cp2 are electrically coupled to one another through the corresponding conductors (power wirings 33 and 33a in the present embodiment) and coupled to the source potential V4. Thus, such a circuit that the series circuits each comprised of one pair of capacitive elements Cp1 and Cp2 are coupled in parallel in plural form between the source potential V4 and the ground potential V3 as shown in the circuit diagram of FIG. 31.

In the present embodiment, a configuration of one pair of capacitive elements Cp1 and Cp2 adjacent to each other in the Y direction, which is coupled to each other by each lower electrode connecting wiring 36, and the other pair of capacitive elements Cp1 and Cp2 adjacent to each other in the X direction, i.e., a configuration of four capacitive elements Cp lying in an area 91 surrounded by a chain double-dashed line in FIG. 34 is substantially similar to the configuration of the four capacitive elements C1, C2, C3 and C4 described in the first embodiment. In the first embodiment, however, the lower electrodes of the capacitive elements to be electrically coupled through the conductor have been electrically coupled to one another by the same conductor layer (conductor patterns Me1a, Me1b, PS1a and PS1b or n-type semiconductor regions 23a and 23b) as one used for the formation of the lower electrodes. Consequently, the number of necessary conductor layers can be reduced. On the other hand, while the lower electrode 47 of each capacitive element Cp1 and the lower electrode 47 of each capacitive element Cp2 both to be electrically coupled to each other through the conductor are formed by the conductor layer of the same layer in the present embodiment, they are formed by patterns (isolated patterns) separated from each other without using an integral pattern and electrically coupled through the corresponding conductor layer (lower electrode connecting wiring 36 in the present embodiment) formed in the layer below the conductor layer for forming each lower electrode 47 over the semiconductor substrate 1. Consequently, the lower electrodes 47 of the capacitive elements Cp1 and Cp2 can be formed by the isolated patterns and dishing or the like can be prevented from occurring upon the formation of each lower electrode 47.

Since the lower electrodes 47 of the capacitive elements Cp are set to the floating potential and the upper electrodes Ep are coupled to the ground potential V3 or the source potential V4, the present embodiment corresponds to the structure of FIG. 9 of the first embodiment. In the present embodiment, one obtained by combining each of the ground wirings 32a (conductor film 50) and the conductor film 49 (upper electrode Ep) located therebelow corresponds to the conductor pattern Me1a shown in FIG. 9, and one obtained by combining each of the power wirings 33a (conductor film 50) and its corresponding conductor film 49 (upper electrode Ep) located therebelow corresponds to the conductor pattern Me1b shown in FIG. 9. In the present embodiment, one obtained by combining the lower electrodes 47 and the lower electrode connecting wiring 36 (and plugs 44) for coupling between the lower electrodes 47 corresponds to each of the conductor patterns Me2a and Me2b shown in FIG. 9. Of the opposite electrodes of the capacitive elements Cp, the lower electrodes 47 on the lower layer side are set to the floating potential and the upper electrodes Ep on the upper layer side are coupled to the ground potential V3 (ground wiring) or the source potential V4 (power wiring), thereby making it easy to route the power wirings and the ground wirings.

Figure 41:
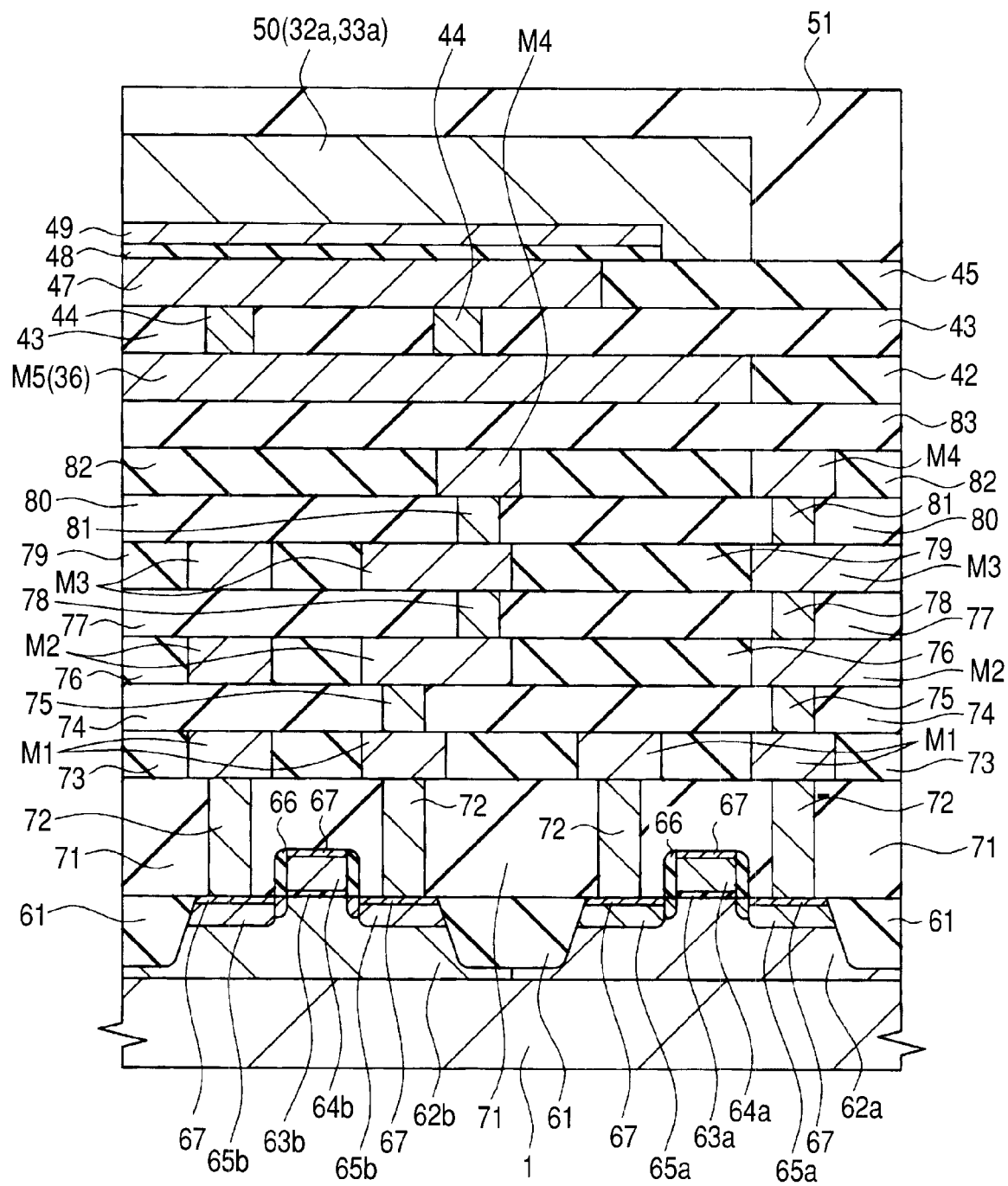
FIG. 41 is a fragmentary sectional view of the semiconductor device according to the fourth embodiment of the present invention.

FIG. 41 is a fragmentary sectional view of the semiconductor device according to the present embodiment and shows one example of the structure of the device area 41.

Device isolation regions or areas 61 each comprising an insulator are formed over the main surface of the semiconductor substrate 1 by the STI method or the like. Semiconductor elements such as MISFETs (Metal Insulator Semiconductor Field Effect Transistors) are formed in their corresponding active regions defined by the device isolation areas 61.

Described specifically, a p-type well 62a and an n-type well 62b are formed over the main surface of the semiconductor substrate 1. A gate electrode 64a is formed over the p-type well 62a via a gate insulating film 63a interposed therebetween. n-type semiconductor regions (n-type diffusion layers) 65a used as the source/drain are formed in regions on both sides of the gate electrode 64a. An n channel type MISFET is formed by the gate electrode 64*a*, the gate insulating film 63*a* and the n-type semiconductor regions 65*a* used as the source/drain. A gate electrode 64*b* is formed over the n-type well 62*b* via a gate insulating film 63*b* interposed therebetween. p-type semiconductor regions (p-type diffusion layers) 65*b* used as the source/drain are formed in regions on both sides of the gate electrode 64*b*. A p channel type MISFET is formed by the gate electrode 64*b*, the gate insulating film 63*b* and the p-type semiconductor regions 65*b* used as the source/drain. Sidewall spacers (sidewall insulating films) 66 each comprised of an insulator can also be formed over their corresponding sidewalls of the gate electrodes 64*a* and 64*b*, and each of the n-type semiconductor regions 65*a* and the p-type semiconductor regions 65*b* can also be brought to a LDD (Lightly Doped Drain) structure. Metal silicide layers 67 such as cobalt silicide or nickel silicide can also be formed over the gate electrodes 64*a* and 64*b*, the n-type semiconductor regions 65*a* and the p-type semiconductor regions 65*b* using a salicide process or the like.

An insulating film (interlayer insulating film) 71 is formed over the main surface of the semiconductor substrate 1 so as to cover the gate electrodes 64*a* and 64*b*. Contact holes (through holes) are formed in the insulating film 71. Conductive plugs 72 are embedded into the contact holes. The plugs 72 are electrically coupled to the gate electrodes 64*a* and 64*b*, the n-type semiconductor regions 65*a* or the p-type semiconductor regions 65*b* and the like.

An insulating film (interlayer insulating film) 73 is formed over the insulating film 71 with the plugs 72 embedded therein. Wiring grooves or trenches and wirings M1 each embedded in the wiring trench are formed in the insulating film 73. The wiring M1 is of a first layer wiring (wiring layer) corresponding to a wiring of a top layer. The wirings M1 can be formed using the Damascene technology (Single Damascene technology in the present embodiment).

An insulating film (interlayer insulating film) 74 is formed over the insulating film 73 with the wirings M1 embedded therein. Through holes (via holes) and conductive plugs 75 embedded in the through holes are formed in the insulating film 74. An insulating film (interlayer insulating film) 76 is formed over the insulating film 74 with the plugs 75 embedded therein. Wiring trenches and wirings M2 each embedded in the wiring trench are formed in the insulating film 76. The wiring M2 is of a second layer wiring (wiring layer) corresponding to the next layer above the wiring M1. The plugs 75 are electrically coupled to the wirings M1 in contact therewith at their bottoms and electrically coupled to the wirings M2 in contact therewith at their upper surfaces.

An insulating film (interlayer insulating film) 77 is formed over the insulating film 76 with the wirings M2 embedded therein. Through holes (via holes) and conducive plugs 78 embedded in the through holes are formed in the insulating film 77. An insulating film (interlayer insulating film) 79 is formed over the insulating film 77 with the plugs 78 embedded therein. Wiring trenches and wirings M3 each embedded in the wiring trench are formed in the insulating film 79. The wiring M3 is of a third layer wiring (wiring layer) corresponding to the next layer above the wiring M2. The plugs 78 are electrically coupled to the wirings M2 in contact therewith at their bottoms and electrically coupled to the wirings M3 in contact therewith at their upper surfaces.

An insulating film (interlayer insulating film) 80 is formed over the insulating film 79 with the wirings M3 embedded therein. Through holes (via holes) and conductive plugs 81 embedded in the through holes are formed in the insulating film 80. An insulating film (interlayer insulating film) 82 is formed over the insulating film 80 with the plugs 81 embedded therein. Wiring trenches and wirings M4 each embedded in the wiring trench are formed in the insulating film 82. The wiring M4 is of a fourth layer wiring (wiring layer) corresponding to the next layer above the wiring M3. The plugs 81 are electrically coupled to the wirings M3 in contact therewith at their bottoms and electrically coupled to the wirings M4 in contact therewith at their upper surfaces.

The wirings M2 through M4 can be formed using Damascene technology (Single-Damascene technology in the present embodiment) and used as copper wirings with copper as a principal component. The wirings M2 through M4 can also be formed using Dual-Damascene technology. In this case, the wiring M2 and the plug 75 are formed integrally, the wiring M3 and the plug 78 are formed integrally, and the wiring M4 and the plug 81 are formed integrally. It is also possible to form the arbitrary ones of the wirings M2 through M4 by Single-Damascene technology and form others by Dual-Damascene technology.

An insulating film (interlayer insulating film) 83 is formed over the insulating film 82 with the wirings M4 embedded therein. A structure leading up to here (insulating film 83) corresponds to the device area 41.

As described above, an insulating film 42 is formed over the insulating film 83. Wiring trenches and a wiring M5 embedded in each wiring trench are formed in the insulating film 42. A lower electrode connecting wiring 36 formed by its corresponding wiring M5 is not coupled to the lower wirings M4 but electrically coupled to the lower wirings M4 via conductive plugs (not shown) embedded in through holes (via holes) formed in the insulating film 83 as needed. Therefore, a ground potential V3 and a source potential V4 can be supplied from their corresponding connecting wirings 32*b* and 33*b* to elements (for example, MISFETs or the like shown in FIG. 41) formed in the main surface of the semiconductor substrate 1 via the plugs (not shown) embedded in the through holes of the insulating film 83, the wirings M4, the plugs 81, the wirings M3, the plugs 78, the wirings M2, the plugs 75, the wirings M1 and the plugs 72 or the like.

Further, although an insulating film 43, plugs 44, an insulating film 45, lower-electrode openings 46, lower electrodes 47, an insulating film 48, conductor films 49, conductor films 50 and an insulting film 51 have been formed, their detailed explanations are omitted herein because they have been described above.

Even in the present embodiment, such a circuit configuration as shown in FIG. 31 is realized in a manner similar to FIGS. 7 and 11 according to the first embodiment. Thus, the reliability of a circuit with capacitive elements interposed between the source potential V4 and the ground potential V3 can be greatly enhanced due to reasons similar to those described in the first embodiment.

That is, in a circuit in which series circuits each comprising a pair of capacitive elements Cp1 and Cp2 are coupled in parallel in plural form between the ground potential V3 and the source potential V4 as in the circuit diagram of FIG. 31, no short-circuit occurs between the ground potential V3 and the source potential V4 even though one of the capacitive elements Cp1 and Cp2 of each series circuit is short-circuited. When both the capacitive elements Cp1 and Cp2 are short-circuited at any series circuit, the ground potential V3 and the source potential V4 are brought into a state short-circuited therebetween. Therefore, the probability that the short circuit will occur between the ground potential V3 and the source potential V4 due to the short-circuit of each individual capacitive element Cp can greatly be reduced, and the reliability of the circuit with the capacitive elements interposed between the source potential V4 and the ground potential V3 can greatly be enhanced. It is thus possible to improve the reliability of the semiconductor device.

In the present embodiment, the number of conductor layers necessary to form such a circuit as shown in FIG. 31 can be reduced. Such a circuit (except for the circuit 35) as shown in FIG. 31 can be formed by, for example, the conductor films 50 that form the power wirings 33 and 33a and ground wirings 32 and 32a, the conductor films 49 that form the upper electrodes Ep, the lower electrodes 47 and the wirings M5 that form the lower electrode connecting wirings 36. Therefore, the circuit shown in FIG. 31 can be realized by the MIM type capacitive elements Cp while an increase in the number of conductor layers formed over the semiconductor substrate 1 is being suppressed, and the manufacturing cost of the semiconductor device can be suppressed. Accordingly, an improvement in the reliability of the semiconductor device and a reduction in its manufacturing cost can be made compatible.

In the present embodiment, the MIM type capacitive elements Cp (Cp1 and Cp2) are disposed over the entire main surface of the semiconductor device 31 (the entire upper portion of core area 40) in array (matrix) form, for example to realize such a circuit configuration as shown in FIG. 31. Therefore, the area located below the area for forming the capacitive elements Cp (Cp1 and Cp2) can also be utilized effectively. For example, various semiconductor integrated circuits using MISFETs or the like can be formed below the capacitive element Cp (Cp1 and Cp2) forming areas as shown n FIG. 41. Thus, since the two capacitive elements Cp1 and Cp2 are coupled in series to improve the reliability, the plane size of the semiconductor device 31 can be prevented from increasing even though the number of capacitive elements necessary to ensure a predetermined capacitance value and the area of each capacitive element increase.

With the intervention of the capacitive elements Cp (Cp1 and Cp2) between (the potential V3 of) the ground wiring 32 and (the potential V4 of) the power wiring 33 as countermeasures against noise, it is possible to prevent a drop in voltage with respect to a current consumption source (circuit or the like formed in the core area 40) and stabilize the power.

In the present embodiment, the capacitive elements Cp (Cp1 and Cp2) corresponding to the MIM type capacitive elements are arranged (arranged in array form, for example) over the entire upper portion of the area (i.e., core area 40) formed with the semiconductor integrated circuit, of the main surface of the semiconductor substrate 1. With the arrangement (layout) of the capacitive elements Cp over the entire upper portion (the entire main surface of the semiconductor device 31) of the core area 40 in this way, the distance from the circuit formed in the core area 40, corresponding to the current consumption source/noise generation source to each of the capacitive elements Cp can be shortened, and a noise prevention effect based on the capacitive elements Cp can be more enhanced. With the arrangement of the capacitive elements Cp over the entire upper portion of the core area 40 as well, noise from the circuit of the core area 40 and noise to the circuit of the core area 40 can be absorbed appropriately. Absorbing noise from the outside of the semiconductor device 31 by the capacitive elements Cp makes it possible to prevent the influence of the noise to the circuit (circuit of core area 40) lying inside the semiconductor device 31. Absorbing noise from the inside (circuit of core area 40) of the semiconductor device 31 by the capacitive elements Cp makes it possible to prevent the discharge of noise to the outside by the semiconductor device 31. Since the usable frequency is close to an FM band or the like in a semiconductor device (e.g., a microcomputer) for in-vehicle use (automobile use) in particular, countermeasures against noise are important and the effect is large if the present embodiment is applied.

In the first through third embodiments and the fourth embodiment as described above, the series circuits each comprised of one pair of capacitive elements are coupled two or more, i.e., plural in parallel between the potentials V3 and V4 (the potentials V1 and V2 in the first through third embodiments). Therefore, the semiconductor device according to each of the first through third embodiments and the fourth embodiment is of a semiconductor device wherein a circuit in which series circuits (hereinafter called "the above series circuits") each comprised of a pair of capacitive elements (hereinafter called "first and second capacitive elements") are coupled in parallel in plural form between a potential V3 (or V1) and a potential V4 (or V2) different from it, is formed over its corresponding semiconductor substrate 1. The pair of first capacitive element and second capacitive element corresponds to the pair of the capacitive elements C1 and C2, the pair of the capacitive elements C3 and C4, and the pair of the capacitive elements C(2n−1) and C2n in the first through third embodiments. In the fourth embodiment, the pair of first capacitive element and second capacitive element corresponds to the pair of the capacitive elements Cp1 and Cp2, and the series circuits each comprised of this paired capacitive elements are coupled plural in parallel between the potentials V3 and V4 (or V1 and V2).

First electrodes (upper electrodes Ep or lower electrodes E1b, E2b, E3b and E4b) corresponding to one electrodes of the first and second capacitive elements (corresponding to capacitive elements Cp1, Cp2, C1, C2, C3 and C4) of each of a plurality of the series circuits coupled in parallel between the potentials V3 and V4 (or V1 and V2) are formed by the corresponding conductor layer of the same layer, and second electrodes (lower electrodes 47 or upper electrodes E1a, E2a, E3a and E4a) corresponding to the other electrodes thereof are formed by the corresponding conductor layer of the same layer. It is thus possible to reduce the number of necessary conductor layers and suppress the manufacturing cost of the semiconductor device. Incidentally, the conductor layer that forms the second electrodes is formed in a layer above or below the conductor layer that forms the first electrodes.

Further, the first electrodes (upper electrodes Ep or lower electrodes E1b and E3b) of the first capacitive elements (capacitive elements Cp1, C1 and C3) of the series circuits coupled in parallel between the potentials V3 and V4 (or between the potentials V1 and V2) are electrically coupled to each other by the corresponding conductor and coupled to the potential V3 (or V1). The first electrodes (upper electrode Ep or lower electrodes E2b and E4b) of the second capacitive elements (capacitive elements Cp2, C2 and C4) of the series circuits coupled in parallel between the potentials V3 and V4 (or between the potentials V1 and V2) are electrically coupled to each other by the corresponding conductor and coupled to the potential V4 (or V2). At the series circuits coupled in parallel between the potentials V3 and V4 (or between the potentials V1 and V2), the second electrodes (lower electrodes 47 or upper electrodes E1a and E3a) of the first capacitive elements (corresponding to capacitive elements Cp1, C1 and C3) thereof, and the second electrodes (lower electrodes 47 or upper electrodes E2a and E4a) of the second capacitive elements (capacitive elements Cp2, C2 and C4) are respectively electrically coupled to one another by their corresponding conductors and brought to the floating potential. However, the second electrodes (lower electrodes 47 or upper electrodes E1a, E2a, E3a and E4a) of the respective first and second capacitive elements (capacitive elements Cp1, Cp2, C1, C2, C3 and C4) of the series circuits coupled in parallel between the potentials V3 and V4 (or V1 and V2) are not coupled to the second electrodes (lower electrodes 47 or upper electrodes E1a, E2a, E3a and E4a) of the first and second capacitive elements of other series circuits by their corresponding conductors. With the setting of such a connection relationship, such a circuit as shown in FIG. 7, 11 or 31 is realized, thereby making it possible to enhance the reliability of the semiconductor device.

Incidentally, in the first through third embodiments, the second electrodes (corresponding to the upper electrodes E1a, E2a, E3a and Ea4) of the first and second capacitive elements (capacitive elements C1, C2, C3 and C4) at the respective series circuits coupled in parallel between the potentials V1 and V2 are respectively coupled to one another by the same conductor layers (conductor patterns Me1a, Me1b, PS1a and PS1b or n-type semiconductor regions 23a and 23b) as those that form the second electrodes. On the other hand, in the fourth embodiment, the second electrodes (lower electrodes 47) of the first and second capacitive elements (capacitive elements Cp1 and Cp2) at the respective series circuits coupled in parallel between the potentials V3 and V4 are respectively electrically coupled to one another through the conductor layers (lower electrode connecting wirings 36) formed in the layer below the conductor layer that forms the second electrodes (lower electrodes 47) thereof.

While the invention made above by the present inventors has been described specifically on the basis of the preferred embodiments, the present invention is not limited to the embodiments referred to above. It is needless to say that various changes can be made thereto without the scope not departing from the gist thereof.

What is claimed is:

1. A semiconductor device comprising:
    a semiconductor substrate; and
    a first capacitive element, a second capacitive element, a third capacitive element, and a fourth capacitive element which are disposed over the semiconductor substrate,
    wherein the first capacitive element, the second capacitive element, the third capacitive element and the fourth capacitive element are respectively formed by first and second electrodes opposite to each other via an insulating film interposed therebetween,
    wherein the first electrodes of the first capacitive element, the second capacitive element, the third capacitive element and the fourth capacitive element are formed by respective portions of a first conductor layer, the portions being located in a first plane,
    wherein the second electrodes of the first capacitive element, the second capacitive element, the third capacitive element and the fourth capacitive element are formed by respective portions of a second conductor layer, the portions being located in a second plane,
    wherein the first electrodes of the first capacitive element and the third capacitive element are electrically coupled to each other through a conductor and coupled to a first potential,
    wherein the first electrodes of the second capacitive element and the fourth capacitive element are electrically coupled to each other through a conductor and coupled to a second potential different from the first potential,
    wherein the second electrodes of the first capacitive element and the second capacitive element are electrically coupled to each other through a conductor and brought to a floating potential,
    wherein the second electrodes of the third capacitive element and the fourth capacitive element are electrically coupled to each other through a conductor and brought to a floating potential,
    wherein the second electrodes of the first capacitive element and the second capacitive element, and the second electrodes of the third capacitive element and the fourth capacitive element are not coupled by a conductor,
    wherein the first capacitive element is connected in series with the second capacitive element to form a first series circuit, and the third capacitive element is connected in series with the fourth capacitive element to form a second series circuit, and
    wherein the first series circuit is connected in parallel with the second series circuit.

2. The semiconductor device according to claim 1, wherein the first conductor layer is disposed over the semiconductor substrate, and the second conductor layer is disposed above or below the first conductor layer.

3. The semiconductor device according to claim 2, wherein each of the first conductor layer and the second conductor layer comprises a respective metal layer.

4. The semiconductor device according to claim 3, wherein the first capacitive element, the second capacitive element, the third capacitive element and the fourth capacitive element are of MIM type capacitive elements respectively.

5. The semiconductor device according to claim 4, wherein the second conductor layer is disposed below the first conductor layer.

6. The semiconductor device according to claim 2, wherein each of the first conductor layer and the second conductor layer comprises a respective silicon layer.

7. The semiconductor device according to claim 6, wherein the first capacitive element, the second capacitive element, the third capacitive element and the fourth capacitive element are of PIP type capacitive elements respectively.

8. The semiconductor device according to claim 7, wherein the second conductor layer is disposed above the first conductor layer.

9. The semiconductor device according to claim 2, wherein the conductor layer of the first and second conductor layers which is disposed lower comprises an impurity diffusion layer formed within the semiconductor substrate.

10. The semiconductor device according to claim 9, wherein the first capacitive element, the second capacitive element, the third capacitive element and the fourth capacitive element are of MOS type capacitive elements respectively.

11. The semiconductor device according to claim 9, wherein the first electrodes of the first capacitive element, the second capacitive element, the third capacitive element and the fourth capacitive element comprise the impurity diffusion layer formed in the semiconductor substrate.

12. The semiconductor device according to claim 2, wherein the first electrodes of the first capacitive element and the third capacitive element are respectively formed by a first conductor pattern of the first conductor layer, the first electrodes of the second capacitive element and the fourth capacitive element are respectively formed by a second conductor pattern of the first conductor layer, the second conductor pattern being electrically separated from the first conductor pattern, and the second electrodes of the first capacitive element and the second capacitive element are respectively formed by a third conductor pattern of the second conductor layer, and the second electrodes of the third capacitive element and the fourth capacitive element are respectively formed by a fourth conductor pattern of the second conductor layer, the fourth conductor pattern being electrically separated from the third conductor pattern.

13. The semiconductor device according to claim 12, wherein the third conductor pattern and the fourth conductor pattern extend so as to intersect with the first conductor pattern and the second conductor pattern, and the first capacitive element, the second capacitive element, the third capacitive element and the fourth capacitive element are respectively formed in areas where the third and the fourth conductor patterns cross the first and second conductor patterns.

14. The semiconductor device according to claim 1, wherein one of the first potential and the second potential is a source potential and the other is a ground potential.

15. The semiconductor device according to claim 1, wherein the first capacitive element and the second capacitive element are coupled in series, the third capacitive element and the fourth capacitive element are coupled in series, and a series circuit of the first and second capacitive elements and a series circuit of the third and fourth capacitive elements are coupled in parallel between the first potential and the second potential.

16. A semiconductor device comprising:
a circuit formed over a semiconductor substrate, the circuit including a plurality of series circuits each comprising a pair of first and second capacitive elements, the series circuits being coupled in parallel between a first potential and a second potential different from the first potential,
wherein the first and second capacitive elements of the series circuits are respectively formed by first and second electrodes opposite to each other via an insulating film interposed therebetween,
wherein the first electrodes of the first capacitive elements of the series circuits are respectively electrically coupled to one another through conductors and coupled to the first potential,
wherein the first electrodes of the second capacitive elements of the series circuits are respectively electrically coupled to one another through conductors and coupled to the second potential,
wherein the second electrodes of the first capacitive elements and the second electrodes of the second capacitive elements in the respective series circuits are electrically coupled to one another through conductors and brought to a floating potential, respectively,
wherein the first electrodes of the first and second capacitive elements of the series circuits are formed by respective portions of a first conductor layer, the portions being located in a first plane,
wherein the second electrodes of the first and second capacitive elements of the series circuits are formed by respective portions of a second conductor layer, the portions being located in a second plane, and
wherein the second electrodes of the first and second capacitive elements of each series circuit are not coupled by conductors to the second electrodes of the first and second capacitive elements of the other series circuits.

17. The semiconductor device according to claim 16, wherein the first electrodes of the first and second capacitive elements of the series circuits comprise a first conductor layer disposed over the semiconductor substrate, and the second electrodes of the second capacitive elements of the series circuits comprise a second conductor layer disposed in a layer above or below the first conductor layer.

18. The semiconductor device according to claim 17, wherein the first and second capacitive elements are of MIM type, PIP type or MOS type capacitive elements respectively.

19. The semiconductor device according to claim 17, wherein the second conductor layer is formed in a layer below the first conductor layer, and the second electrodes of the first capacitive elements and the second electrodes of the second capacitive elements in the respective series circuits are respectively electrically coupled to one another through a third conductor layer disposed below the second conductor layer.

20. The semiconductor device according to claim 19, wherein the first capacitive elements and the second capacitive elements of the series circuits are of MIM type capacitive elements respectively, and the MIM type capacitive elements are arranged in an array above a main surface of the semiconductor substrate.

21. The semiconductor device according to claim 16, wherein one of the first potential and the second potential is a source potential and the other is a ground potential.

22. The semiconductor device according to claim 16, wherein the first capacitive elements and the second capacitive elements of the series circuits are of MIM type capacitive elements respectively, and the MIM type capacitive elements are disposed over an upper portion of an area in which semiconductor integrated circuits are disposed on a main surface of the semiconductor substrate.

23. A semiconductor device, comprising:
a first capacitive element, a second capacitive element, a third capacitive element and a fourth capacitive element, the first capacitive element comprising a first upper electrode, a first lower electrode and a first capacitive insulating film, the second capacitive element comprising a second upper electrode, a second lower electrode and a second capacitive insulating film, the third capacitive element comprising a third upper electrode, a third lower electrode and a third capacitive insulating film and the fourth capacitive element comprising a fourth upper electrode, a fourth lower electrode and a fourth capacitive insulating film, the lower electrodes of first, second, third, and fourth capacitive elements being located in a first plane, and the upper electrodes of the first, second, third, and fourth capacitive elements being located in a second plane,
the semiconductor device further comprising:
a semiconductor substrate;
a semiconductor element formed over the semiconductor substrate;
a wiring layer and a first interlayer insulating film formed over the semiconductor element;
a second interlayer insulating film formed over the wiring layer and the first interlayer insulating film;
a first connecting wiring and a second connecting wiring formed in the second interlayer insulating film;
a third interlayer insulating film formed over the first connecting wiring and the second connecting wiring;
a first plug, a second plug, a third plug and a fourth plug formed in the third interlayer insulating film, the first plug and the second plug being electrically coupled to the first connecting wiring and the third plug and the fourth plug being electrically coupled to the second connecting wiring;
a fourth interlayer insulating film formed over the first plug, the second plug, the third plug, and the fourth plug;
the first lower electrode, the second lower electrode, the third lower electrode, and the fourth lower electrode formed in the fourth interlayer insulating film, the first lower electrode being electrically coupled to the first plug, the second lower electrode being electrically coupled to the second plug, the third lower electrode being electrically coupled to the third plug and the fourth lower electrode being electrically coupled to the fourth plug;

the first capacitive insulating film formed over the first lower electrode, the second capacitive insulating film formed over the second lower electrode, the third capacitive insulating film formed over the third lower electrode and the fourth capacitive insulating film formed over the fourth lower electrode, the first capacitive insulating film, the second capacitive insulating film, the third capacitive insulating film, and the fourth capacitive insulating film formed of respective portions of an insulating film;

the first upper electrode formed over the first capacitive insulating film, the second upper electrode formed over the second capacitive insulating film, the third upper electrode formed over the third capacitive insulating film, and the fourth upper electrode formed over the fourth capacitive insulating film, the first upper electrode, the second upper electrode, the third upper electrode and the fourth upper electrode formed of respective portions of a conductive film; and a first upper wiring layer formed over the first upper electrode and the third upper electrode to electrically couple the first upper electrode and the third upper electrode, and a second upper wiring layer formed over the second upper electrode and the fourth upper electrode to electrically couple the second upper electrode and the fourth upper electrode, wherein the first lower electrode and the second lower electrode are electrically coupled to each other through the first plug, the first connecting wiring, and the second plug, and brought to a first floating potential, wherein the third lower electrode and the fourth lower electrode are electrically coupled to each other through the third plug, the second connecting wiring, and the fourth plug, and brought to a second floating potential, and wherein the first upper electrode and the third upper electrode, and the second upper electrode and the fourth upper electrode are not coupled by a conductor.

24. The semiconductor device according to claim 23, wherein the first connecting wiring and the second connecting wiring extend in a first direction, and wherein the first upper wiring and the second upper wiring extend in a second direction perpendicular to the first direction.

25. The semiconductor device according to claim 23, wherein a planar area of the first capacitive insulating film, the second capacitive insulating film, the third capacitive insulating film, and the fourth capacitive insulating film and that of the first upper electrode, the second upper electrode, the third upper electrode and the fourth upper electrode are equal to each other and are larger than a planar area of the first lower electrode, the second lower electrode, the third lower electrode, and the fourth lower electrode, and wherein the first capacitive insulating film, the second capacitive insulating film, the third capacitive insulating film, and the fourth capacitive insulating film overlap the first lower electrode, the second lower electrode, the third lower electrode, and the fourth lower electrode, respectively in a plane.

26. The semiconductor device according to claim 23, wherein the first upper wiring layer is formed so as to cover the first capacitive insulating film and the third capacitive insulating film, and the first upper electrode and the third upper electrode, and wherein the second upper wiring layer is formed so as to cover the second capacitive insulating film and the fourth capacitive insulating film, and the second upper electrode and the fourth upper electrode.

* * * * *